(12) United States Patent
Kondo et al.

(10) Patent No.: US 6,199,738 B1
(45) Date of Patent: Mar. 13, 2001

(54) ELECTRIC-COMPONENT SUPPLYING METHOD AND APPARATUS

(75) Inventors: Yoshiyuki Kondo, Nagoya; Toshikatsu Terashima, Aichi-ken; Mamoru Tsuda, Okazaki, all of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/243,801

(22) Filed: Feb. 10, 1999

(30) Foreign Application Priority Data

Feb. 19, 1998 (JP) .................................................. 10-037727

(51) Int. Cl.[7] .......................... B65H 20/24; B65H 23/06; B65C 9/00
(52) U.S. Cl. .......................... 226/110; 226/128; 226/148; 156/566; 414/416
(58) Field of Search ................................ 226/4, 110, 128, 226/122, 148, 157; 29/739, 740, 741; 156/247, 344, 584, 540, 541, 566; 414/403, 416

(56) References Cited

U.S. PATENT DOCUMENTS

| 4,768,915 | * | 9/1988 | Fujioka | 414/403 X |
| 5,294,035 | * | 3/1994 | Asai et al. | 226/157 |
| 5,299,902 | * | 4/1994 | Fujiwara et al. | 29/740 X |
| 5,725,140 | * | 3/1998 | Weber et al. | 414/416 X |
| 5,762,754 | * | 6/1998 | Kondo et al. | 414/416 X |
| 5,926,950 | * | 7/1999 | Asai et al. | 29/740 X |
| 5,975,395 | * | 11/1999 | Takada et al. | 226/148 X |

FOREIGN PATENT DOCUMENTS

| 0-496-586-A1 | 7/1992 | (EP) . |
| 0-751-702-A1 | 1/1997 | (EP) . |
| 60-228348 | 11/1985 | (JP) . |
| 7-9381 | 1/1995 | (JP) . |
| 7-22230 | 3/1995 | (JP) . |
| 7-101487 | * 4/1995 | (JP) . |
| 9-237997 | 9/1997 | (JP) . |

* cited by examiner

Primary Examiner—Michael R. Mansen
(74) Attorney, Agent, or Firm—Oliff & Berridge, PLC

(57) ABSTRACT

A method and apparatus for moving component supplying units, each of which carries electric components, along a reference line along which respective component-supply portions of the component supplying units are arranged so as to sequentially position a respective component-supply portion at a component-supply position. The method and apparatus also causes an external drive device to operate a drive member thereof to drive a member of a feeding device of each component supplying unit to perform a component feeding action and a component feeding preparing action and thereby feed the electric components of each unit one by one to the component-supply portion of each unit. The component-feeding action causing one of the electric components of each unit to be fed to the component-supply portion of each unit with the component-feeding preparing action causing the feeding device to be prepared for the component feeding action.

20 Claims, 28 Drawing Sheets

ELECTRIC-COMPONENT SUPPLYING METHOD AND APPARATUS

BACKGROUND OF THE INVENTION

1. Field of the Invention

The present invention relates to an electric-component supplying method and apparatus and particularly to the art of improving the efficiency of supplying of electric components.

2. Related Art Statement

Japanese Patent Application laid open for public inspection under Publication No. 7(1995)-9381 discloses a plurality of electric-component ("EC") supplying units each of which stores a plurality of electric components ("ECs") each as an element of an electric circuit (e.g., an electronic circuit) and is moved to supply the ECs to an object device such as an EC mounting device. The plurality of EC supplying units are supported on a support table such that respective EC-supply portions of the units are arranged along a straight line and, when the support table is moved by a table moving device, the respective EC-supply portions of the units are sequentially positioned at an EC-supply position where each of the units supplies one or more ECs to the object device. In each unit, the ECs are fed one by one to the EC-supply portion. A drive device which includes a drive member is provided in the vicinity of the EC-supply device. The drive device operates the drive member to drive a driven member of each unit being positioned at the EC-supply position, so that the ECs are fed one by one to the EC-supply portion. Each of the units disclosed in the above-identified application includes an EC feeding device which performs an EC feeding action and an EC-feeding preparing action while the support table is not moved by the table moving device, i.e., the each unit is stopped.

In the art of supplying ECs, it has been required to shorten an EC-supply cycle time, that is, a time period that is needed for the EC-supply portion of each unit to reach the EC-supply position and supply one EC to the object device, after its preceding unit supplies one EC to the object device. For example, in the case where the object device is the EC mounting device, it has been required, for the purpose of improving the efficiency of mounting of ECs, to shorten an EC-mount cycle time, that is, a time period that is needed for each EC to be mounted on a printed circuit board ("PCB") as a sort of circuit substrate, after its preceding EC is mounted on the PCB. To this end, it is required to shorten a time period that is needed for the EC mounting device to pick up the each EC from the EC-supply portion of each unit.

However, each of the conventional EC supplying units performs both the EC feeding action and the EC-feeding preparing action while the each unit is stopped. Therefore, shortening the EC-supply cycle time needs at least one of shortening a time period needed for the table moving device to move the support table, or shortening a time period needed for the EC feeding device to feed each EC. The former time period may be shortened by increasing the acceleration and/or deceleration of moving of the support table, and the latter time period may be shortened by increasing the acceleration and/or deceleration of feeding of each EC. However, if the acceleration and/or deceleration are/is increased in each case, a great vibration is produced when the moving of the table or the feeding of each EC is started or stopped. This leads to lowering the accuracy or reliability of supplying of each EC. That is, the great vibration may lower the accuracy of positioning of the EC-supply portion of each unit relative to an EC holder of the EC mounting device that picks up each EC from the each unit, may change the attitude of each EC being positioned at the EC-supply portion in each unit, or may cause each EC from jumping out of each unit. In each case, each unit may fail to supply each EC to the EC holder of the EC mounting device.

SUMMARY OF THE INVENTION

It is therefore an object of the present invention to provide an electric-component supplying method which can shorten the electric-component-supply cycle time without lowering the accuracy of supplying of each electric component.

It is another object of the present invention to provide an electric-component supplying unit which can shorten the electric-component-supply cycle time without lowering the accuracy of supplying of each electric component.

It is another object of the present invention to provide an electric-component supplying apparatus which can shorten the electric-component-supply cycle time without lowering the accuracy of supplying of each electric component.

The present invention provides an electric-component supplying method, an electric-component supplying unit, and an electric-component supplying apparatus that have one or more of the technical features that are described below in respective paragraphs given parenthesized sequential numbers (1) to (17). Any technical feature that includes another technical feature shall do so by referring, at the beginning, to the parenthesized sequential number given to that feature. Thus, two or more of the following features may be combined, if appropriate. Each technical feature may be accompanied by a supplemental explanation, as needed. However, the following technical features and the appropriate combinations thereof are just examples to which the present invention is by no means limited.

(1) According to a first feature of the present invention, there is provided a method of moving a plurality of component supplying units each of which carries a plurality of electric components, along a reference line along which respective component-supply portions of the component supplying units are arranged, so as to sequentially position the respective component-supply portions at a component-supply position, and causing an external drive device to operate a drive member thereof to drive a driven member of the each component supplying unit and thereby feed the electric components of the each unit, one by one, to the component-supply portion of the each unit, the method comprising the steps of storing, in each component supplying unit, an energy which is transmitted from the drive member to the driven member of each unit, and operating a feeding device of each component supplying unit to utilize, after the drive member is moved off the driven member of the each unit, the stored energy for performing at least a portion of at least one of a component feeding action and a component-feeding preparing action, the component feeding action causing one of the electric components of each unit to be fed to the component-supply portion of each unit, the component-feeding preparing action causing the feeding device to be prepared for the component feeding action. An electric-component ("EC") feeding operation of each of the EC supplying units may consist of both the EC feeding action and the EC-feeding preparing action of the feeding device, or of the EC feeding action only. In the former case, the feeding device may perform either of the EC feeding action and the EC-feeding preparing action, when the drive member drives the driven member. One EC feeding operation of each unit may, or may not, cause one EC to be fed to the EC-supply portion of each unit. For example, in the case of a large EC, each unit performs a plurality of EC feeding operations to feed the large EC to the EC-supply portion. The feeding device of each unit may be one which feeds, to the EC-supply portion thereof, an EC carrier tape carrying a plurality of ECs at a regular interval of distance, or one which arranges a plurality of ECs stored in a casing, into an array of ECs, by utilizing vibration, inclination, air flow, and/or one or more belts, and feeds the ECs one by one to the EC-supply portion. Even if the drive member is moved off the driven member, the feeding device can utilize the stored energy for performing at least a portion of at least one of the EC feeding action and the EC-feeding preparing action. After the drive member is moved off the driven member, the current EC supplying unit being positioned at the EC-supply position can start moving from the EC-supply position, and the feeding device thereof can perform at least a portion of at least one of the EC feeding action and the EC-feeding preparing action. In this case, that portion of the EC feeding action and/or the EC-feeding preparing action occurs concurrently with the moving of the EC supplying units. Therefore, a EC-stop period during which each unit is stopped at the EC-supply position can be shortened without increasing the EC-feed speed of the feeding device. More specifically described, in the case where at least a portion of the EC feeding action occurs concurrently with the moving of the units, a long EC-feed period can be taken to feed each EC; and in the case where at least a portion of the EC-feeding preparing action occurs concurrently with the moving of the units, the ratio of the EC-feed period to the unit-stop period can be increased. This leads to preventing the lowering of the accuracy of supplying of each EC, and decreasing the possibility of the failure of supplying of each EC. Since the unit-stop period can be shortened, the EC-supply cycle time can be shortened, which leads to improving the efficiency of supplying of ECs. In the case where it is not needed to shorten the EC-supply cycle time, the acceleration and/or deceleration of moving of the units, and/or the acceleration and/or deceleration of feeding of the ECs can be lowered, which leads to reducing the vibration produced when the units are moved or the ECs are fed, thereby preventing the lowering of the accuracy of supplying of each EC, and decreasing the possibility of the failure of supplying of each EC. In the case where the EC feeding operation of each unit consists of only the EC feeding action of the feeding device, the feeding device can feed each EC both while each unit is stopped and while each unit is moved. Thus, a long EC-feed period can be taken, which leads to lowering the EC-feed speed of the feeding device.

(2) According to a second feature of the present invention that includes the first feature (1), the feeding device of each component supplying unit performs the component feeding action, and the at least one of the component feeding action and the component-feeding preparing action comprises the component feeding action.

(3) According to a third feature of the present invention that includes the first or second feature (1) or (2), the feeding device of the each component supplying unit performs both the component feeding action and the component-feeding preparing action, and the external drive device reciprocates the drive member forward and backward, and the forward motion of the drive member is transmitted to the driven member of the each unit so that feeding device of the each unit performs the component-feeding preparing action. In this case, when the feeding device performs the EC-feeding preparing action, each unit stores the energy transmitted from the drive member.

(4) According to a fourth feature of the present invention that includes any one of the first to third features (1) to (3), the feeding device of each component supplying unit performs the component feeding action, and the feeding device of the each unit performs component feeding action at a speed lower than a speed at which the drive member is operated by the external drive device. In the case where the EC feeding operation of each unit consists of both the EC feeding action and the EC-feeding preparing action of the feeding device, it is preferred that, according to the third feature (3), the external drive device reciprocate the drive member forward and backward and the forward motion of the drive member is transmitted to the driven member of each unit so that the feeding device of each unit performs the EC-feeding preparing action. In the latter case, subsequently, the feeding device may utilize the stored energy for performing the EC feeding action such that the driven member is operated backward at a speed lower than a speed at which the drive member is operated backward. Thus, each unit can store the energy and perform the EC-feeding preparing action when the drive member is operated forward at a high speed and the driven member is operated at the high speed, and subsequently can perform the EC feeding action at a low speed. Even if the drive and driven members may be operated forward at a high speed and the EC-feeding preparing action is performed at a high speed, the accuracy or reliability of supplying of ECs is not lowered. In addition, even if the drive member may be operated backward at a high speed, the driven member need not be operated backward at the high speed, or the EC feeding action need not be performed at the high speed. Accordingly, the drive member can be quickly moved off the driven member when the drive member is operated backward at a high speed. After the drive member is moved off the driven member, each unit being positioned at the EC-supply position can start moving away from the EC-supply position. Thus, each unit can stably perform the EC feeding action at a low speed, while shortening the unit-stop period during which the each unit is stopped at the EC-supply position. This leads to improving the efficiency of supplying of ECs. This feature corresponds to the combination of the second, third, and fourth features (2), (3), and (4) and, according to this feature, the feeding device of each unit performs the EC feeding action at a speed lower than a speed at which the drive member is operated backward. However, it is not essentially required that the EC feeding operation consist of both the EC feeding action and the EC-feeding preparing action. For example, as will be described later in connection with the preferred embodiments of the present invention, each unit may store energy when the driven member is driven by the drive member being operated forward, and utilize the stored energy for performing only the EC feeding action at a low speed. In the latter case, at least a portion of the EC feeding action occurs while each unit is moved. According to this feature, the feeding device of each unit performs the EC feeding action at a speed lower than a speed at which the drive member is operated forward. In this case, too, the drive member is operated backward at a high speed, so that the drive member is quickly returned, i.e., is quickly moved off the driven member. In the case where the EC feeding operation does not need the EC-feeding preparing action, i.e., consists of the EC feeding action only, the drive and driven members may be ones which are operated in one direction only (e.g., rotated in one direction only). In the last case, the feeding device of each unit performs the EC feeding action at a speed lower than a speed at which the drive member is operated in the one direction.

(5) According to a fifth feature of the present invention that includes any one of the first to fourth features (1) to (4), the component feeding action of the feeding device of the each component supplying unit causes a carrier tape carrying the electric components at a component-carry pitch, to be fed at a component-feed pitch equal to a value obtained by dividing the component-carry pitch by a natural number, so that the one of the electric components is fed to the component-supply portion of the each unit. It is preferred that the carrier tape be fed at a component-feed pitch equal to the component-carry pitch. However, for example, in the case where the feeding device feeds a carrier tape carrying too large ECs to be fed at a component-feed pitch equal to the component-carry pitch, each EC may be fed to the EC-supply portion by performing a plurality of EC feeding operations, that is, at a component-feed pitch equal to a value obtained by dividing the component-carry pitch by two or a greater number. In the last case, at least a portion of at least one of the respective EC feeding actions of the plurality of EC feeding operations, or at least a portion of at least one of the respective EC-feeding preparing actions of the same may occur concurrently with the moving of the units, according to the first feature (1). It is noted that each of the first to fifth features (1) to (5) of the EC supplying method may be combined with each of the following features (6) to (17) of the EC supplying unit or apparatus.

(6) According to a sixth feature of the present invention, there is provided an electric-component supplying unit, comprising a main frame including a guide portion which guides a plurality of electric components; a driven member which is supported by the main frame such that the drive member is movable relative to the main frame and which is driven by a drive member of an external drive device; an energy storing device which stores an energy which is transmitted from the drive member to the driven member; a feeding device which utilizes, after the drive member is moved off the drive member, the stored energy for performing at least a portion of at least one of a component feeding action and a component-feeding preparing action, the component feeding action causing a feeding of one of the electric components guided by the guide portion, the component-feeding preparing action causing the feeding device to be prepared for the component feeding action. The EC supplying unit according to the sixth feature (6) may perform the EC supplying method according to any one of the first to fifth features (1) to (5). Therefore, the unit can feed each EC at a low speed while shortening the unit-stop period during which the unit is stopped at the EC-supply position.

(7) According to a seventh feature of the present invention that includes the sixth feature (6), the electric-component supplying unit further comprises an action retarding device which performs at least one of a delaying of a timing at which the at least one of the component feeding action and the component-feeding preparing action is started by the feeding device, and a decreasing of a speed at which the at least one of the component feeding action and the component-feeding preparing action is performed by the feeding device. A device which performs the delaying of the timing can be said as an action-start delaying device, and a device which performs the decreasing of the speed can be said as an action-speed decreasing device. However, many devices function as both the action-start delaying device and the action-speed decreasing device. The EC supplying unit may comprise either one, or both, of the action-start delaying device and the action-speed decreasing device. If either of the delaying of starting of the action or the decreasing of speed of the action is achieved, a timing at which the action is actually finished is delayed from a timing at which the action would otherwise be finished. Thus, the drive member is moved off the driven member before the action is finished. The drive member can be moved off the driven member by lowering the speed at which the driven member is operated backward, or lowering the speed at which an EC-feed member is operated. In the former case, the action retarding device can be said as a driven-member-backward-operation retarding device; and in the latter case, the action retarding device can be said as an EC-feed-member-operation retarding device.

(8) According to an eighth feature of the present invention that includes the seventh feature (7), the feeding device comprises a displaceable feed member as an output member, and at least one displaceable member which is displaceable with the feed member, and the action retarding device comprises a damper which engages a displaceable engaged member as the one displaceable member, thereby decreasing a speed at which the feed member is displaced in a component-feed direction to perform the component feeding action. The displaceable member which is displaceable with the feed member may be one which is produced integrally with the feed member, or one which is produced separately from the feed member but is operatively connected to the feed member and accordingly is displaced with the feed member when the feed member is displaced. The damper functions as both the action-start delaying device and the action-speed decreasing device, but more strongly functions as the latter device than as the former device.

(9) According to a ninth feature of the present invention that includes the eighth feature (8), the damper comprises a fluid-containing damper which comprises a displaceable engaging member which engages the displaceable engaged member, a fluid chamber, a fluid contained in the fluid chamber, and a restrictor which restricts, when the engaging member is displaced with the engaged member, flowing of the fluid out of the fluid chamber, thereby decreasing a speed at which the engaging member is displaced with the engaged member. The fluid may be a gas such as air, or a liquid such as oil.

(10) According to a tenth feature of the present invention that includes the ninth feature (9), the fluid-containing damper comprises a flow-area decreasing device which decreases an area of the restrictor through which the fluid flows, as the feed member is displaced in the component-feed direction. The restrictor may comprise a plurality of passages, and the flow-area decreasing device may be one which gradually decreases the number of the passages which permit the fluid to flow out of the fluid chamber when the feed member is displaced in the component-feed direction and the engaging member is accordingly displaced. Those passages may be ones whose diameters are equal to each other and which are provided at a regular interval of distance in the direction of the above-indicated displacement of the engaging member. Otherwise, those passages may be ones which are provided such that the distance between each pair of adjacent passages decreases in the direction of the displacement of the engaging member. In the latter case, the deceleration of displacement of the feed member is gradually increased. The same effect can be obtained by employing a plurality of passages which are provided at a regular interval and whose diameters gradually decrease in the direction of the displacement of the engaging member.

(11) According to an eleventh feature of the present invention that includes any one of the seventh to tenth features (7) to (10), the feeding device comprises a displaceable feed member as an output member, and at least one displaceable member which is displaceable with the feed member, and the action retarding device comprises a fly wheel which is rotatable about an axis line, and a motion converting device which converts the displacement of the one displaceable member into the rotation of the fly wheel. The fly wheel functions as both the action-start delaying device and the action-speed decreasing device, but more strongly functions as the former device than as the latter device. Since the fly wheel has a great inertia moment, it delays the timing of starting of the action. Before the fly wheel reaches its constant-speed-rotation state, it decreases the speed of the action and accordingly acts as the action-speed decreasing device. In particular, in the case where either one of the EC feeding action and the EC-feeding preparing action is finished before the fly wheel reaches its constant-speed-rotation state, the fly wheel strongly functions as the action-speed decreasing device as well. The action retarding device may comprise, in addition to the fly wheel and the motion converting device, the damper according to any one of the eighth to tenth features (8) to (10).

(12) According to a twelfth feature of the present invention that includes any one of the sixth to eleventh features (6) to (11), the feeding device performs both the component feeding action and the component-feeding preparing action, and the feeding device performs the component-feeding preparing action when the driven member is driven by the drive member.

(13) According to a thirteenth feature of the present invention that includes any one of the sixth to twelfth features (6) to (12), the energy storing device comprises an elastic member which is elastically deformable for storing the energy. The elastic member may be a spring member, e.g., a coil spring such as a tension coil spring, or a member, such as a rubber member, which is elastically deformable.

(14) According to a fourteenth feature of the present invention that includes any one of the sixth to thirteenth features (6) to (13), the electric-component supplying unit further comprises a feeding-action-speed control device which controls a speed at which the feeding device performs the component feeding action. The present EC supplying unit performs, concurrently with the moving of the unit, at least a portion of at least one of the component feeding action and the component-feeding preparing action. In addition, in the present unit, the feeding-action-speed control device controls the speed at which the feeding device performs the component feeding action. Therefore, the present unit can feed each EC with still less vibration.

(15) According to a fifteenth feature of the present invention that includes the fourteenth feature (14), the feeding device comprises a displaceable feed member as an output member, and the feeding-action-speed control device comprises a speed decreasing device which smoothly decreases a speed at which the feed member is displaced in a component-feed direction to perform the component-feed action.

(16) According to a sixteenth feature of the present invention that includes the fifteenth feature (15), the speed decreasing device comprises a cam mechanism which includes a cam and a cam follower, the cam being so shaped as to smoothly decrease the speed at which the feed member is displaced in the component-feed direction. A cam surface of the cam may be so shaped as to obtain desirable values of the speed, acceleration, and deceleration of the EC feeding action or the EC-feeding preparing action. In the present EC supplying unit, the cam is so shaped as to smoothly decrease the speed at which the feed member is displaced in the component-feed direction, that is, so shaped as not to define so great a deceleration of the displacement of the feed member. In the case where the cam is so shaped as to define a sufficiently small derivative of the deceleration, the speed of displacement of the feed member is more smoothly decreased.

(17) According to a seventeenth feature of the present invention, there is provided an electric-component supplying apparatus, comprising a plurality of electric-component supplying units each according to any one of the sixth to sixteenth features (6) to (16); a table which supports the electric-component supplying units such that respective component-supply portions of the units are arranged along a reference line; and a table displacing device which displaces the table so that the component supplying units are displaced along the reference line and the respective component-supply portions of the units are sequentially positioned at a predetermined component-supply position. The reference line along which the respective EC-supply portions of the EC supplying units are arranged may be a straight line, a circle (i.e., a full circle), an arc (i.e., a part-circle), a curve different from the full circle or part-circle, or a combination of two or more of those lines. In the case where the reference line is the straight line, the table which supports the units may be provided by a linearly movable table which is movable along the straight line. In the case where the reference line is the circle, the table may be provided by a circular (i.e., full-circular) table which is rotatable about an axis line. In the case where the reference line is the arc, the table may be provided by a sectorial (i.e., part-circular) table which is rotatable about an axis line. Each of the circular table and the sectorial table can be said as a rotary table which is rotatable about an axis line. An object device to which the present EC supplying apparatus supplies ECs may be an EC mounting device which functions as an EC transferring device as a sort of EC picking-up device. The EC mounting device may be one which includes a plurality of EC holders which are revolvable about a common axis line, and a holder positioning device which sequentially positions the EC holders at least one operation position predetermined on the locus of revolution of the holders. Each of the EC holders may be provided by an EC sucker which sucks and holds an EC by applying a negative pressure or a vacuum thereto, or an EC catcher which includes a plurality of hands and symmetrically opens and closes the hands to catch and release an EC. The holder positioning device may be one which includes a plurality of rotary members which are rotatable about the above-indicated common axis line, independent of each other, and a rotary-motion applying device which applies, to each of the rotary members, a rotary motion which causes the each rotary member to rotate fully about the common axis line, stop at least one time during each full rotation thereof, and keep a predetermined time difference from each of its preceding and following rotary members. In this case, the rotary members support the EC holders, respectively. Alternatively, the holder positioning device may be one which includes a rotatable body which is rotatable about the above-indicated common axis line and which supports the EC holders at respective positions equally distant from the common axis line. The rotatable body may be an intermittent-rotation body which is intermittently rotated about the common axis line at a predetermined intermittent-rotation pitch by an intermittently rotating device, and which supports the EC holders such that the EC holders are angularly spaced from each other about the common axis line at a predetermined angular-spacing pitch equal to the intermittent-rotation pitch. In this case, while the intermittent-rotation body is intermittently rotated by the rotating device, the EC holders are sequentially stopped at one or more operation positions such as an EC-suck position, an EC-image-take position, and/or an EC-mount position. Alternatively, the rotatable body may be one which supports the EC holders along a circle whose center is located on the common axis line and which can be rotated by any desired angle in any desired direction by a rotating device so that each of the EC holders can hold and mount an EC. Otherwise, the EC mounting device may be one which includes at least one EC holder, a movable member which supports the EC holder and which is movable in a first direction perpendicular to the direction of displacement of the table on a plane, and a movable-member moving device which moves the movable member in the first direction. The movable-member moving device may be one which moves the movable member in each of the first direction and a second direction perpendicular to the first direction on the plane. The movable member may support a plurality of EC holders and a holder positioning device.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

There will be described an electric-component ("EC") mounting system including an EC supplying apparatus 14 to which the present invention is applied. The EC supplying apparatus 14 carries out an EC supplying method to which the present invention is also applied, and includes a plurality of EC supplying units 100 to each of which the present invention is also applied.

Figure 1:
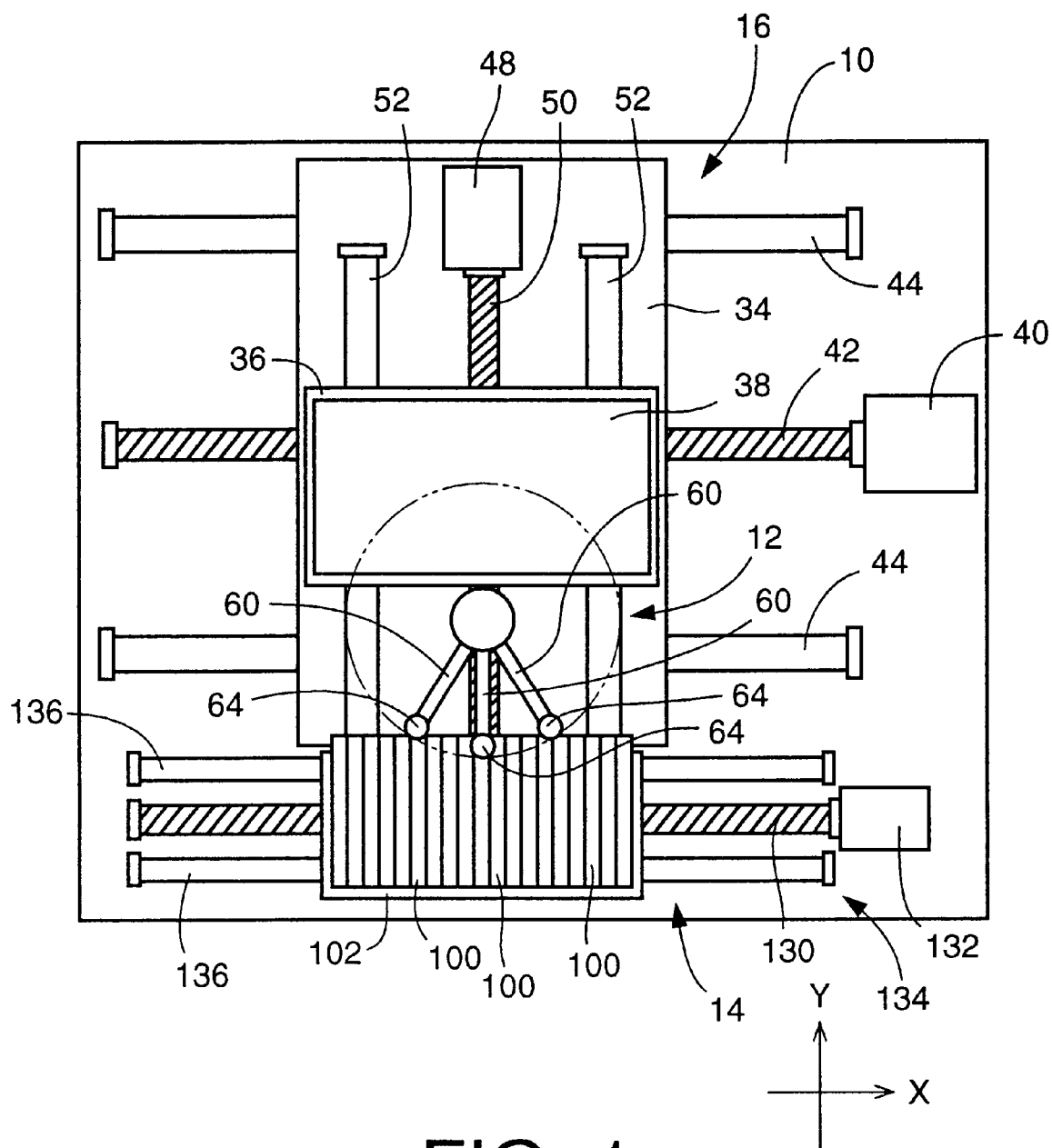
FIG. 1 is a schematic plan view of an electric-component ("EC") mounting system including an EC supplying apparatus to which the present invention is applied, which carries out an EC supplying method to which the present invention is also applied, and which includes a plurality of EC supplying units to each of which the present invention is also applied.

In FIG. 1, reference numeral 10 designates a base 10. On the base 10, there are provided, in addition to the EC supplying apparatus 14, an EC mounting device 12 and a printed-circuit-board ("PCB") supporting and positioning device 16. The PCB supporting and positioning device 16 includes an X-axis table 34 which is provided on the base 10 such that the X-axis table 34 is movable in an X-axis direction indicated at arrow in FIG. 1, and a Y-axis table 36 which is provided on the X-axis table 34 such that the Y-axis table 36 is movable in a Y-axis direction, indicated at arrow in FIG. 1, which is perpendicular to the X-axis direction on a horizontal plane.

On the Y-axis table 36, there is provided a PCB holding device (not shown) which positions and holds a PCB 38 as a sort of circuit substrate and which is movable up and down relative to the Y-axis table 36. A motion converting device which includes a feed screw 42 and a nut (not shown) converts the rotation of an X-axis servomotor 40 into the linear motion of the X-axis table 34, so that the X-axis table 34 is moved in the X-axis direction while being guided by a pair of linear guide rails 44 as guide members. Similarly, another motion converting device which includes a feed screw 50 and a nut (not shown) converts the rotation of a Y-axis servomotor 48 into the linear motion of the Y-axis table 36, so that the Y-axis table 36 is moved in the Y-axis direction while being guided by another pair of linear guide rails 52 as guide members. Thus, the PCB 38 held by the PCB holding device can be moved to an arbitrary position on a horizontal plane, owing to the respective movements of the X-axis and Y-axis tables 34, 36. That is, a plurality of predetermined EC-mount places on the PCB 38 can be sequentially positioned at a predetermined EC-mount position. The PCB 38 is carried in, and loaded on the PCB holding device, by a PCB carry-in device (not shown), and is unloaded from the PCB holding device, and carried out, by a PCB carry-out device (not shown).

The EC mounting device 12 has a construction similar to that of the EC mounting device disclosed in Japanese Patent Application laid open for public inspection under Publication No. 9(1997)-237997 corresponding to U.S. Pat. No. 5,926,950 assigned to the Assignee of the present application. Hence, the EC mounting device 12 will be briefly described below.

Figure 2:
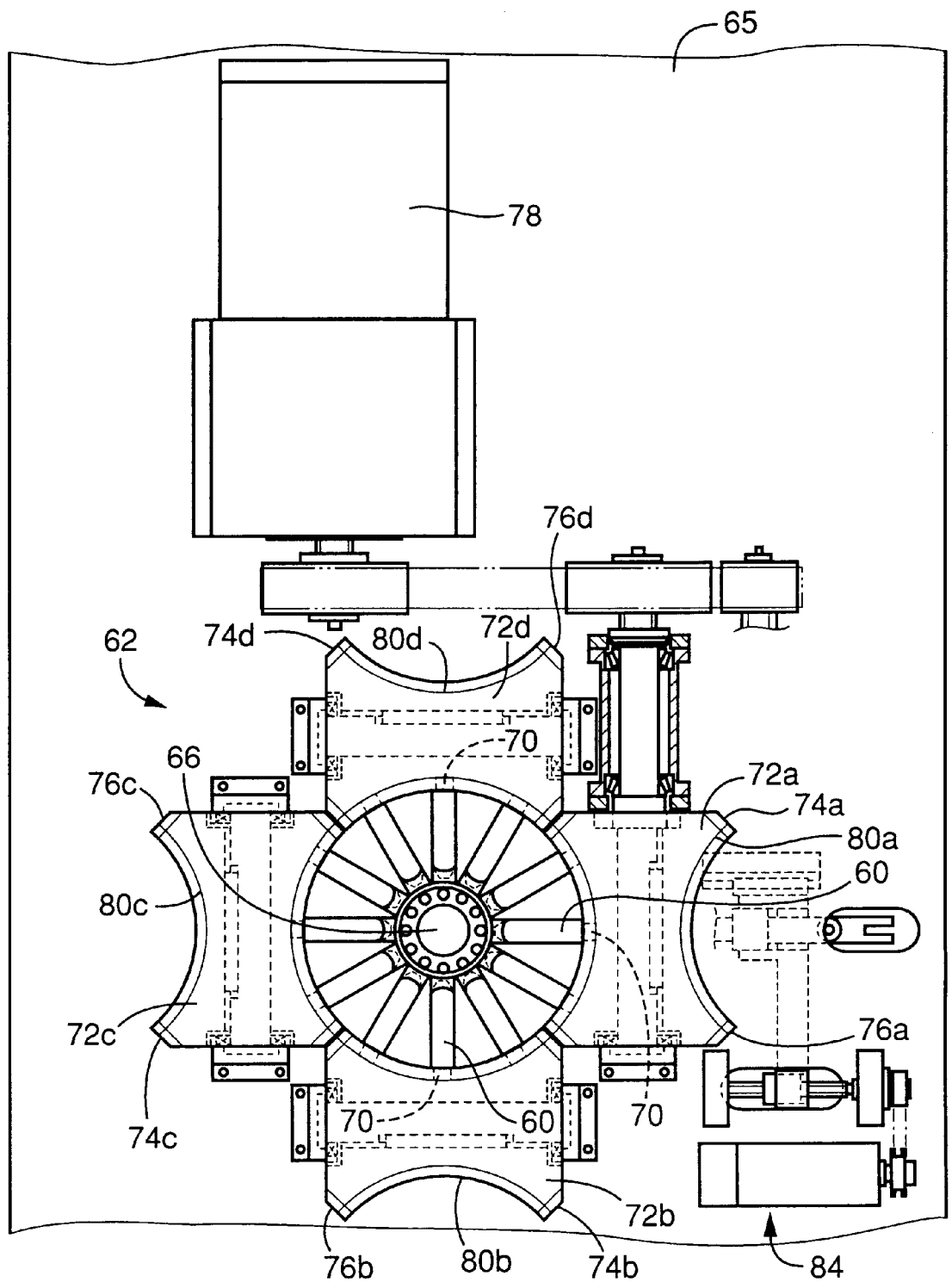
FIG. 2 is a plan view of an EC mounting device of the EC mounting system of FIG. 1.

The EC mounting device 12 includes twelve rotary plates 60 as rotary members which are rotatable about a vertical common axis line, independent of one another; twelve EC holding heads 64 which are supported by the twelve rotary plates 60, respectively, and each of which holds an EC 140 (FIG. 3); and a rotary-plate rotating device 62 as a rotary-motion applying device which applies, to each of the rotary plates 60, a rotary motion which causes the each plate 60 to rotate fully about the common axis line while stopping three times during each full rotation and keeping a predetermined time difference between the each plate 60 and each of its adjacent two plates 60, i.e., its preceding and following plates 60. As shown in FIG. 2, the rotary plates 60 are attached to a vertical axis member 66 supported by a main frame 65, such that the rotary plates 60 are rotatable about the vertical common axis line, independent of one another. Each of the EC holding heads 64 includes an EC sucker 68 (FIG. 3) as a sort of EC holder which holds an EC 140 by applying a negative pressure, or vacuum, thereto. Each of the EC holding heads 64 is supported by a corresponding one of the rotary plates 60, such that the each head 64 is movable up and down relative to the one plate 60.

As shown in FIG. 2, the rotary-plate rotating device 62 includes twelve rollers 70 as cam followers which are attached to the twelve rotary plates 60, respectively, such that each of the rollers 70 is rotatable relative to a corresponding one of the rotary plates 60; and four concave globoidal cams 72a, 72b, 72c, 72d as rotary-motion applying cams which sequentially engage and move each of the twelve rollers 70 and thereby move a corresponding one of the twelve rotary plates 60. Each of the concave globoidal cams 72a–72d has an outer circumferential surface defined by a locus which is described by a circular arc whose center is located on the common axis line of the rotary plates 60, i.e., an axis line of the vertical axis member 66, when the circular arc is rotated about an axis line which is located such that the circular arc is interposed between this axis line and the axis line of the axis member 66 and which is perpendicular to, but does not intersect, the axis line of the axis member 66. The four concave globoidal cams 72a–72d are disposed symmetrically with respect to the axis line of the axis member 66, such that respective inner lines of intersection of the outer circumferential surfaces of the cams 72a–72d with a plane including the respective axis lines of the cams 72a–72d cooperate with one another to define a substantially continuous circle whose center is located on the axis line of the axis member 66.

The globoidal cams 72a–72d have respective bevel gears 74a, 74b, 74c, 74d at respective one axial ends thereof, and respective bevel gears 76a, 76b, 76c, 76d at respective other axial ends thereof. Each pair of adjacent bevel gears 74a and 76d, 74b and 76a, 74c and 76b, or, 74d and 76c, are held in meshing engagement with each other. When the globoidal cam 72a is rotated by a main servomotor 78, all the globoidal cams 72a–74d are contemporaneously rotated in synchronism with one another, so that the respective rollers 70 of the twelve rotary plates 60 are sequentially engaged with respective cam grooves 80a, 80b, 80c, 80d of the cams 72a–72d, the twelve rotary plates 60 are rotated independent of one another, and the twelve EC holding heads 64 are revolved about the axis line of the axis member 66. Three plates 60 out of the twelve plates 60 are simultaneously stopped at an EC-suck position where an EC 140 is sucked, the previously-described EC-mount position where an EC 140 is mounted, and an EC-image-take position where an image of an EC 140 is taken, respectively, while the other, nine plates 60 are being rotated. Thus, each of the twelve EC holding heads 64 can reach each of the EC-suck position, the EC-mount position, and the EC-image-take position, in a short cycle time, which contributes to improving the efficiency of mounting of ECs 140.

Two head elevating and lowering devices 84 are provided at the EC-suck position and the EC-mount position, respectively (in FIG. 2, only the device 84 provided at the EC-mount position is shown as a representative of the two devices 84). When each of the EC holding heads 64 reaches each of the EC-suck position and the EC-mount position, the each head 64 is lowered and elevated by a corresponding one of the two devices 84 so as to suck or mount an EC 140. Each of the devices 84 includes the main servomotor 78 as its drive source, and a motion converting device which includes a cam and a cam follower and which converts the rotation of the servomotor 78 into the upward and downward movement of the each head 64. Thus, the each head 64 is moved upward or downward at a predetermined timing and at predetermined speed, acceleration, and deceleration. At the EC-image-take position, there is provided a CCD (charge coupled device) camera 86 (FIG. 5) as an image taking device. Each of the twelve EC suckers 68 is supported by a corresponding one of the twelve EC holding heads 64, such that the each sucker 68 is rotated about its axis line relative to the one head 64 by a corresponding one of respective sucker rotating devices (not shown) of the twelve rotary plates 60.

Figure 3:
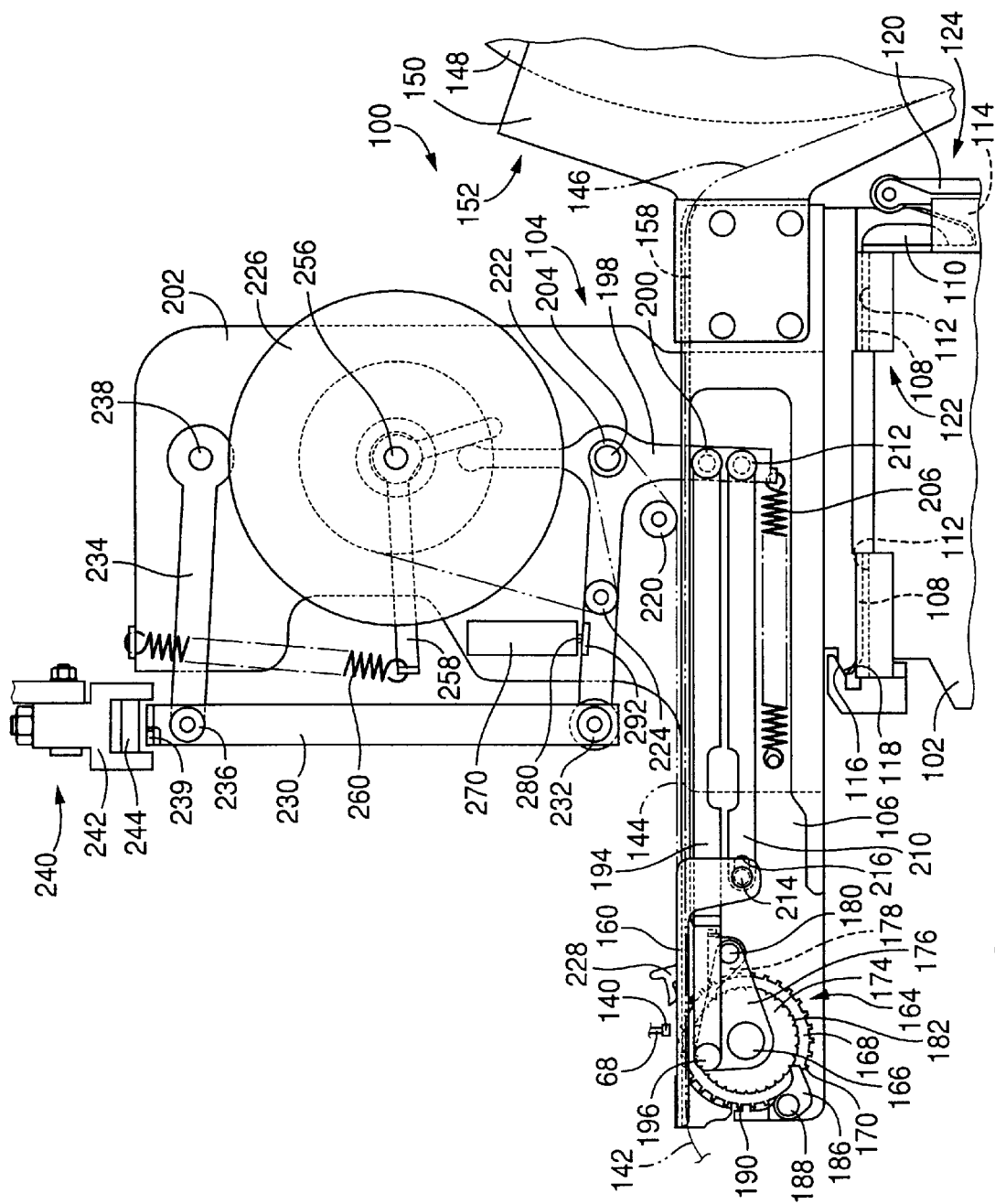
FIG. 3 is a front elevation view of a representative one of the EC supplying units of FIG. 1.

As shown in FIG. 1, the EC supplying apparatus 14 includes the plurality of EC supplying units 100 which are detachably attached to a support table 102 such that respective EC-supply portions of the units 100 are arranged along a straight line parallel to the X-axis direction. Each of the units 100 includes a main frame 104 which is easily obtained by fixing a plurality of members to each other. As shown in FIG. 3, a support member 106 as one of those members has a generally elongate, plate-like shape. Each unit 100 has a pair of first positioning projections 108 and a second positioning projection 110 all of which are supported by the support member 106. Since the pair of first positioning projections 108 and the second positioning projection 110 are respectively fitted in a pair of first positioning grooves 112 and a second positioning groove 114 all of which are formed in the support table 102, each unit 100 is firmly positioned relative to the table 102 in a widthwise direction of the each unit 100, that is, a direction parallel to the direction of movement of the table 102. In addition, since an inclined surface 116 of each unit 100 is engaged with an inclined surface 118 of the table 102, each unit 100 is firmly positioned relative to the table 102 in a lengthwise direction of the each unit 100. Moreover, since an engaging member 120 which is pivotally supported by the table 102 is engaged with the second positioning projection 110, each unit 100 is pressed against the table 102 owing to a pressing force resulting from that engagement in addition to a pressing force resulting from the engagement of the inclined surfaces 116, 118. Thus, each unit 100 is prevented from moving up away from the table 102, and is firmly attached to the table 102. The first and second positioning projections 108, 110, the first and second positioning grooves 112, 114, and the inclined surfaces 116, 118 cooperate with one another to provide a positioning device 122 which positions each unit 100 relative to the table 102; and the inclined surfaces 116, 118, the second positioning projection 110, and the engaging member 120 cooperate with one another to provide a fixing device 124 which fixes each unit 100 to the table 102. Each unit 100 is attached to the table 102 such that the lengthwise direction (i.e., front-rear direct ion) of the each unit 100 is parallel to the Y-axis direction.

As shown in FIG. 1, the support table 102 is moved in the X-axis direction by a table moving device 134, while being guided by a pair of linear guide rails 136 as guide members. The table moving device 134 includes a table moving servomotor 132 as its drive source, and a motion converting device which includes a feed screw 130 and a nut (not shown). Thus, the respective EC-supply portions of the EC supplying units 100 can be sequentially positioned at a predetermined EC-supply position where the EC-supply portion of each unit 100 is positioned right below one EC holding head 64 being positioned at the EC-suck position of the EC mounting device 12.

Each EC supplying unit 100 supplies a plurality of ECs 140 in the form of an embossed-type EC carrier tape 146 (FIG. 3). The EC carrier tape 146 includes an EC accommodating tape 142, and a cover tape 144. The EC accommodating tape 142 includes two side portions which are opposite to each other in a widthwise direction of the tape 142 and each of which extends in a lengthwise direction of the tape 142, and further includes a plurality of EC accommodating portions which project downward from the two side portions and which are arranged at a predetermined regular interval of distance in the lengthwise direction of the tape 142. Each of the EC accommodating portions defines an EC accommodating pocket which opens upward and which accommodates an EC 140. The cover tape 144 is adhered to the EC accommodating tape 142 to close the respective openings of the EC accommodating pockets. The EC accommodating tape 142 has a plurality of feed holes which are formed through the thickness of the tape 142 and which are arranged at a predetermined regular interval of distance in the lengthwise direction of the tape 142. The EC carrier tape 146 is wound around a tape-supply reel 148 (FIG. 3).

A rear portion of the support member 106 which is remote from the EC mounting device 12 supports a tape storing device 152 as a sort of EC storing device. The tape storing device 152 includes a reel holder 150 and a reel-support axis member (not shown) as a reel-support member which is provided on the reel holder 150. The tape-supply reel 148 is accommodated in the reel holder 150, and is supported by the reel-support axis member such that the reel 148 is rotatable about an axis line parallel to the widthwise direction of each unit 100.

After the EC carrier tape 146 is drawn from the tape-supply reel 148, the tape 146 is introduced into a guide groove 158 which is formed in the support member 106, so that the tape 146 is fed to the EC-supply portion corresponding to a front portion of the support member 106 which is near to the EC mounting device 12. A cover member 160 covers the front portion of the support member 106 that corresponds to the EC-supply portion, thereby covering the EC carrier tape 146 which is fed by a tape feeding device 164, shown in FIG. 3, at a predetermined tape-feed pitch in the Y-axis direction. In the present embodiment, the tape-feed pitch is equal to the distance between respective centers of each pair of adjacent EC accommodating pockets of the EC accommodating tape 142 in the lengthwise direction of the tape 142, that is, the predetermined regular interval of distance at which those pockets are formed in the tape 142 in its lengthwise direction. The tape feeding device 164 includes a sprocket 168 as a sort of feed member which provides an output member. The sprocket 168 is supported by an axis member 166 fixed to the support member 106, such that the sprocket 168 is rotatable about a horizontal axis line perpendicular to the direction in which the EC carrier tape 146 is fed by the feeding device 164. Some of teeth 170 of the sprocket 168 are engaged with some of the feed holes of the EC accommodating tape 142. A ratchet wheel 174 whose diameter is smaller than that of the sprocket 168 is fixed to the sprocket 168, such that the ratchet wheel 174 is concentric with the sprocket 168 and is not rotatable relative to the same 168.

The axis member 166 also supports a generally triangular, pivotable plate 176 as a pivotable member, such that the pivotable plate 176 is pivotable about the axis member 166. A ratchet pawl 178 is attached to the pivotable plate 176 via an axis member 180, such that the ratchet pawl 178 is pivotable about the axis member 180. The ratchet pawl 178 is biased by a spring (not shown) provided between the pawl 178 and the axis member 180, in a direction in which the pawl 178 engages one of teeth 182 of the ratchet wheel 174. When the pivotable plate 176 is rotated in a forward direction (i.e., counterclockwise in FIG. 3), the ratchet pawl 178 is kept engaged with the teeth 182 and, when the plate 176 is rotated in a backward direction (i.e., clockwise in FIG. 3), the pawl 178 is moved over the teeth 182.

A stopper lever 186 is attached to the support member 106 via an axis member 188, such that the stopper lever 186 is pivotable about the axis member 188. The stopper lever 186 is biased by a compression coil spring 190 provided between the lever 186 and the support member 106, in a direction in which an engaging portion of the lever 186 engages one of the teeth 182 of the ratchet wheel 174. The stopper lever 186 permits the rotation of the ratchet wheel 174 in its forward direction (i.e., counterclockwise in FIG. 3), but does not permit the rotation of the ratchet pawl 178 in its backward direction (i.e., clockwise in FIG. 3). In addition, the stopper lever 186 positions the sprocket 168 via the ratchet wheel 174, relative to the support member 106 or the main frame 104.

A tape drive plate 194 as a connecting member or a drive-force transmitting member is pivotally connected at one end portion thereof to the pivotable plate 176 via an axis member 196. The other end portion of the drive plate 194 is pivotally connected to a drive lever 198 via an axis member 200. The drive lever 198 is pivotally attached via an axis member 204 to a bracket 202 fixed to the support member 106, and is biased by a tension coil spring 206 provided between a lower end portion of the lever 198 and the support member 106, in a direction in which the drive lever 198 is rotated clockwise in FIG. 3. The bracket 202 cooperates with the support member 106 to provide the main frame 104.

A cover drive plate 210 as a connecting member or a drive-force transmitting member is pivotally connected at one end portion thereof via an axis member 212 to a portion of the drive lever 198 between a portion of the same 198 to which the tape drive plate 194 is connected, and the lower end portion of the same 198 to which the tension coil spring 206 is connected. The other end portion of the drive plate 210 is pivotally connected to a rear end portion of the cover member 160 via a pin member 214. The pin member 214 extends through the thickness of the support member 106 in the widthwise direction of the same 106, and is fitted in an elongate hole 216 which is formed through the thickness of the same 106 and which is elongate in the lengthwise direction of each unit 100. Thus, the cover member 160 is movable relative to the support member 106. The limit of pivotable motion of the drive lever 198 in its forward direction (i.e., clockwise in FIG. 3) is defined by the butting of the pin member 214 against the front end of the elongate hole 216, i.e., the downstream-side end of the hole 216 in the direction of feeding of the EC carrier tape 146. When the drive lever 198 is pivoted in its forward direction, the EC carrier tape 146 and the cover member 160 are fed forward, and the leading one of the ECs 140 is constantly moved to a predetermined EC-pick-up position right below the EC sucker 68 of one EC holding head 64 being positioned at the EC-suck position. The EC-supply portion is provided by a portion of each unit 100 which is in the vicinity of the EC-pick-up position and includes the EC-pick-up position. The EC-supply portion can be said as an EC-pick-up portion.

The cover member 160 is provided by a member having a generally U-shaped cross section. The cover member 160 is fitted on the front portion of the support member 106, and the EC carrier tape 146 is fed through a space defined by, and between, the cover member 160 and an upper surface of the support member 106. The tape 146 is fed forward while being positioned in its widthwise direction by a pair of side walls of the cover member 160. Thus, the guide groove 158 and the cover member 160 cooperate with each other to provide a guiding device which guides the EC carrier tape 146. The cover member 160 has a slit (not shown) which extends in a direction perpendicular to the direction of feeding of the tape 146. The cover tape 144 peeled off the EC accommodating tape 142 is drawn out through the slit of the cover member 160. The cover tape 144 drawn out of the cover member 160 is guided by two stationary guide rollers 220, 222 which are rotatably attached to the bracket 202, and a movable guide roller 224 which is rotatably attached to the drive lever 198, and then is taken up by a take-up reel 226.

The cover member 160 has an elongate hole (not shown) formed in a portion thereof corresponding to the feed holes of the EC accommodating tape 142. The elongate hole prevents the cover member 160 from interfering with the teeth 170 of the sprocket 168. The cover member 160 additionally has a rectangular opening (not shown) on a downstream side of the slit in the tape-feed direction. The EC sucker 68 of each EC holding head 64 picks up an EC 140 through the rectangular opening of the cover member 160. The cover member 160 includes a thin tongue portion (not shown) which is provided on an upstream side of the rectangular opening in the tape-feed direction and which has a U-shaped notch which communicates at a downstream-side end thereof with the rectangular opening. A dimension of the U-shaped notch in a direction perpendicular to the tape-feed direction is greater than the diameter of the suction pipe of the EC sucker 68 and is smaller than a dimension of the EC 140 in that perpendicular direction. A cover hold-down member 228 which is pivotally attached to the support member 106 prevents the cover member 160 from moving up away from the support member 106.

A driven bar 230 as a driven member is pivotally connected at a lower end portion thereof to the drive lever 198 via a pin member 232. An upper end portion of the driven bar 230 is pivotally connected to one end portion of a link member 234 via a pin member 236. The other end portion of the link member 234 is pivotally connected to the bracket 202 via an axis member 238. An upper end portion of the driven bar 230 is bent in a direction perpendicular to a lengthwise direction of the bar 230, so as to provide a driven tongue portion 239 as a driven portion. The driven bar 230 is biased by the tension coil spring 206 via the drive lever 198, in a direction in which the bar 230 is moved upward. An upper stroke-end position of the driven bar 230 corresponds to the limit of pivotal motion of the drive lever 198 that is defined by the butting of the pin member 214 against the front end of the elongate hole 216.

A stationary drive device 240 is provided in the vicinity of the EC-supply position of the EC mounting device 12. The drive device 240 includes a pushing member 242 as a drive member which is movable up and down, and a pushing-member elevating and lowering device as a drive-member moving device which elevates and lowers the pushing member 242. The pushing-member elevating and lowering device includes, as its drive source, the main servomotor 78 of the EC mounting device 12, and additionally includes a motion converting device which includes a cam and a cam follower and which converts the rotation of the servomotor 78 into the upward and downward movement of the pushing member 242. The elevating and lowering device elevates and lowers the pushing member 242 at a timed relation with the picking up of an EC 140 by each EC sucker 68 (i.e., each EC holding head 64). The pushing member 242 includes an engaging roller 244 as an engaging portion, and the engaging roller 244 can engage the driven tongue portion 239 of the driven bar 230. While the pushing member 242 is not driven by the drive device 240, the pushing member 242 is held at an inoperative position thereof, which can otherwise be said as a retracted position or an upper stroke-end position, where the pushing member 242 is away from the driven tongue portion 239 of the driven bar 230 being positioned at its upper-stroke end position, that is, the engaging roller 244 is positioned slightly above the driven tongue portion 239.

The cover-tape take-up reel 226 is attached to an axis member 256 fixed to the bracket 202, such that the take-up reel 226 is rotatable with a take-up lever 258 about the axis member 256. The take-up lever 258 is rotatably attached to the axis member 256. A first and a second one-way clutch (not shown) are provided between the take-up reel 226, the take-up lever 258, and the axis member 256. The first one-way clutch that is provided between the reel 226 and the lever 258 inhibits the lever 258 from being rotated relative to the reel 226 in a cover-tape take-up direction (i.e., clockwise in FIG. 3), but permits the lever 258 to be rotated relative to the reel 226 in the opposite direction (i.e., counterclockwise in FIG. 3). The second one-way clutch that is provided between the axis member 256 and the reel 226 permits the reel 226 to be rotated relative to the axis member 256 in the cover-tape take-up direction, but inhibits the reel 226 from being rotated relative to the axis member 256 in the opposite direction.

The take-up lever 258 is biased by a tension coil spring 260 provided between the lever 258 and the bracket 202, in the cover-tape take-up direction, i.e., in a direction in which the lever 258 engages the drive lever 198.

Figure 4:
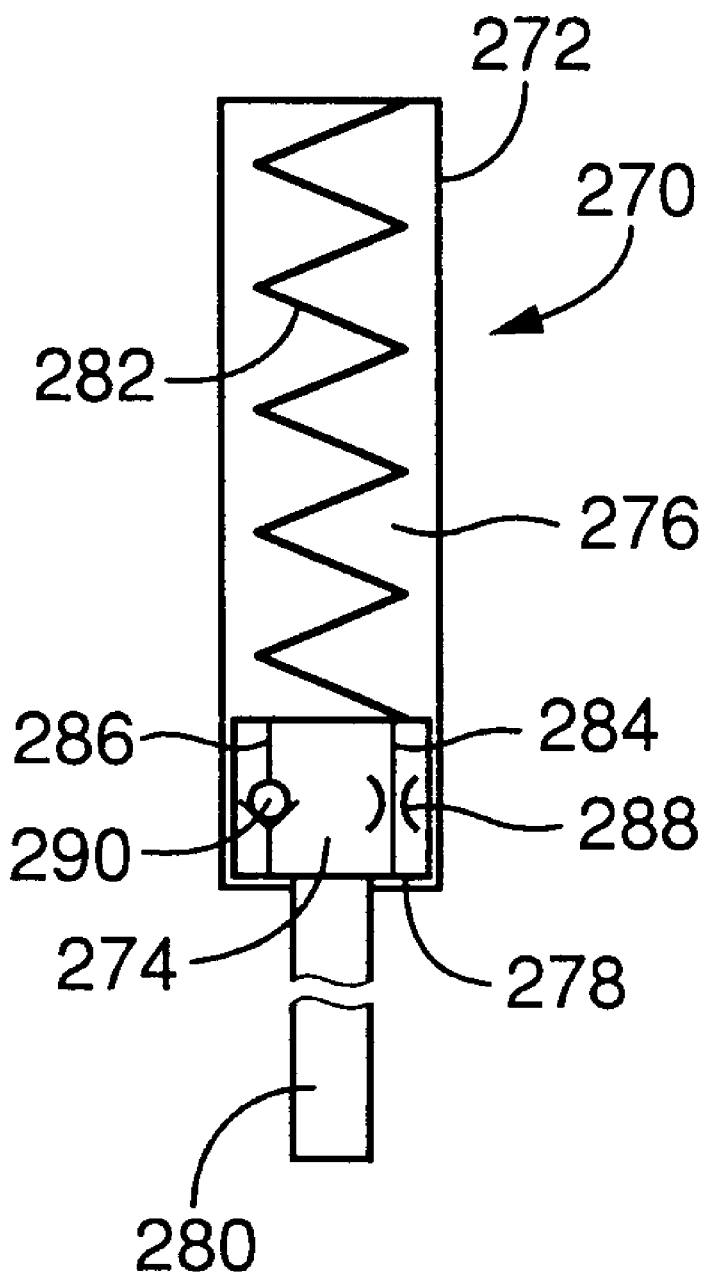
FIG. 4 is an illustrative view of an air damper employed in the EC supplying unit of FIG. 3.

An air damper 270 is supported by the bracket 202, such that the air damper 270 is positioned on a downstream side of the drive lever 198 in a forward rotation direction of the lever 198 in which the lever 198 is biased by the tension coil spring 206. More specifically described, the air damper 270 is positioned on the downstream side of an arm portion of the drive lever 198 in the forward rotation direction of the lever 198, the arm portion being connected to the driven bar 230 and slightly inclined with respect to a horizontal plane. As illustratively shown in FIG. 4, the air damper 270 includes a casing 272, and a piston 274 which is airtightly fitted in the casing 272 via one or more sealing members (not shown) such that the piston 272 is slideable on an inner surface of the casing 272. A first and a second air chamber 276, 278 are provided, in the casing 272, on both sides of the piston 274 in the direction of movement of the same 274. A piston rod 280 which is integral with the piston 274 passes through the second air chamber 278 and projects out of the casing 272. The piston 274 is biased by a compression coil spring 282 provided in the first air chamber 276, in a direction in which the piston rod 280 projects out of the casing 272. A dust seal (not shown) is provided between the piston rod 280 and the casing 272.

The piston 274 has two passages 284, 286 each of which connects the two air chambers 276, 278 to each other. A restrictor 288 is provided in the first passage 284, and a check valve 290 that may be provided by a leaf valve is provided in the second passage 286. The check valve 290 permits the flowing of air from the second air chamber 278 to the first air chamber 276, but inhibits the flowing of air in the opposite direction, i.e., from the first chamber 276 to the second chamber 278.

The drive lever 198 includes an engaging portion 292 which engages the piston rod 280 of the air damper 270, as shown in FIG. 3.

Figure 5:
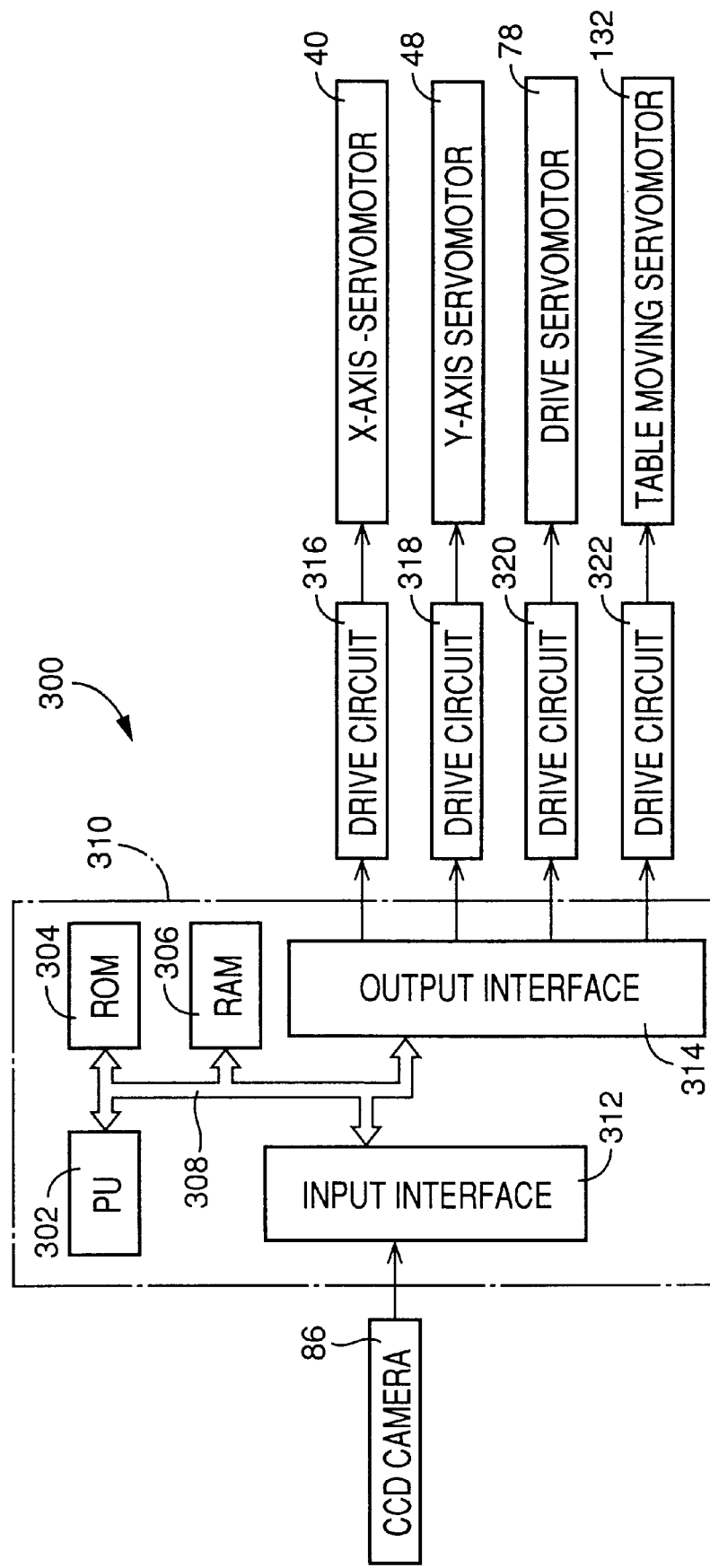
FIG. 5 is a block diagram of a relevant portion of a control device of the EC mounting system of FIG. 1.

The present EC mounting system is controlled by a control device 300 shown in FIG. 5. The control device 300 is essentially provided by a computer 310 including a processing unit (PU) 302, a read only memory (ROM) 304, a random access memory Ram 306, and a bus 308. The CCD camera 86 is connected to an input interface 312 which in turn is connected to the bus 308. The bus 308 is also connected to an output interface 314 which is connected to the X-axis servomotor 40, the Y-axis servomotor 48, the main servomotor 78, and the table moving servomotor 132 via respective drive circuits 316, 318, 320, 322. Each of the servomotors 40, 48, 78, 132 is an electric rotary motor as a drive source, and is accurately controllable with respect to its rotation angle and its rotation speed. Each servomotor 40, 48, 78, 132 may be replaced with a stepper motor. The ROM 304 stores various control programs which are needed for mounting ECs 140 on a PCB 38.

Each of the compression coil springs 190, 282 and the tension coil springs 206, 260 is employed as an elastic member as a sort of biasing member or device. This is the case with the other embodiments which will be described later.

Hereinafter, there will be described the operation of the EC mounting system constructed as described above.

When ECs 140 are mounted on a PCB 38, the main servomotor 78 is started, and the twelve rotary plates 60 are rotated independent of one another, so that the respective EC holding heads 64 are sequentially moved to each of the EC-suck position, the EC-image-take position, and the EC-mount position. The EC sucker 68 of each head 64 picks up an EC 140 from the EC-supply portion of one EC supplying unit 100 being positioned at the EC-supply position, and subsequently an image of the EC 140 held by the sucker 68 is taken by the CCD camera 86. The control device 300 calculates, based on image data representative of the taken image of the EC 140, an error of the current rotation position of the EC 140 from a reference rotation position, and controls the corresponding EC-sucker rotating device to rotate the EC sucker 68 about its own axis line to correct the calculated error. Then, the EC 140 is mounted on the PCB 38.

In the EC supplying apparatus 14, the respective EC-supply portions of the EC supplying units 100 are sequentially positioned at the EC-supply position owing to the movement of the support table 102. The control device 300 can control each unit 100 to supply only one EC 140 or successively supply two or more ECs 140, if the each unit 100 is once stopped at the EC-supply position. In either case, when the EC-supply portion of each unit 100 is stopped at the EC-supply position, the leading one of one or more ECs 140 from which the cover tape 144 has been removed has been fed to the EC-pick-up position. Hereinafter, first, there will be described the manner in which each unit 100 supplies only one EC 140. Here it is assumed that one tape feeding action of the tape feeding device 164 causes the EC carrier tape 146 to be fed by a distance equal to the regular interval of distance at which the ECs 140 are carried on the tape 146.

Figure 6:
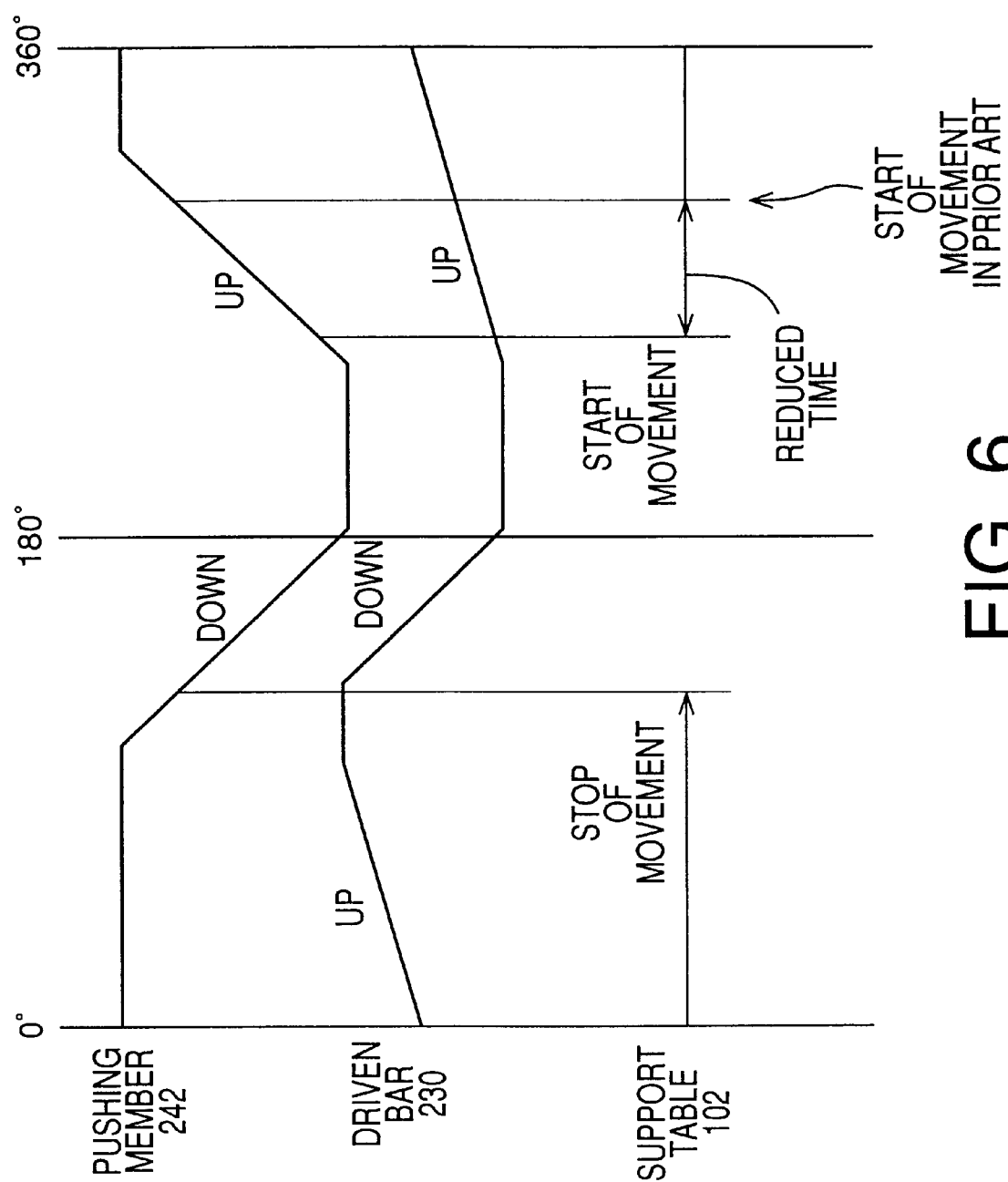
FIG. 6 is a time chart representing a timewise relationship between respective movements of a pushing member, a driven bar, and a support table that occur when the EC supplying apparatus supplies an EC.

FIG. 6 shows a time chart which represents a timewise relationship between each of the downward and upward movement of the pushing member 242, the upward, downward, and upward movement of the driven bar 230, and the horizontal movement of the support table 102, and 360 degrees corresponding to one cycle consisting of one downward movement and one upward movement of each EC sucker 68 to pick up one EC 140. In the time chart, a polygonal line representing the movement of the pushing member 242 or the driven bar 230 does not accurately indicate the speed of movement of the member 242 or 230, but generally a greater slope of the polygonal line indicates a greater speed.

As is apparent from the time chart, the downward movement of the pushing member 242 is started before the horizontal movement of the support table 102 is stopped. After the table 102 is stopped, the engaging roller 244 of the pushing member 242 contacts the driven tongue portion 239 of the driven bar 230, and pushes down the driven bar 230, as the pushing member 242 is moved downward. Consequently the drive lever 198 is pivoted backward against the biasing force of the tension coil spring 206. Thus, the cover drive plate 210 and the tape drive plate 194 are moved backward, the cover member 160 is moved backward, and the rotary plate 176 is pivoted backward. The ratchet pawl 178 is moved over some of the teeth 182 of the ratchet wheel 174. This is a tape-feeding preparing action of the tape feeding device 164. The ratchet pawl 178 does not rotate the ratchet wheel 174, and the EC carrier tape 146 is not moved backward. Only the cover member 160 is moved backward, and the leading EC 140 comes out of below the notch of the tongue portion adjacent to the opening of the cover member 160. In this state, the EC sucker 68 can pick up the leading EC 140 from the EC accommodating pocket of the tape 146. Simultaneously, the next EC 140, i.e., an EC 140 which is adjacent to the leading EC 140 positioned at the EC-pick-up position, on an upstream side of the leading EC 140 in the direction of feeding of the tape 146 is positioned below the notch of the tongue portion.

When the drive lever 198 is pivoted backward, the movable guide roller 224 is moved downward, so that the distance between the movable guide roller 224 and the take-up reel 226 increases. Thus, a predetermined length of the cover tape 144 is drawn in. In addition, when the drive lever 198 is pivoted backward, the take-up lever 258 is pivoted in the cover-tape take-up direction (i.e., clockwise in FIG. 3) by the biasing force of the tension coil spring 260. This pivotal motion is transmitted via the first one-way clutch to the take-up reel 226, so that the reel 226 is rotated. Thus, the cover tape 144 is taken up by the reel 226, while being peeled off the EC accommodating tape 142. That is, the cover tape 144 is peeled off the accommodating tape 142, concurrently with the backward movement of the cover member 160. The amount of peeling of the cover tape 144 from the accommodating tape 142 depends on the position of a slit (not shown) which is formed through the thickness of the cover member 160.

As the diameter of the cover tape 144 taken up by the take-up reel 226 increases, the angle or amount of rotation of the reel 226 needed to take up a length of the cover tape 144 corresponding to the one-pitch length of the EC carrier tape 146 decreases. The one-pitch length of the EC carrier tape 146 is equal to the regular interval of distance at which the ECs 140 are carried on the tape 146. This decreasing is accommodated by a space which is produced between the take-up lever 258 and the drive lever 198 and whose size increases as the diameter of the taken-up cover tape 144 increases. More specifically described, when more than the one-pitch length of the cover tape 144 is peeled off the accommodating tape 142, the tensile force of the cover tape 144 exceeds the biasing force of the tension coil spring 260, so that the take-up reel 226 and the take-up lever 258 are stopped. Thus, a space is produced between the take-up lever-258 and the drive lever 198. The timing at which the space is produced becomes earlier as the diameter of the taken-up cover tape 144 increases.

The EC sucker 68 is moved downward in synchronism with the downward movement of the pushing member 242 and the resultant backward movement of the cover member 160. The cam of the head elevating and lowering device provided at the EC-suck position, and the cam of the drive device 240 are so shaped as to assure that the downward movement of the EC sucker 68 and the backward movement of the cover member 160 are synchronized with each other. The EC sucker 68 is moved downward at such a timing that the sucker 68 contacts the leading EC 140 through the notch of the tongue portion that communicates with the opening of the cover member 160, before the tongue portion is moved backward from above the leading EC 140. Thus, the leading EC 140 is sucked and held by the sucker 68, while being prevented by the tongue portion from jumping out of the EC accommodating pocket of the EC carrier tape 146. After the tongue portion is moved backward away from above the leading EC 140, the sucker 68 is moved upward to pick up the leading EC 140 from the tape 146.

In the state in which the drive lever 230 is positioned at its upper stroke-end position and the drive lever 198 is positioned at the end of its forward pivotal motion before the EC sucker 68 picks up the EC 140, the piston rod 280 of the air damper 270 is held in contact with the engaging portion 292 of the drive lever 198, and the piston 274 and the piston rod 280 are positioned at their retracted position against the biasing force of the compression coil spring 282. When the driven bar 230 is moved downward and accordingly the drive lever 198 is pivoted backward, the piston 274 is advanced by the biasing force of the coil spring 282 and the piston rod 280 is moved in a direction to project from the casing 272. Thus, the piston rod 280 follows the drive lever 198.

When the piston 272 is advanced, the check valve 290 permits the air to flow from the second air chamber 278 to the first air chamber 276, so that the air in the second chamber 278 flows into the first chamber 276 via the passages 284, 286. Thus, the piston 274 is quickly advanced, and the piston rod 280 follows the drive lever 198 without any delay. In the state in which the drive lever 198 is stopped at the end of its backward pivotal motion, the piston rod 280 is held in contact with the engaging portion 292 of the drive lever 198. The position of the end of the backward pivotal motion of the drive lever 198 is defined by the lower stroke-end position of the driven bar 230.

After the leading EC 140 is picked up from the EC carrier tape 146, the pushing member 242 is moved upward. Accordingly, the drive lever 198 is pivoted forward by the biasing force of the tension coil spring 206 and the driven bar 230 is moved upward. The forward pivotal motion of the drive lever 198 causes the tape drive plate 194 to be moved forward. Consequently the rotary plate 176 is pivoted forward, and the ratchet pawl 178 is moved with the rotary plate 176 so that the ratchet wheel 174 is rotated. Thus, the sprocket 168 is rotated and the EC carrier tape 146 is fed forward. That is, the motion of the drive lever 198 is transmitted to the rotary plate 176 via the tape drive plate 194. The drive lever 198, the tape drive plate 194, the rotary plate 176, the ratchet wheel 174, and the ratchet pawl 178 cooperate with one another to convert the linear motion of the driven bar 230 into the rotation of the sprocket 168. When the drive lever 198 is pivoted forward, the cover drive plate 210 is simultaneously advanced, so that the cover member 160 is moved forward with the EC carrier tape 146. Thus, the EC 140 accommodated in the leading one of at least one EC accommodating pocket from which the cover tape 144 has been peeled, is fed to the EC-pick-up position in the state in which the EC 140 is positioned below the notch of the tongue portion and opposite end portions of the EC 140 in a direction perpendicular to the direction of feeding of the tape 146 are covered by the tongue portion, that is, in the state in which the EC 140 is prevented from jumping out of the leading EC accommodating pocket of the tape 146. Simultaneously, the movable guide roller 224 is moved upward, so that a length of the cover tape 144 between the stationary guide rollers 220, 222 and the take-up reel 226 is loosened. The amount or length of this loosening is pre-set at more than a length corresponding to the one-pitch length of the EC carrier tape 146. Therefore, the EC carrier tape 146 is fed forward without any peeling of the cover tape 144 from the EC accommodating tape 142. When the tape 146 is fed forward, the take-up lever 258 is pivoted but the take-up reel 226 is not pivoted owing to the first one-way clutch.

When the drive lever 198 is pivoted by the biasing force of the tension coil spring 206, the drive lever 198 pushes the piston rod 280 of the air damper 270 back into the casing 272 against the biasing force of the compression coil spring 282. The backward movement of the piston rod 280 and the piston 274 is permitted by the flowing of the air from the first air chamber 276 to the second air chamber 278. However, the check valve 290 provided in the piston 274 does not permit the flowing of the air from the first chamber 276 to the second chamber 278. Therefore, the air in the first chamber 276 is permitted to flow into the second chamber 278 through the passage 284 only, while the amount of flow of the air is restricted by the restrictor 288. Accordingly, the piston 274 is retracted at a speed lower than a speed at which the piston 274 is advanced. Thus, the forward pivotal motion of the drive lever 198 is resisted. The restrictor 288 is designed such that the speed of upward movement of the drive lever 230 by the forward pivotal motion of the drive lever 198 is lower than that of the pushing member 242. Therefore, the driven bar 230 is moved upward at a speed lower than the speed of upward movement of the pushing member 242, and is delayed from the upward movement of the same 242. Thus, the driven bar 230 is moved off the pushing member 242, before it reaches its upper stroke-end position.

The tape feeding action ends when the driven bar 230 reaches its upper stroke-end position. Therefore, when the pushing member 242 is moved off the driven bar 230, the tape feeding action has not ended yet. After the pushing member 242 is moved off the driven bar 230, the support table 102 starts moving so that the EC-supply portion of the current EC supplying unit 100 which has finished supplying one EC 140 is moved away from the EC-supply position and the EC-supply portion of another unit 100 which will next supply one EC 140 is moved to the EC-supply position. During this movement of the table 102, the drive lever 198 is pivoted forward by the biasing force of the tension coil spring 206, and the EC carrier tape 146 is fed forward. Thus, the tape feeding action occurs concurrently with the movement of the table 102. That is, a table-stop time during which the table 102 is stopped can be shortened, a speed at which the tape 146 is fed can be lowered, and the tape 146 can be fed while being started and stopped with less vibration.

If the table-stop time is shortened, the ratio of the table-stop time to the entire EC-supply cycle time is decreased. Therefore, in the case where the distance of one-pitch movement of the support table 102 (i.e., the regular interval of distance at which the EC supplying units 100 are attached to the table 102), and the speed and acceleration of movement of the table 102 need not be decreased as compared with those employed in a conventional EC supplying apparatus, the EC-supply cycle time can be shortened, which leads to improving the efficiency of supplying of ECs and the efficiency of mounting of ECs. In the case where the EC-supply cycle time need not be shortened, the speed, acceleration, and deceleration of movement of the table 102 can be decreased as compared with those employed in the conventional apparatus, which leads to reducing the vibration produced when the movement of the table 102 is started and stopped, thereby preventing the lowering of the accuracy of positioning of each unit 100 or the failure of supplying of each EC 140.

The tape feeding action ends before the EC-supply portion of another EC supplying unit 100 which will next supply one EC 140 reaches the EC-supply position. That is, within an EC-suck cycle time (equal to an EC-mount cycle time) at which each of the twelve EC suckers 68 reaches the EC-suck position, the feeding of each EC 140 to the EC-pick-up position is finished and the driven bar 230 is moved upward to its upper stroke-end position.

Next, there will be described the manner in which the control device 300 controls each EC supplying unit 100 to successively supply two or more ECs 140. In this case, after the EC sucker 68 picks up one EC 140 from the unit 100, the tape feeding device 164 feeds the EC carrier tape 146 at a low speed so that the next EC 140 is moved to the EC-pick-up position. Before the pushing member 242 contacts the driven bar 230 when moving downward to pick up the next EC 140, the driven bar 230 reaches its upper stroke-end position, and the tape or EC feeding action ends. Thus, like in the case where each unit 100 supplies only one EC 140, each EC sucker 68 can pick up each of the two or more ECs 140 successively supplied from each unit 100. In the case where each unit 100 successively supplies two or more ECs 140, the table 102 is not moved, and remains stopped, after one EC 140 is picked up. Once the last EC 140 is picked up, the table starts moving after the driven bar 230 is moved off the pushing member 242. Thus, the tape feeding action occurs concurrently with the movement of the table 102.

Each EC supplying unit 100 can supply one or more ECs 140 while the support table 102 is moved in only a pre-selected one of its forward and backward directions, or while the table 102 is moved in each of its forward and backward directions. Irrespective of in which direction the table is moved, the driven bar 230 is moved off the pushing member 242 while the bar 230 is moved upward, and the tape feeding action occurs concurrently with the movement of the table 102.

It emerges from the foregoing description that in the present embodiment, the sprocket 168 provides a feed member as an output member, and the output member cooperates with the rotary plate 176, the ratchet wheel 174, the ratchet pawl 178, and the stopper lever 186 to provide the tape feeding device 164 as a sort of an EC feeding device. The tension coil spring 206 provides an energy storing device, the drive lever 198 provides an engaged member, and an engaging portion of the piston rod 280 of the air damper 270 that engages the drive lever 198 provides an engaging member. The air damper 270 is a sort of damper, and provides an action retarding device.

In the air damper 270 employed in each EC supplying unit 100 shown in FIG. 1, the piston rod 280 is retracted into the casing 272 at a substantially constant speed. In contrast, in an air damper 352 employed in an EC supplying unit 350 shown in FIGS. 7 and 8, the speed of retraction of a piston rod 353 is lowered and accordingly the speed of feeding of an EC carrier tape 146 is lowered.

Figure 8:
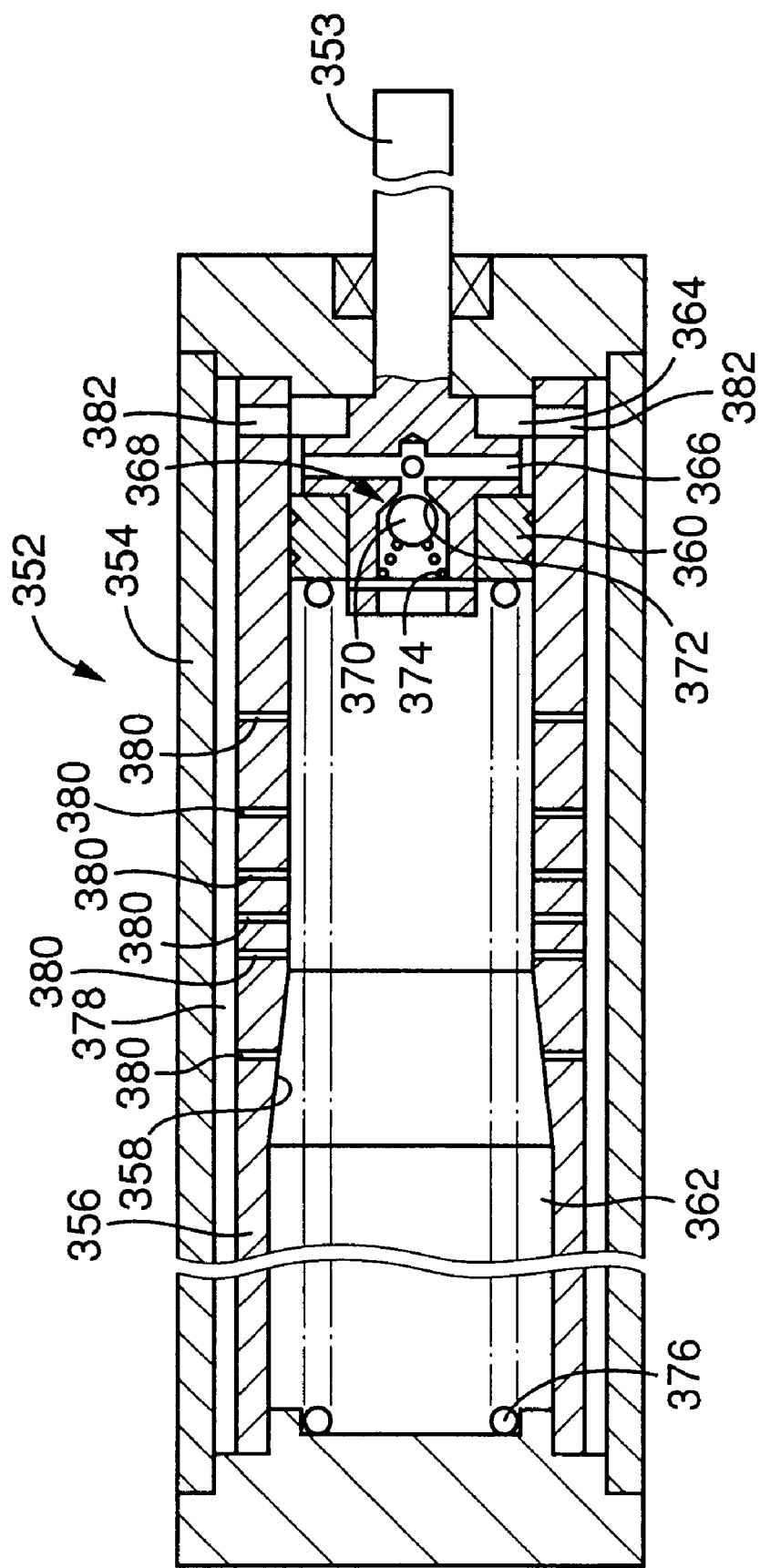
FIG. 8 is a cross-sectioned, front elevation view of an air damper employed in the EC supplying unit of FIG. 7.

As shown in FIG. 8, the air damper 352 includes a casing 354 in which a cylindrical tube 356 is fitted and fixed such that a space is left between the tube 356 and the casing 354 in a radial direction of the damper 352. A front portion of an inner circumferential surface of the tube 356 that is nearer to the piston rod 353 has a diameter smaller than that of a rear portion of the circumferential surface. The tube 356 has, between the front and rear portions of the circumferential surface, a tapered surface 358 whose diameter smoothly increases in a direction from a front portion thereof toward a rear portion thereof.

A piston 360 is fitted in the cylindrical tube 356 such that the piston 360 is slideable on the front portion of the inner circumferential surface of the tube 356. A first air chamber 362 is provided on one side of the piston 360, and is defined by a rear portion of the tube 356, and a second air chamber 364 is provided on the other side of the piston 360, and is defined by a front portion of the tube 356. The piston 360 is substantially airtightly fitted in the front portion of the tube 356. However, when the piston 360 is fitted in the rear portion of the tube 356 in rear of the tapered surface 358, a space is left between the piston 360 and the inner circumferential surface of the tube 356.

The piston 360 has a passage 366 which communicates the first and second air chambers 362, 364 with each other. A check valve 368 is provided in the passage 366. The check valve 368 includes a ball 370 as a valve member, and a spring 374 which biases the ball 370 toward a valve seat 372. The check valve 368 permits the air flow in a direction from the second chamber 364 into the first chamber 362, but inhibits the air flow in the opposite direction.

The piston rod 353 which is integral with the piston 360 projects out of the casing 354 through the second air chamber 364. A compression coil spring 376 as a sort of elastic member acting as a biasing member or device, provided in the first air chamber 362, biases the piston 360 in a direction in which the piston rod 353 projects out of the casing 354.

The first air chamber 362 communicates with an annular third air chamber 378 provided between the casing 354 and the cylindrical tube 356, via a plurality of passages 380 formed through the thickness of the tube 356. The passages 380 are distant from each other in a direction parallel to the direction of movement of the piston 360. One of the passages 380 is formed in an intermediate portion of the tube 356 that defines the tapered surface 358. The other passages 380 are formed in the front portion of the tube 356 in front of the tapered surface 358, such that the distance between each pair of adjacent passages 380 decreases in a direction from the front portion of the tube 356 toward the rear portion of the same 356, i.e., the direction of retraction of the piston 360. Passages 382 formed through the thickness of the tube 356 communicate the second and third air chambers 364, 378 with each other. Each of the passages 380 has a small diameter and defines a small area of air flow. All the passages 380 cooperate with each other to provide a restrictor. On the other hand, since each of the passages 382 has a diameter greater than that of each passage 380, the air can freely flow between the second and third chambers 364, 378 through the passages 382. Thus, the passages 382 do not function as a restrictor.

Figure 7:
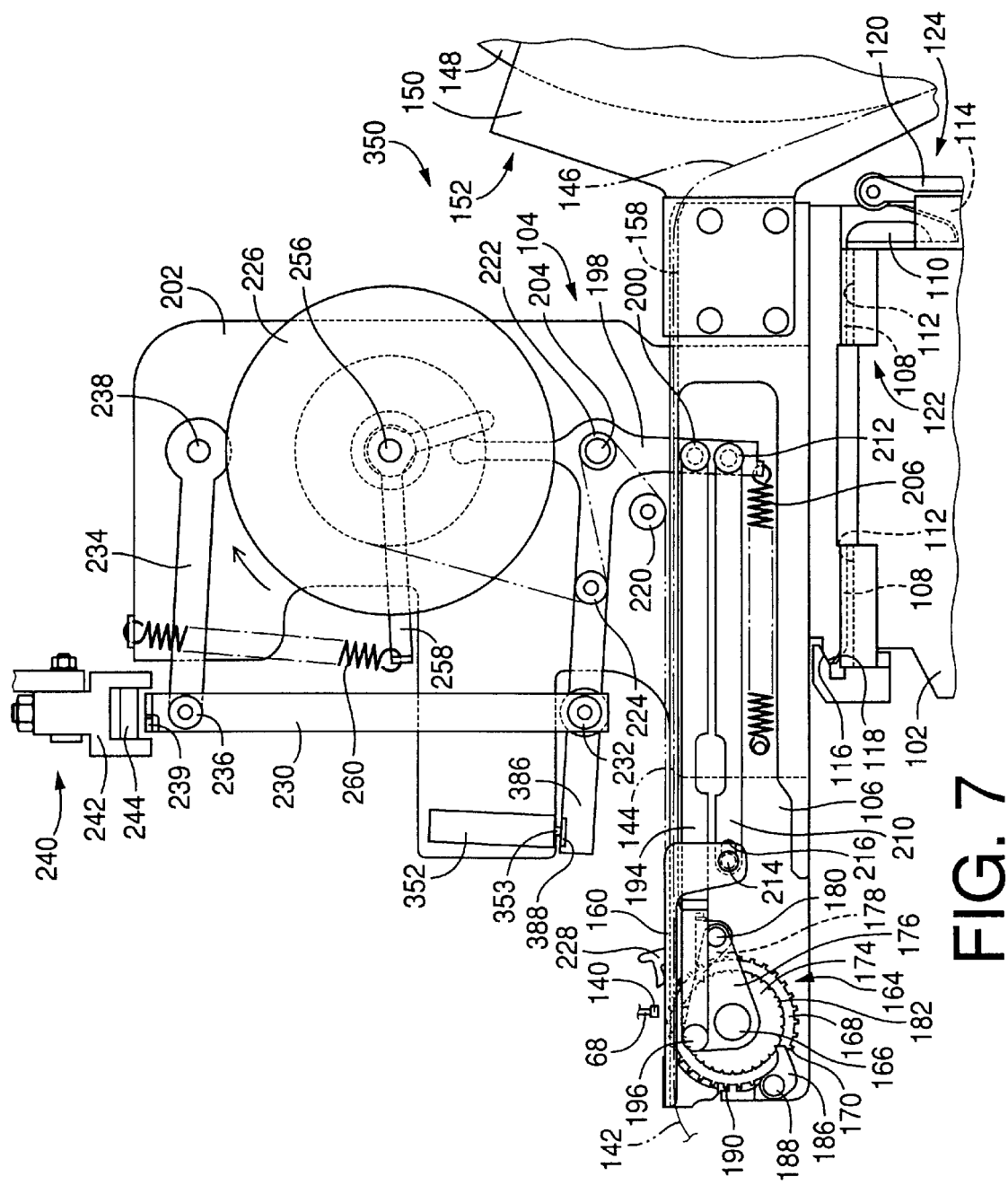
FIG. 7 is a front elevation view of another EC supplying unit as a second embodiment of the present invention.

As shown in FIG. 7, in the present EC supplying unit 350, a drive lever 198 includes an extended portion 386 which is extended from a connection portion of the lever 198 connected to a driven bar 230, in a direction away from an axis line about which the lever 198 is pivotable. The extended portion 386 includes an engaging portion 388. A bracket 202 supports the air damper 352 at a position opposed to the engaging portion 388. Thus, the piston rod 353 of the air damper 352 can be moved over an operation stroke long enough to control or reduce the speed of feeding of an EC carrier tape 146.

In the state in which the drive lever 198 is positioned at the end of its forward pivotal motion, the piston rod 353 is held in contact with the engaging portion 388 of the drive lever 198, and the piston 360 and the piston rod 353 are positioned at their retracted position against the biasing force of the compression coil spring 376. Thus, the piston 360 is positioned inside the rear portion of the cylindrical tube 356 in rear of the tapered surface 358, and a space is left between the piston 360 and the inner surface of the tube 356. When a pushing member 242 is moved downward, the driven bar 230 is pushed downward, and the drive lever 198 is pivoted backward, the piston 360 is advanced by the biasing force of the coil spring 376, and the piston rod 353 projects out of the casing 354, and follows the drive lever 198. The advancement of the piston 360 is permitted since the air in the second air chamber 364 flows into the first air chamber 362 through the check valve 368. Thus, the piston rod 353 can quickly follow the pivotal motion of the drive lever 198.

After the EC sucker 68 picks up the EC 140, the pushing member 242 is moved upward so that the driven bar 230 is moved upward and accordingly the drive lever 198 is pivoted forward. The piston 360 is moved rearward while compressing the compression coil spring 376, and the piston rod 353 is retracted into the casing 354. This retraction of the piston 360 is permitted since the air in the first air chamber 382 flows into the third air chamber 378 through the restrictor passages 380 and the air in the third air chamber 378 flows into the second air chamber 364 through the passages 382. Thus, the speed of retraction of the piston 360 is smoothly increased. Since the piston rod 353 enters the second chamber 364, the air in the second chamber 364 is accordingly compressed. Even in the state in which all the passages 380 permits the air in the first chamber 362 to flow into the third chamber 378, those passages 380 act as a sort of restrictor, so that the air pressure in the first chamber 362 becomes higher than that in the second chamber 364. Thus, the piston 360 is subjected to some resistance and accordingly the speed of retraction of the piston 360 is decreased. Consequently the speed of retraction of the piston rod 353 is decreased, and the speed of pivotal motion of the drive lever 198 is decreased. Since the driven bar 230 is delayed from the upward movement of the pushing member 242, the bar 230 is moved off the pushing member 242.

After the driven bar 230 is moved off the pushing member 242, the support table 102 starts moving. During this movement of the table 102, the drive lever 198 is pivoted forward so that the piston rod 353 is pushed into the cylindrical tube 356 and the piston 360 is retracted. As the piston 360 is retracted, the piston 360 closes the respective inner openings of the restrictor passages 380, one by one. Thus, the number of the restrictor passages 380 which permit the flowing of the air from the first air chamber 362 into the third air chamber 378 is decreased. That is, the total flow area of the passages 380 as the restrictor through which the air can flow is decreased. Since the amount of air that flows from the first chamber 362 into the third chamber 378 is decreased, the speed of retraction of the piston 360 is decreased.

The speed of retraction of the piston 360 is decreased till the piston 360 closes the most rear one of all the passages 380 other than the one passage 380 opening in the tapered surface 358. After the piston 360 closes the most rear passage 380, the piston 360 is retracted at a constant speed because the air in the first air chamber 362 flows into the third air chamber 378 through the one passage 380 opening in the tapered surface 358.

When the front end of the piston 360 passes through the front end of the tapered surface 358, a space is produced between the piston 360 and the inner surface of the cylindrical tube 356, and the air flows from the first air chamber 362 into the second air chamber 364 through this space. Therefore, the retraction of the piston 360 becomes easier, and the deceleration of the retraction of the piston 360 is decreased.

In this way, the speed of retraction of the piston 360 is once smoothly increased and then is smoothly decreased. Therefore, the speed of feeding of the EC carrier tape 146 is smoothly increased when the feeding of the tape 146 is started, and is smoothly decreased when the feeding of the tape 146 is stopped. Thus, the tape 146 is fed with the least impact. Like in each EC supplying unit 100 shown in FIG. 1, the driven bar 230 of the present EC supplying unit 350 is returned to its upper stroke-end position before the EC sucker 68 picks up the next EC 140. The diameter and total number of the restrictor passages 380 and the respective distances between the passages 380 are so selected as to apply a resistance to the retraction of the piston 360, thereby causing the driven bar 230 to be moved upward at a speed lower than the speed of upward movement of the pushing member 242, and cause the driven bar 230 to be returned to its upper stroke-end position within the EC-suck cycle time of the EC mounting device 12. The plurality of passages 380 provides the restrictor, and the casing 354, the cylindrical tube 356, and the piston 360 cooperate with one another to provide a flow-area decreasing device which decreases an area of the restrictor (i.e., the number of the passages 380) through which the air can flow, as the piston rod 353 is retracted into the casing 354 when the EC carrier tape 146 is fed forward.

The air dampers 270, 352 employed in the EC supplying units 100, 350 enjoy an advantage that the damping characteristic thereof is not so adversely influenced by air temperature. However, a liquid-type damper may be employed. A rubber bag in which a gas is enclosed may be provided in the third air chamber 378 of the air damper 352, and the first to third air chambers 362, 364, 378 may be filled with a liquid such as a working oil. This is an example of the liquid-type damper. A common liquid-type damper may be obtained by providing the passages 380 at respective positions which assure that whichever position the piston 360 may take, the piston 360 cannot close any of the passages 380, and additionally omitting the tapered surface 358. The liquid-type damper can enjoy an excellent damping characteristic, even if it may be of a small size.

Figure 9:
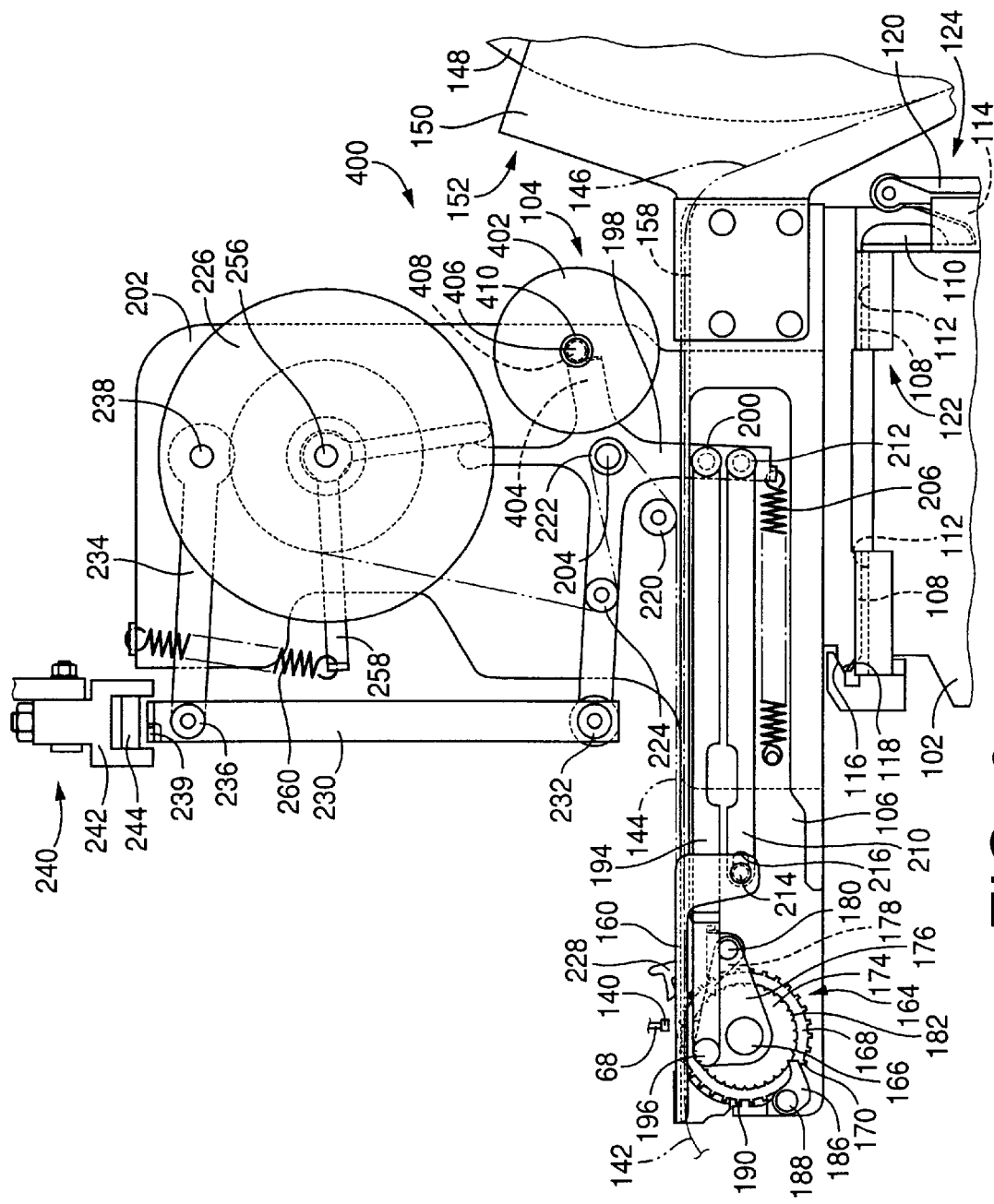
FIG. 9 is a front elevation view of another EC supplying unit as a third embodiment of the present invention.
Figure 10:
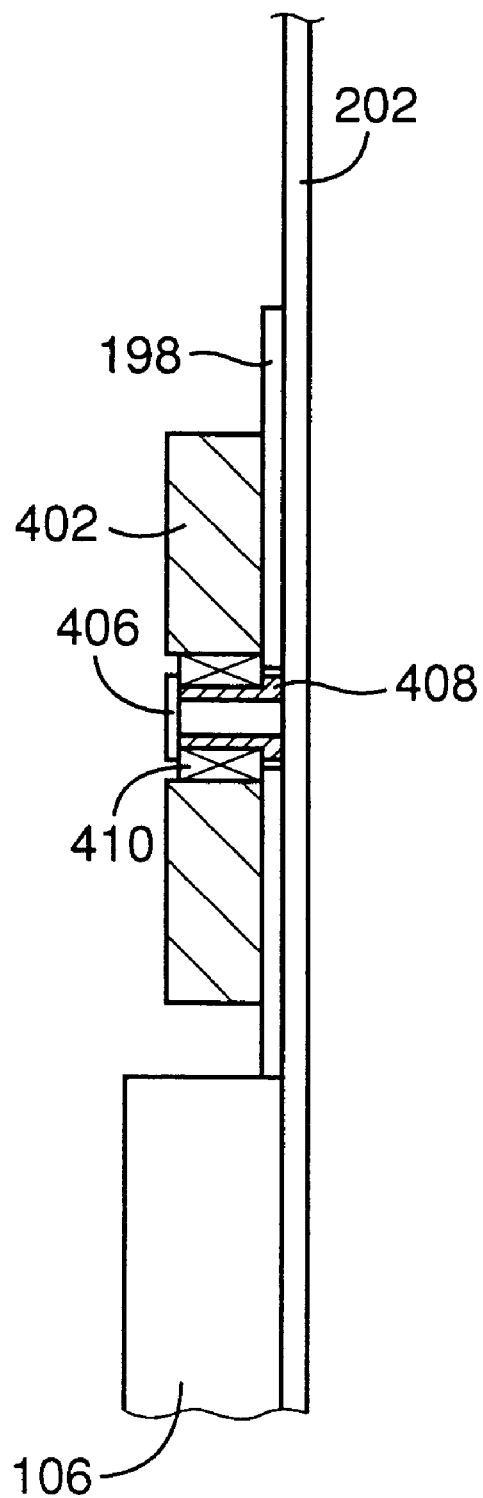
FIG. 10 is a cross-sectioned, side elevation view of a fly wheel and its peripheral member which are employed in the EC supplying unit of FIG. 9.

FIGS. 9 and 10 show another EC supplying unit 400 as another embodiment of the present invention. The present EC supplying unit 400 employs a fly wheel 402 in place of the air damper 270 shown in FIG. 3 or the air damper 352 shown in FIG. 7. The same reference numerals as used in the first embodiment shown in FIG. 3 or the second embodiment shown in FIG. 7 are used to designate the corresponding elements or parts of the third embodiment shown in FIGS. 9 and 10, and the description of those elements or parts is omitted.

In the present EC supplying unit 400, a sector gear 404 is provided integrally with a drive lever 198. The sector gear 404 has teeth along an arc whose center is located on an axis line about which the drive lever 198 is pivotable. The teeth of the sector gear 404 is meshed with a wheel 408 which is rotatably supported by a bracket 202 via an axis member 406. The pivotal motions of the drive lever 198 in its forward and backward directions are permitted by the rotations of the wheel 408 in its forward and backward directions, respectively. Since the radius of the wheel 408 is smaller than that of the sector gear 404, the rotation of the driver lever 198 is transmitted to the wheel 408 such that the speed of rotation of the wheel 408 is greater than that of the sector gear 404. The axis member 406 additionally supports the fly wheel 402 such that the fly wheel 402 is rotatable relative to the bracket 202. A one-way clutch 410 is provided between the fly wheel 402 and the wheel 408. The one-way clutch 410 transmits the rotation of the wheel 408 (i.e., the counter-clockwise rotation of the wheel 408 in FIG. 9) to the fly wheel 402, when the drive lever 198 is pivoted forward and an EC carrier tape 146 is fed forward, but does not transmit the rotation of the wheel 408 in the opposite direction (i.e., the clockwise rotation of the wheel 408 in FIG. 9).

When a pushing member 242 is moved downward and accordingly a driven lever 230 is moved downward, the drive lever 198 is pivoted backward. This is a tape-feeding preparing action. Although the wheel 408 is rotated, the rotation of the wheel 408 is not transmitted to the fly wheel 402. Accordingly, the drive lever 198 is pivoted lightly. That is, the tape-feeding preparing action is carried out without resistance. The fly wheel 402 remains still because of its moment of inertia.

After an EC sucker 68 picks up an EC 140 from the EC carrier tape 146, the pushing member 242 is moved upward, and accordingly the driven bar 230 is also moved upward. Since the drive lever 198 is pivoted forward, the wheel 408 is rotated counterclockwise in FIG. 9. The one-way clutch 410 transmits this rotation of the wheel 408 to the fly wheel 402, so that the fly wheel 402 is rotated with the wheel 408. However, since the fly wheel 402 has a great moment of inertia and is rotated at a speed greater than the speed of rotation of the wheel 408, i.e., the speed of pivotal motion of the drive lever 198, the rotation of the wheel 408 or the pivotal motion of the drive lever 198 is subjected to a great resistance. Therefore, the starting of rotation of the wheel 408 or the starting of forward pivotal motion of the drive lever 198 is delayed. Accordingly, the upward movement of the driven bar 230 is delayed from that of the pushing member 242. That is, the pushing member 242 is moved off the driven bar 230, which permits a support table 102 to start moving.

After the support table 102 starts moving, a tension coil spring 206 continues biasing the drive lever 198 to pivot the lever 198 forward. Thus, the EC carrier tape 146 is fed forward. At the beginning, the speed of rotation of the fly wheel 402 is low, but it gradually increases. Thus, the speed of feeding of the tape 146 also gradually increases. However, before the fly wheel 402 reaches its constant-speed-rotation state, i.e., when the speed of feeding of the tape 146 has not increased yet, the drive lever 198 reaches the end of its forward pivotal motion, that is, the tape-feeding preparing action ends. Even after the tape-feeding preparing action ends, the fly wheel 402 continues rotating because of its inertia. But the fly wheel 402 stops rotating before the EC sucker 68 picks up another EC 140 from the tape 146. Thus, the present EC supplying unit 400 can successively supply two or more ECs 140, without any problems.

In the present embodiment, the drive lever 198 provides a displaceable member which is displaceable with the sprocket 168 as a feed member; and the sector gear 404, the wheel 408, and the one-way clutch 410 cooperate with one another to provide a motion converting device which cooperates with the fly wheel 402 to provide an action retarding device.

The fly wheel 402 may be replaced with a different fly wheel which reaches its constant-speed-rotation state before the tape-feeding preparing action ends.

It is not essentially required, but is preferred, to stop the rotation of the fly wheel 402 after the tape-feeding preparing action ends. Even if the fly wheel 402 may rotate, the drive lever 198 can be pivoted by the downward movement of the pushing member 242. Thus, the single EC supplying unit 400 can successively supply two or more ECs 140. However, unless the rotation of the fly wheel 402 has been stopped, the starting of forward feeding of the tape 146 may not be retarded after the second EC 140 following the first EC 140 is supplied from the unit 400. In addition, after the last EC 140 is supplied from the unit 400, the tape 146 may not be fed forward concurrently with the movement of the support table 102.

Figure 11:
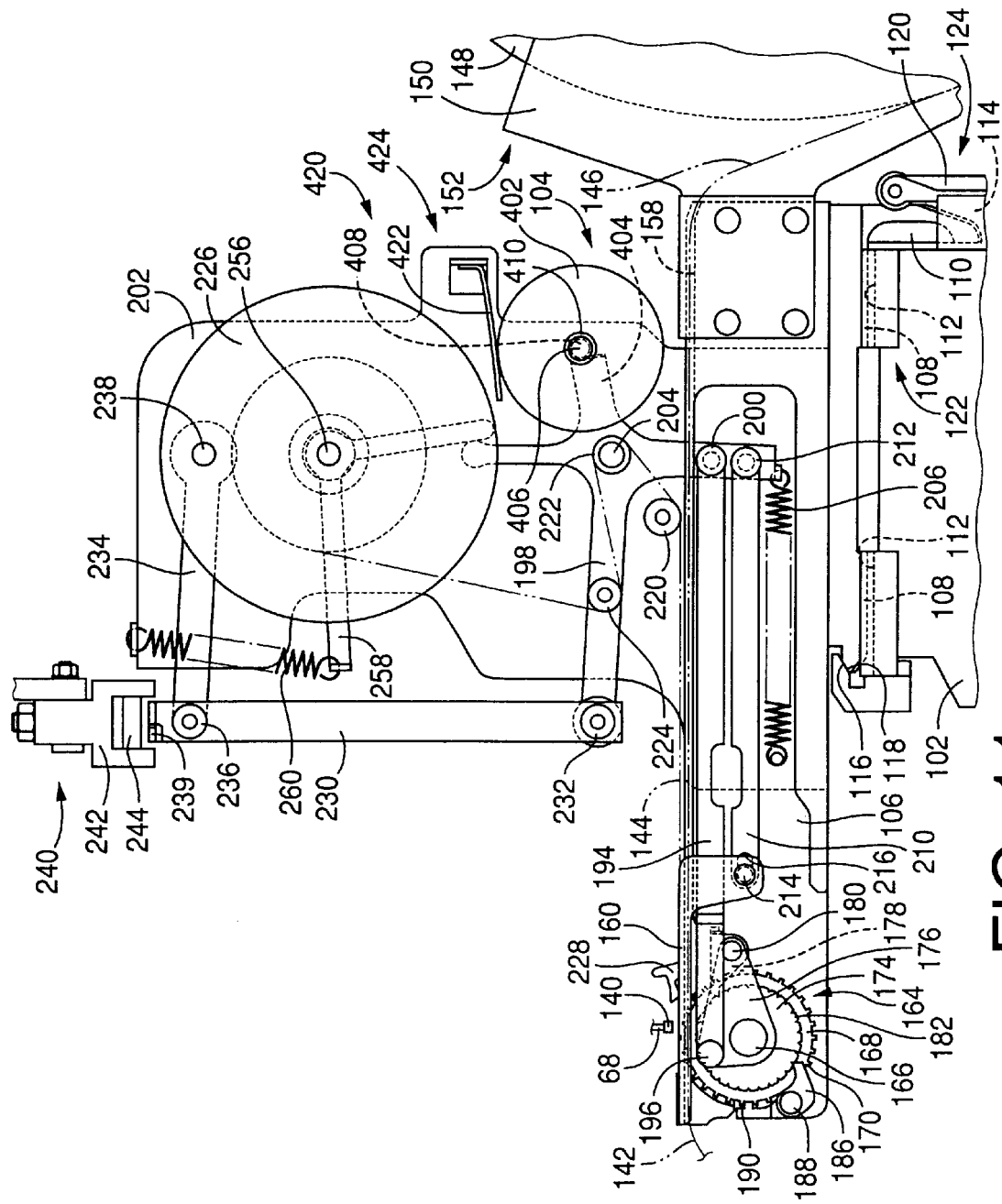
FIG. 11 is a front elevation view of another EC supplying unit as a fourth embodiment of the present invention.

Another EC supplying unit 420 shown in FIG. 11 is free from the above-identified problem. The present EC supplying unit 420 includes a rotation resisting device 424 which includes a leaf spring 422 as a rotation resisting member that is fixed to a bracket 202. The leaf spring 422 is an elastic member, and is held in elastically forced contact with an outer circumferential surface of a fly wheel 402. Thus, the leaf spring 422 resists the rotation of the fly wheel 402, and can stop the rotation of the same 402 before an EC sucker 68 picks up, from an EC carrier tape 146, another EC 140 after picking up one EC 140.

Figure 12:
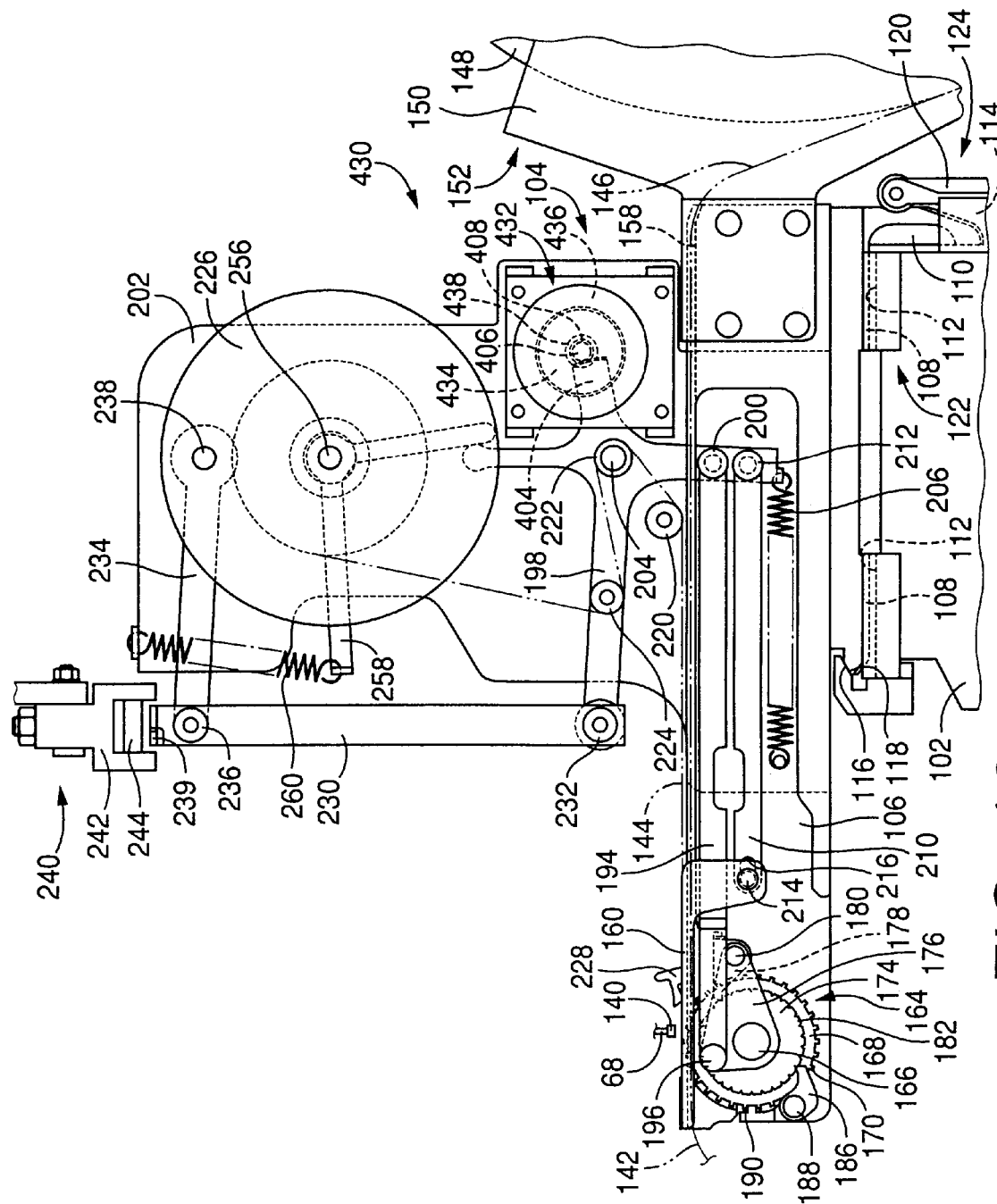
FIG. 12 is a front elevation view of another EC supplying unit as a fifth embodiment of the present invention.

FIG. 12 shows another EC supplying unit 430 as another embodiment of the present invention. The present EC supplying unit 430 employs, as the action retarding device, a dynamo 432 in place of the fly wheel 402 shown in FIG. 9. The dynamo 432 includes a rotor 434 and a stator 436, and is fixed to a bracket 202. Like in the EC supplying unit 400 shown in FIG. 9, the bracket 202 supports a wheel 408 via an axis member 406 such that the wheel 408 is rotatable relative to the bracket 202 and is meshed with a sector gear 404 which is integral with a drive lever 198. The rotor 434 is concentric with the wheel 408, and is rotatable relative to the bracket 202. A one-way clutch 438 identical with the one-way clutch 438 is provided between the wheel 408 and the rotor 434.

In the present EC supplying unit 430, when the driven bar 230 is moved downward, the drive lever 198 is pivoted backward. This is a tape-feeding preparing action. During this action, the rotation of the wheel 408 resulting from the rotation of the sector gear 404 is not transmitted to the rotor 434, that is, the rotor 434 remains still, and accordingly the drive lever 198 is pivoted lightly. When the drive lever 198 is pivoted forward, the driven bar 230 is moved upward, and the EC carrier tape 146 is fed forward, the rotation of the wheel 408 resulting from the rotation of the sector gear 404 is transmitted to the rotor 434, that is, the dynamo 432 generates an electric power, and accordingly the forward pivotal motion of the drive lever 198 is subjected to some resistance. Therefore, the upward movement of the driven bar 230 is delayed from that of the pushing member 242. That is, the pushing member 242 is moved off the driven bar 230, which permits a support table 102 to start moving. The electric power generated by the rotation of the rotor 434 is converted by a resistor into heat which eventually is radiated to the atmosphere.

Figure 13:
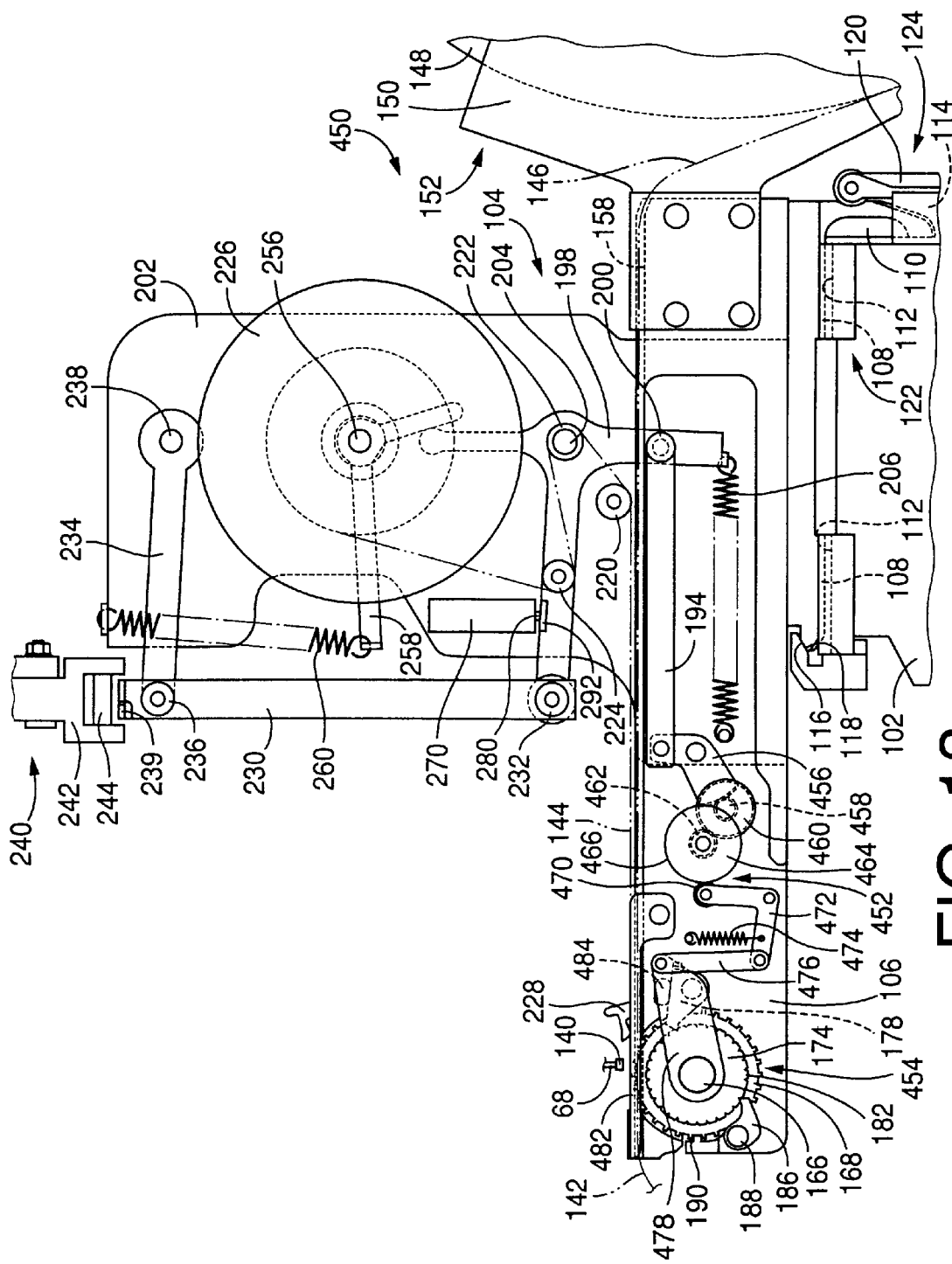
FIG. 13 is a front elevation view of another EC supplying unit as a sixth embodiment of the present invention.

FIG. 13 shows another EC supplying unit 450 as another embodiment of the present invention. The present EC supplying unit 450 employs a cam mechanism 452 in addition to the air damper 270 shown in FIG. 3. The cam mechanism 452 smoothly increases from zero, and smoothly decreases to zero, the speed of the rotation of a sprocket 168, as an element of a tape feeding device 454, in its forward direction corresponding to the forward feeding of an EC carrier tape 146, and eventually the speed of feeding of the tape 146. The same reference numerals as used in the first embodiment shown in FIG. 3 are used to designate the corresponding elements or parts of the sixth embodiment shown in FIG. 13, and the description of those elements or parts is omitted.

In the present EC supplying unit 450, a sector gear 456 which is pivotally attached to a support member 106 is pivotally connected to a tape drive plate 194, and is meshed with a first wheel 458 which is rotatably attached to the support member 106. A second wheel 460 which is integral with the first wheel 458 is meshed with a third wheel 462 which is integral with a plate cam 464 as a sort of rotary cam.

A roller 470 as a cam follower is biased to contact a cam surface 466 of the plate cam 464. The plate cam 464 and the roller 470 cooperate with each other to provide the cam mechanism 452. The roller 470 is rotatably attached to a lever 472 which is pivotally attached to the support member 106. A tension coil spring 474 as a sort of elastic member acting as a biasing member or device that is provided between the lever 472 and the support member 106, biases the lever 472 in a direction in which the roller 470 follows the cam surface 466. One end portion of a link 476 is pivotally connected to the lever 472, and the other end portion of the link 476 is pivotally connected to a rotary plate 478.

When the drive lever 198 is pivoted and accordingly the tape drive plate 194 is moved, the plate cam 464 is rotated and accordingly the rotary plate 478 is pivoted. FIG. 13 shows the state in which an EC 140 is positioned at an EC-pick-up position by the feeding of the EC carrier tape 146. The tape-feeding preparing action includes rotating the plate cam 464 backward (i.e., clockwise in FIG. 13) from the state shown in FIG. 13. The tape feeding action includes rotating the plate cam 464 forward (i.e., counterclockwise in FIG. 13) and returning the same 464 to a position where the tape-feeding preparing action is started. Thus, the plate cam 464 is rotated forward and backward reciprocatively, and the cam surface 466 is provided by only a portion of the outer circumferential surface of the cam 464.

In FIG. 13, the plate cam 464 which has a circular shape is shown for only easier illustration. In fact, the distance of the cam surface 466 from the axis line about which the cam 464 rotates, changes. The cam surface 466 is so shaped that in the state, shown in FIG. 13, in which one EC 140 has been positioned at the EC-pick-up position but the tape-feeding preparing action has not started yet, the distance between the roller 470 engaged with the cam surface 466 and the axis line of rotation of the plate cam 464 takes the smallest value and that as the cam 464 is rotated backward from the above state, the distance between the roller 470 and the axis line gradually increases and the rotary plate 478 is pivoted backward (i.e., clockwise in FIG. 13). On the other hand, as the cam 464 is rotated forward from the end of its backward rotation, the distance of the roller 470 engaged with the cam surface 466 from the axis line gradually decreases, and the rotary plate 478 is pivoted forward (i.e., counterclockwise in FIG. 13).

The cam surface 466 has opposite end portions in a circumferential direction of the rotary cam 464. A downstream-side one of the two end portions of the cam surface 466 in the direction in which the cam 464 is rotated forward provides an accelerating surface which applies, to the roller 470, a motion which smoothly accelerates the roller 470 from the speed of zero. The other, upstream-side end portion of the cam surface 466 in the same direction provides a decelerating surface which applies, to the roller 470, a motion which smoothly decelerates the roller 470 to the speed of zero. The accelerating and decelerating surfaces are so formed as to define as small as possible derivatives of the acceleration and deceleration of the movement of the EC carrier tape 146.

The present EC supplying unit 450 includes a cover member 482 which is detachably attached to the support member 106 such that the cover member 482 is not movable relative to the support member 106 in the direction of feeding of the EC carrier tape 146. The end or limit of the forward pivotal motion of the drive lever 198 is defined by the butting of a ratchet pawl 178 against a stopper 484 fixed to the support member 106.

When the driven bar 230 is pushed downward, the drive lever 198 is pivoted backward, and the tape drive plate 194 is moved backward, the plate cam 464 is rotated backward via the sector gear 456 and the first to third wheels 458, 460, 462, and the rotary plate 478 is pivoted backward, so that the ratchet pawl 178 is moved over some teeth 182 of a ratchet wheel 174. This is the tape-feeding preparing action. When the pushing member 242 is moved upward and the drive lever 198 is pivoted forward, the plate cam 464 is rotated forward and the rotary plate 478 is pivoted forward, so that the ratchet wheel 174 and the sprocket 168 are rotated and the EC carrier tape 146 is fed forward. The forward feeding of the tape 146 is smoothly accelerated from the speed of zero and is smoothly decelerated to the speed of zero. Accordingly, the feeding of the tape 146 can be started and stopped with the least possible vibration. Since the cover member 482 is immovable relative to the support member 106 in the tape-feed direction, the opening of the EC accommodating pocket from which a cover tape 144 has been peeled is not covered by the movable member 482 when the EC carrier tape 146 is fed forward. However, since the vibration is minimized, the EC 140 is reliably fed to the EC-pick-up position without jumping out of the EC accommodating pocket. In addition, like in the embodiment shown in FIGS. 1 to 6, the air damper 270 applies a resistance to the forward pivotal motion of the drive lever 198, so that the upward movement of the driven bar 230 is delayed from that of the pushing member 242, and, after the pushing member 242 is moved off the driven bar 230, the support table 102 is moved, so that the tape feeding action occurs concurrently with the movement of the table 102.

The opposite end portions of the cam surface 466 which function as the accelerating and decelerating surfaces when the tape feeding action occurs, function as a decelerating and an accelerating surface, respectively, when the tape-feeding preparing action occurs. Therefore, the backward pivotal motion of the rotary plate 478 is started and stopped with the least possible impact. Thus, the vibration of the EC supplying unit 450 as a whole is minimized.

In the present embodiment, the sprocket 168, the ratchet wheel 174, the rotary plate 478, the ratchet pawl 178, and a stopper lever 186 cooperate with one another to provide the tape feeding device 454.

In each of the first to sixth EC supplying units 100, 350, 400, 420, 430, 450, the tape feeding device 164, 454 performs both the tape feeding action and the tape-feeding preparing action. In contrast, a tape feeding device 502 of another EC supplying unit 500 shown in FIGS. 14 and performs a tape feeding action only. The same reference numerals as used in the first embodiment shown in FIG. 3 are used to designate the corresponding elements or parts of the seventh embodiment shown in FIGS. 14 and 15, and the description of those elements or parts is omitted.

The tape feeding device 502 includes a sprocket 168, a ratchet wheel 174 integral with the sprocket 168, and a stopper lever 186. A support member 106 supports a second ratchet wheel 510 via an axis member 512, at a position distant from the first ratchet wheel 174 in a direction opposite to a tape-feed direction, such that the second ratchet wheel 510 is rotatable forward and backward. A second stopper lever 514 which is pivotally attached to the support member 106 is engaged with one of teeth of the second ratchet wheel 510. A tension coil spring 516 biases the second stopper lever 514, such that the stopper lever 514 permits the forward (i.e., counterclockwise in FIG. 14) rotation of the ratchet wheel 510 because the lever 514 moves over the teeth of the wheel 510, but inhibits the backward (i.e., clockwise in FIG. 14) rotation of the wheel 510 because the lever 514 engages one tooth of the wheel 510.

Figure 15:
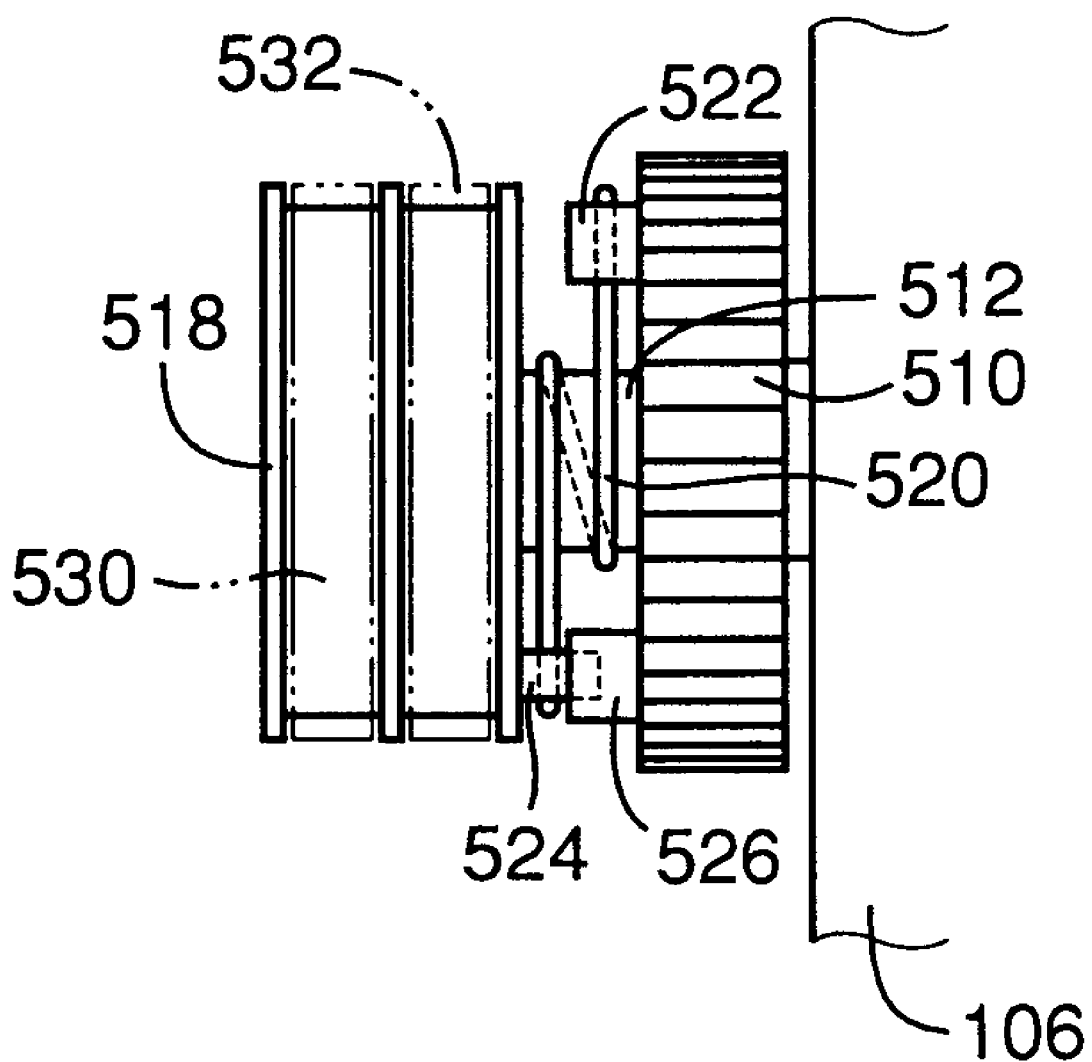
FIG. 15 is a side elevation view of a timing pulley and a ratchet wheel which are employed in the EC supplying unit of FIG. 14.

The axis member 512 supports, in addition to the second ratchet wheel 510, a timing pulley 518 such that the timing pulley 518 is rotatable relative to the ratchet wheel 510. A spring member 520 as an elastic member acting as a sort of biasing member or device is provided between the timing pulley 518 and the ratchet wheel 510, as shown in FIG. 15. The spring member 520 is wound around the axis member 512 such that one end portion of the spring member 520 is engaged with a first engaging portion 522 of the ratchet wheel 510 and the other end portion of the same 520 is engaged with a second engaging portion 524 of the timing pulley 518. More specifically described, the opposite end portions of the spring member 520 are engaged with the first and second engaging portions 522, 524 in such a manner that when the ratchet wheel 510 is rotated forward relative to the timing pulley, the two end portions approach each other. The limit of rotation of the timing pulley 518 relative to the ratchet wheel 510 based on the biasing force of the spring member 520 is defined by the butting of the second engaging portion 524 of the timing pulley 518 against a stopper 526 fixed to the ratchet wheel 510.

As shown in FIG. 15, the timing pulley 518 circulates two timing or cog belts 530, 532 a first one 530 of which is wound on a second timing pulley 534 integral with the first ratchet wheel 174. The diameter of the second timing pulley 534 is equal to that of the first one 518.

The second timing belt 532 is wound on a third timing pulley 536 whose diameter is smaller than that of the first one 518. The third pulley 536 is rotatably attached to the support member 106, and a first wheel 538 integral with the third pulley 536 is meshed with a second wheel 540. Since the diameter of the second wheel 540 is smaller than that of the first wheel 538, the speed of rotation of the second wheel 540 is greater than that of the first timing pulley 538. The second wheel 540 is-rotatably supported by a second axis member 542 fixed to the support member 106, which additionally supports a fly wheel 544 such that the fly wheel 544 is rotatable relative to the support member 106. A second one-way clutch 546 is provided between the second wheel 540 and the fly wheel 544. The second one-way clutch 546 transmits, to the fly wheel 544, the rotation of the second wheel 540 (i.e., the clockwise rotation of the wheel 540 in FIG. 14) when the first timing pulley 518 is rotated forward (i.e., counterclockwise in FIG. 14) and the EC carrier tape 146 is fed forward, but does not transmit the rotation of the second wheel 540 in the opposite direction (i.e., the counterclockwise rotation of the wheel 540 in FIG. 14).

The driven bar 230 supports a feed pin 556 via a bracket 554, such that the feed pin 556 is pivotable about a horizontal axis line. A spring member 558 as an elastic member acting as a sort of biasing member or device biases the feed pin 556 in a direction in which the pawl 556 engages the teeth of the second ratchet wheel 510. The limit of pivotal motion of the feed pin 556 by the biasing force of the spring member 558 is defined by the butting of the pawl 556 against a stopper 560 fixed to the bracket 554. The feed pin 556 engages the teeth of the ratchet wheel 510 in a direction tangent to the locus of rotation of the teeth.

The present EC supplying unit 500 includes a cover member 562 which is detachably attached to the support member 106 such that the cover member 562 is not movable in the tape-feed direction.

In the present EC supplying unit 500, the tape feeding device 502 does not perform a tape-feeding preparing action, and does not move the cover member 562 in the tape-feed direction. Therefore, the cover tape 144 should be peeled off and taken up while the tape feeding action is performed by the take feeding device 502. To this end, the cover tape 144 peeled off the EC accommodating tape 142 is wound on only a single stationary guide roller 563 which is rotatably attached to the bracket 202, and then is taken by a take-up reel 226 at a position on a lower side of the same 226. Thus, the cover tape 144 is taken up by the take-up reel 226 being rotated in a direction opposite to the direction in which the take-up reel 226 employed in the first embodiment shown in FIG. 3 is rotated to take up the cover tape 144. A take-up lever 564 and a tension coil spring 566 which biases the take-up lever 564 are designed such that when the drive lever 198 is pivoted, the take-up lever 564 is pivoted in a direction opposite to the direction in which the take-up lever 258 employed in the first embodiment shown in FIG. 3 is pivoted when the drive lever 198 is pivoted. When the drive lever 198 is pivoted backward (i.e., counterclockwise in FIG. 14) against the biasing force of a second tension coil spring 568, the drive lever 198 engages the take-up lever 564 and pivots the lever 564 in a direction opposite to a cover-tape take-up direction against the biasing force of the first tension coil spring 566. On the other hand, when the drive lever 198 is pivoted forward (i.e., clockwise in FIG. 14) owing to the biasing force of the second tension coil spring 568, the take-up lever 564 is pivoted owing to the biasing force of the first tension coil spring 566, so that the take-up reel 226 takes up the cover tape 144. Like in the first embodiment shown in FIG. 3, one one-way clutch is provided between the take-up reel 226 and the take-up lever 564, and another one-way clutch is provided between the take-up reel 226 and an axis member 256.

When the pushing member 242 is moved downward and accordingly the driven bar 230 is moved downward, the feed pin 556 is also moved downward and is engaged with one of the teeth of the ratchet wheel 510. When the pushing member 242 is further lowered, the feed pin 556 rotates the ratchet wheel 510 forward, while the pin 556 is pivoted against the biasing force of the spring member 558.

The timing pulley 518 is connected to the fly wheel 544 via the timing pulley 536 and the wheels 538, 540, and the fly wheel 544 has a great moment of inertia. In addition, the rotation of the timing pulley 518 is transmitted to the fly wheel 544 so that the speed of rotation of the wheel 544 is greater than that of the pulley 518. Therefore, a great resistance is exerted to the rotation of the fly wheel 544. Thus, the commencement of the forward rotation of the timing pulley 518 is delayed and accordingly the commencement of the forward rotation of the sprocket 168 is delayed. Consequently the ratchet wheel 510 is rotated relative to the timing pulley 518, while the wheel 510 elastically deforms the spring member 520. Thus, the spring member 520 stores the energy transmitted from the pushing member 242. In addition, the stopper 526 is moved off the engaging portion 524. Although the take-up lever 564 is pivoted against the biasing force of the tension coil spring 566, the take-up reel 226 is not rotated.

After the pushing member 242 is lowered to its lower stroke-end position, the member 242 is elevated and accordingly the driven bar 230 is elevated, so that the feed pin 556 is moved off the teeth of the ratchet wheel 510. The present EC supplying unit 500 is different from the above-described EC supplying units, in that the driven bar 230 faithfully follows the pushing member 242, that is, the upward and downward movements of the driven bar 230 accurately correspond to those of the pushing member 242. In each of the preceding units 100, 350, 400, 420, 430, 450, the driven bar 230 and the drive lever 198 are displaced with the sprocket 168 as the feed member, and the speed of the backward movement of the driven bar 230 is lowered to separate the pushing member 242 from the driven bar 230 before the tape feeding action ends. In contrast, in the present EC supplying unit 500, the driven bar 230 and the drive lever 198 are not moved with the sprocket 168, and the speed of the forward rotation of the sprocket 168 is lowered to achieve the above-indicated separation. Therefore, the driven bar 230 is elevated while following the pushing member 242. Like in each of the preceding embodiments, the movement of the support table 102 is started after the pushing member 242 is separated from the driven bar 230 of the unit 500. The pushing member 242 is elevated at a speed higher than that employed in each of the preceding embodiments, and the driven bar 230 is more quickly returned to its upper stroke-end position. Thus, the pushing member 242 is quickly moved off the driven bar 230, and the support table 102 is allowed to start moving. Therefore, the unit-stop period during which the unit 500 is stopped at the EC-supply position can be decreased. The pushing member 242 is lowered and elevated at respective timings which assure that the EC carrier tape 146 is fed forward after the EC sucker 68 picks up each EC 140 from the corresponding EC accommodating pocket of the tape 146.

The timing pulley 518 is rotated relative to the ratchet wheel 510 by the biasing force of the spring member 520 which has stored the energy. Although the commencement of the rotation of the timing pulley 518 is delayed by the fly wheel 544, the pulley 518 starts rotating before long, so that the timing pulley 534 rotates and the sprocket 168 and the ratchet wheel 510 rotate. Thus, the EC carrier tape 146 is fed forward. The stopper lever 186 moves over the teeth of the ratchet wheel 174, thereby permitting the rotation of the wheel 174 and the sprocket 168. After one tape feeding action ends, the stopper lever 186 engages one of the teeth 182 of the wheel 174, thereby positioning the sprocket 168 and preventing the backward rotation of the same 168.

After the pushing member 242 is moved off the driven bar 230, the movement of the support table 102 is started. Thus, the EC carrier tape 146 is fed forward while the table 102 is moved. Just after the rotation of the fly wheel 544 is started, the speed of the rotation of the wheel 544 is low. However, then the rotation speed increases little by little. Therefore, the speed of feeding of the tape 146 smoothly increases. However, before the fly wheel 544 reaches its constant-speed-rotation state, that is, before the speed of feeding of the tape 146 has increased up, the timing pulley 518 is rotated to the extent that the engaging portion 524 butts against the stopper 526 fixed to the ratchet wheel 510, and one tape feeding action ends. Even after one tape feeding action ends and the wheel 540 stops, the fly wheel 544 continues rotating because of its inertia. This rotation of the wheel 544 is permitted by the one-way clutch 546 provided between the wheel 540 and the fly wheel 544. However, the fly wheel 544 stops before the EC sucker 68 picks up the next EC 140. Thus, the single EC supplying unit 500 can successively supply two or more ECs 140, without any problems.

When the EC carrier tape 146 is fed forward, the cover tape 144 is peeled off the EC accommodating tape 142 and is taken up by the take-up reel 226. The drive lever 198 is pivoted at a high speed by the upward movement of the driven bar 230, whereas the starting of the forward feeding of the tape 146 is delayed. Therefore, the take-up lever 564 is not pivoted immediately and accordingly the drive lever 198 is moved off the take-up lever 564. The take-up lever 564 is then pivoted by an amount corresponding to the amount of feeding of the tape 146, so that the take-up reel 226 takes up a corresponding amount of the cover tape 144 peeled off the EC accommodating tape 142.

In the present embodiment, the sprocket 168, the ratchet wheel 174, and the stopper lever 186 cooperate with one another to provide the tape feeding device 502; and the spring member 520 and the stopper 526 cooperate with each other to provide the energy storing device. The energy stored by the energy storing device is transmitted to the sprocket 168 via the timing belt 530 and the timing pulley 534. The ratchet wheel 174 cooperates with the stopper lever 186 to position the sprocket 168 and prevent the backward rotation of the same 168. Thus, the tape feeding device 502 performs only the tape feeding action by utilizing the one-direction rotation of the sprocket 168 and the ratchet wheel 174. The one-direction rotation of the sprocket 168 and the wheel 174 means the rotation of the same 168, 174 in a tape-feed direction, i.e., an EC-feed direction. The timing pulley 518 provides the displaceable member which is displaceable with the sprocket 168 as the feed member; the timing belt 532, the timing pulley 536, the wheels 538, 540, and the one-way clutch 546 cooperate with one another to provide the motion converting device which, in turn, cooperates with the fly wheel 544 to provide the action retarding device.

Figure 14:
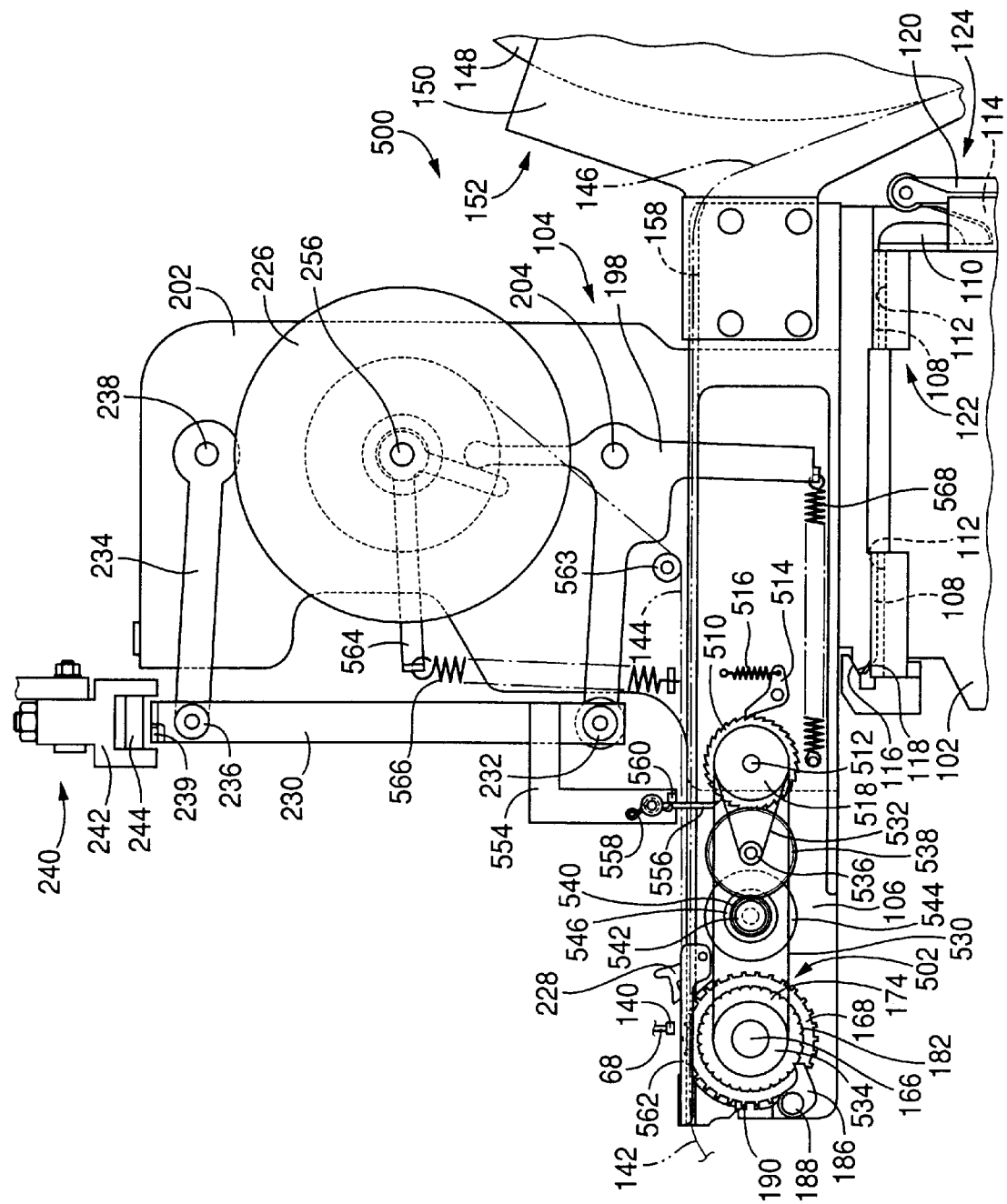
FIG. 14 is a front elevation view of another EC supplying unit as a seventh embodiment of the present invention.

In the seventh embodiment shown in FIGS. 14 and 15, the feed pin 556 is supported by the driven bar 230 as the driven member, and is driven by the pushing member 242 as the drive member via the driven bar 230. However, the feed pin 556 may be directly supported by the pushing member 242. In this modified form, the feed pin 556 provides the drive member, and the ratchet wheel 510 provides the driven member. After the feed pin 556 is moved off the ratchet wheel 510, the support table 102 is moved to move a modified EC supplying unit 500'. In addition, in the case where ECs 140 are fed in the form of an EC carrier tape 146 and a cover tape 144 peeled off an EC accommodating tape 142 is taken up by a take-up reel 226, like in each of the preceding embodiments, the modified unit 500' may be provided with a driven bar 230, a drive lever 198, a take-up lever 564, and tension coil springs 566, 568. The driven bar 230 is lowered and elevated by the lowering and elevating of the pushing member 242, and functions as a drive member which drives the take-up reel 226. Thus, the driven bar 230 cooperates with the tension coil springs 566, 568, the drive bar 198, and the take-up lever 564 to provide a take-up-reel driving device. The driven bar 230 is designed such that when the feed pin 556 is moved off the ratchet wheel 510, the pushing member 242 is moved off the driven bar 230 and such that after the pushing member 242 is moved off the driven bar 230, the modified unit 500' is moved. The description of this paragraph may apply to the eighth embodiment which will be described below by reference to FIGS. 16, 17, and 18.

In the seventh embodiment shown in FIGS. 14 and 15, the EC supplying unit 500' may employ a rotation resisting device which is identical with the rotation resisting device 424 shown in FIG. 11 and which includes a leaf spring to resist the rotation of the fly wheel 544.

Figure 16:
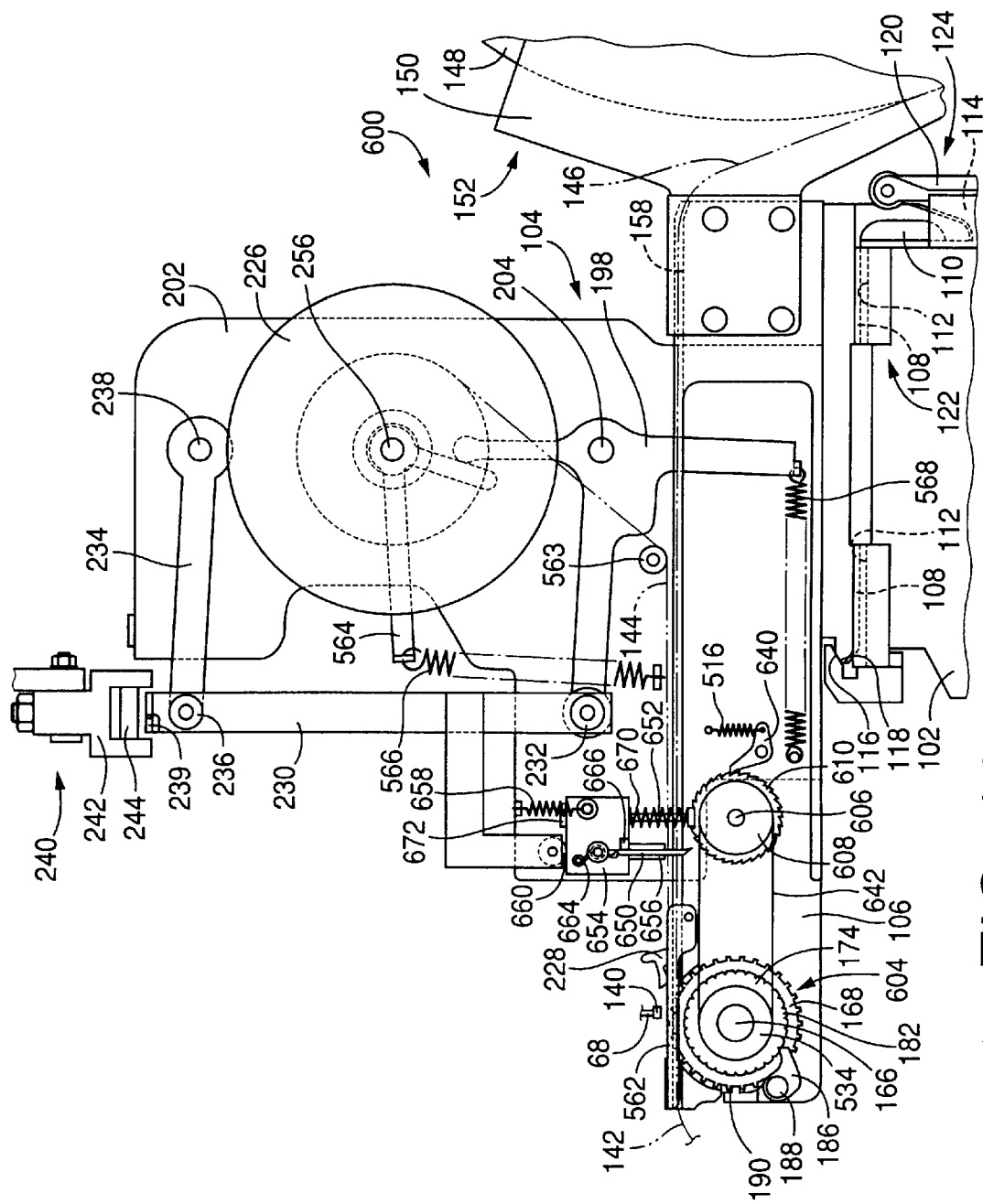
FIG. 16 is a front elevation view of another EC supplying unit as an eighth embodiment of the present invention.
Figure 17:
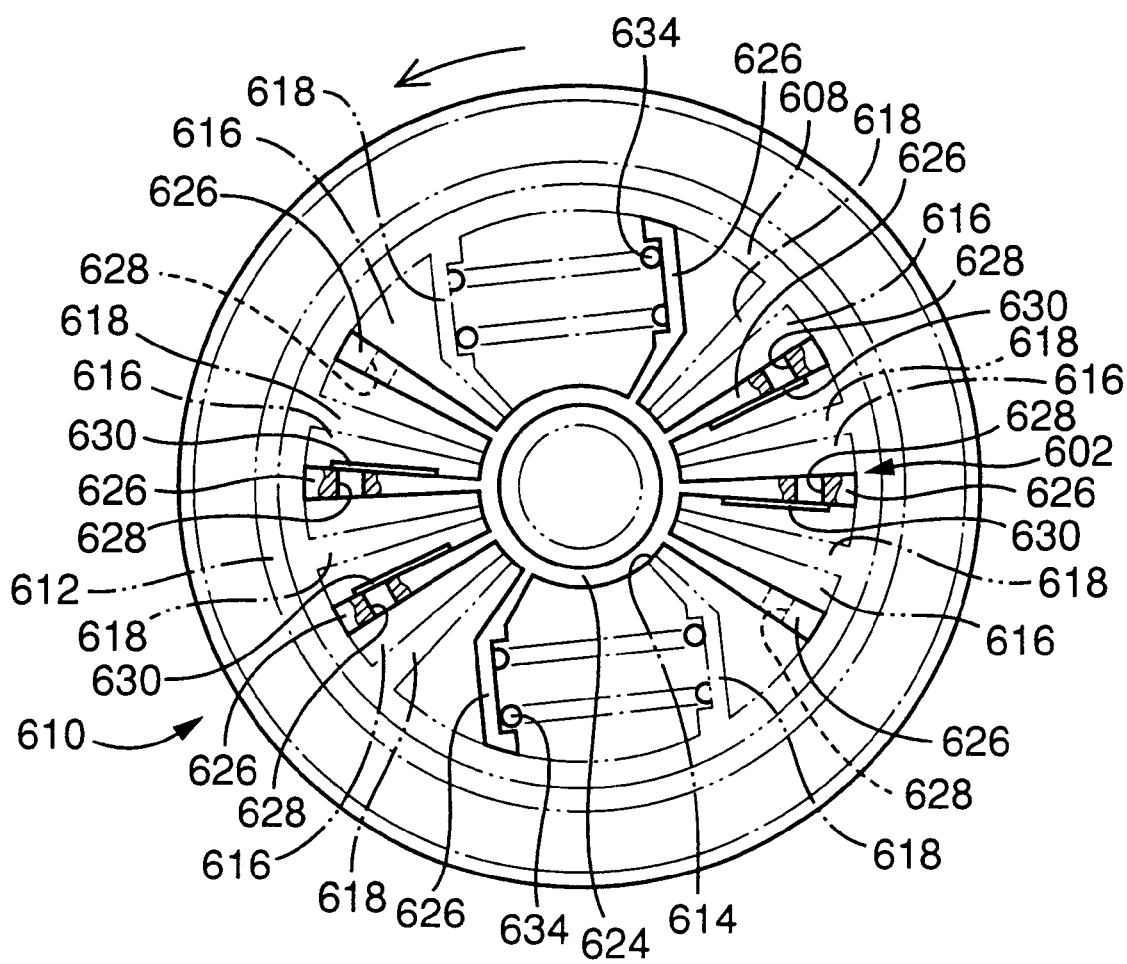
FIG. 17 is a front elevation view of a timing pulley and a ratchet wheel which are employed in the EC supplying unit of FIG. 16.
Figure 18:
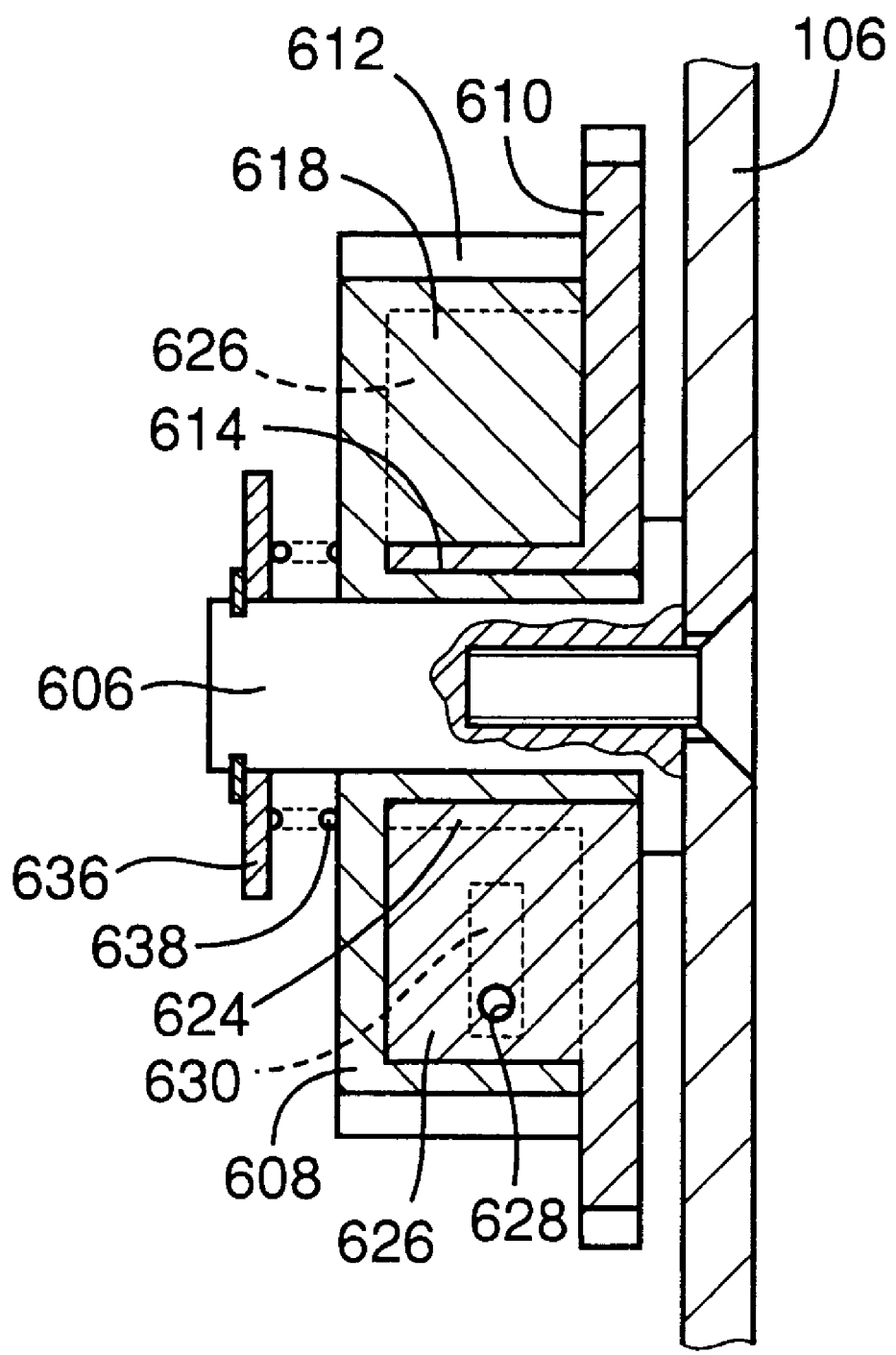
FIG. 18 is a cross-sectioned, side elevation view of the timing pulley and the ratchet wheel of FIG. 17.

FIGS. 16, 17, and 18 shows another EC supplying unit 600 which is obtained by essentially replacing the fly wheel 544 of the EC supplying unit 500, with an air damper 602 (FIG. 17) which is supported by a timing pulley 608 and a ratchet wheel 610. Therefore, a tape feeding device 604 of the unit 600 performs only a tape feeding action. The same reference numerals as used in the seventh embodiment shown in FIG. 14 are used to designate the corresponding elements or parts of the eighth embodiment shown in FIGS. 16 to 18, and the description of those elements or parts is omitted.

The timing pulley 608 and the ratchet wheel 610 are attached to a support member 106 via an axis member 606, such that the pulley 608 and the wheel 610 are rotatable relative to the support member 106. As shown in FIG. 18, the timing pulley 608 is provided by an annular solid member which has teeth 612 on an outer circumferential surface thereof and has an annular groove 614 opening in one of axially opposite end surfaces thereof. The timing pulley 608 has a plurality of air chambers 616 which extend in respective radial directions, which open in the above-indicated one end surface thereof and the annular groove 614, and which are equiangularly spaced from each other about the axis member 606. The air chambers 616 are separated from each other by a plurality of partition walls 618 which extend in respective radial directions. Respective radially inner surfaces of the partition walls 618 cooperate with each other to partly define the annular groove 614.

The ratchet wheel 610 includes a central boss portion 624 which is fitted in the annular groove 614 of the timing pulley 608 and which is concentric with the ratchet wheel 610. The ratchet wheel 610 additionally includes a plurality of partition walls 626 which extend radially outwardly from the central boss portion 624 such that the partition walls 626 are equiangularly spaced from each other about the boss portion 624 or the axis member 606. Each of the partition walls 626 has a through-hole 628 (FIG. 18) formed through the thickness thereof in a direction in which the ratchet wheel 610 is rotated.

As shown in FIG. 18, the boss portion 624 of the ratchet wheel 610 is fitted in the annular groove 614 of the timing pulley 608, and the partition walls 626 of the wheel 610 are fitted in the air chambers 616 of the pulley 608, respectively. It is not easy to seal between the partition walls 626 and respective outer wall surfaces of the air chambers 616 and between the partition walls 618 and an outer circumferential surface of the boss portion 624. Therefore, no sealing members are provided in those clearances. However, those clearances are designed to be as small as possible. At least one of the respective through-holes 628 of the partition walls 626 is closed by a leaf valve 630 as a sort of check valve which permits the flowing of the air from a downstream-side portion of the corresponding air chamber 616 into an upstream-side portion of the same 616, in the direction, indicated at arrow in FIG. 17, in which the ratchet wheel 610 is rotated relative to the timing pulley 608. The leaf valve 630, however, inhibits the flowing of the air in the opposite direction.

Diametrically opposite two partition walls 618 of the plurality of walls 618 and diametrically opposite two partition walls 626 of the plurality of walls 626 are utilized as spring seats, and two compression coil springs 634 each as a sort of elastic member acting as a biasing member or device are provided between two pairs of partition walls 618, 626, respectively, each pair 618, 626 of which acts as a pair of spring seats.

The axis member 606 supports the timing pulley 608 in which the ratchet wheel 610 is fitted. A compression coil spring 638 as a sort of elastic member acting as a biasing member or device is provided between the timing pulley 608 and a spring retainer 636 fixed to the axis member 606. The coil spring 638 biases the timing pulley 608 in a direction in which the timing pulley 608 is held in close contact with the ratchet wheel 610. Thus, the partition walls 618 are held in close contact with the ratchet wheel 610, to such an extend that only very small spaces are left between the partition walls 626 and the bottom wall surfaces of the air chambers 616, or vice versa. In either case, only a small amount of air can pass through each of those small spaces.

The backward (i.e., clockwise in FIG. 16) rotation of the ratchet wheel 610 is inhibited by a stopper lever 640. The stopper lever 640 permits the forward (i.e., counterclockwise in FIG. 16) rotation of the ratchet wheel 610. The rotation of the timing pulley 608 is transmitted via a timing belt 642 to a timing pulley 534 which is integral with a ratchet wheel 174.

As shown in FIG. 16, a bracket 202 supports a feed pin 650 and a stopper 652 such that the feed pin 650 and the stopper 652 are movable toward, and away from, the ratchet wheel 610 and the timing pulley 608. The bracket 202 supports an elevator member 654 as a displaceable member such that the elevator member 654 is movable upward and downward by being guided by a linear guide member 656 fixed to the bracket 202. The elevator member 654 is biased upward by a tension coil spring 658 which is provided between the elevator member 654 and the bracket 202. The limit or end of the upward movement of the elevator member 654 owing to the biasing force of the coil spring 658 is defined by the butting of the elevator member 654 against an engaging roller 660 which is rotatably attached to the driven bar 230. The engaging roller 660 provides an engaging portion which engages the elevator member 654.

The feed pin 650 is attached to the elevator member 654 such that the feed pin 650 is pivotable about a horizontal axis line. A spring member 664 as a sort of elastic member acting as a biasing member or device biases the feed pin 650 in a direction in which the pin 650 engages one of the teeth of the ratchet wheel 610. The limit of the pivotal motion of the feed pin 650 owing to the biasing action of the spring member 664 is defined by the butting of the pin 650 against a stopper 666 fixed to the elevator member 654. The feed pin 650 engages the teeth of the ratchet wheel 610 in a direction tangent to the locus of rotation of those teeth about the axis member 606.

The stopper 652 is supported by the elevator member 654 such that the stopper 562 is movable upward and downward relative to the elevator member 654. A compression coil spring 670 biases the stopper 652 downward. The limit or end of the downward movement of the stopper 652 owing to the biasing force of the coil spring 670 is defined by the butting of a head portion 672 of the stopper 652 against an upper surface of the elevator member 654. In the state in which the head portion 672 is engaged with the elevator member 654 and the stopper 652 is positioned at its lower stroke-end position, a lower end of the stopper 652 is positioned below a lower end of the feed pin 650.

As the pushing member 242 is lowered and the driven bar 230 is lowered, the elevator member 654 is pushed downward by the engaging roller 660, and is lowered against the biasing force of the tension coil spring 658. Thus, the feed pin 650 and the stopper 652 are lowered. Before the feed pin 650 engages the teeth of the ratchet wheel 610, the stopper 652 butts against the timing pulley 608 via the timing belt 642. Then the elevator member 654 is further lowered relative to the stopper 652 while compressing the compression coil spring 670. Consequently the feed pin 650 engages one tooth of the ratchet wheel 610, and rotates the wheel 610 forward (i.e., counterclockwise in FIG. 16), while being pivoted against the biasing force of the spring member 650.

Since the stopper 652 is pressed on the timing pulley 608 by the biasing action of the compression coil spring 670, the timing pulley 608 is inhibited from being rotated. That is, the pulley 608 is not rotated. Therefore, the ratchet wheel 610 is rotated relative to the timing pulley 608 while compressing the compression coil springs 634 which are provided between the wheel 610 and the pulley 608. All the leaf valves 630 are simultaneously opened, and the air flows from the respective downstream-side portions of the corresponding air chambers 616 into the respective upstream-side portions of the same 616 in the direction of rotation of the wheel 610, through the respective through-holes 628 of the corresponding partition walls 626. Thus, the rotation of the ratchet wheel 610 is permitted.

After the EC sucker 68 picks up one EC 140 from the EC carrier tape 146, the pushing member 242 is moved upward and accordingly the driven bar 230 is also moved upward, so that the elevator member 654 is moved upward. This upward movement of the driven bar 230 or the elevator member 654 is done at a high speed, like the upward movement of the driven bar 230 of the EC supplying unit 500 shown in FIGS. 14 and 15. More specifically described, first, the feed pin 650 is disengaged from the teeth of the ratchet wheel 610, and then the stopper 652 is moved off the timing belt 642 or the timing pulley 608. Thus, the timing pulley 608 is permitted to rotate relative to the ratchet wheel 610 by the biasing force of the compression coil springs 634. On the other hand, the leaf valves 630 inhibit the air from flowing through the through-holes 628, so that the air flows through only the small clearances left between the partition walls 618 and the boss portion 624 and between the partition walls 627 and the respective outer wall surfaces of the air chambers 616. Therefore, the timing pulley 608 is rotated at a low speed relative to the ratchet wheel 610, and the EC carrier tape 146 is fed forward at a corresponding low speed.

After the driven bar 230 reaches its upper stroke-end position and the pushing member 242 is moved off the driven bar 230, the support table 102 is moved, and the EC carrier tape 146 is fed forward concurrently with the movement of the tape 146. Ones of the through-holes 628 for which no leaf valves 630 are provided permit the air to flow therethrough. As the number of the remaining through-holes 628 for which the respective leaf valves 630 are provided increases, the flow amount of the air which permits the rotation of the timing pulley 608 decreases, which leads to lowering the speed of feeding of the EC carrier tape 146. Therefore, the number of the leaf valves 630 is so selected as to feed the tape 146 at a desirable speed. The timing pulley 608 and the ratchet wheel 610 cooperate with each other to provide a main frame (or a casing member) of the air damper 602.

The timing belt 642 provides a displaceable engaged member as one of displaceable members which are displaceable with the sprocket 168 as the feed member; the timing pulley 608 on which the timing belt 642 is wound provides an engaging member which engages the engaged member; and the timing pulley 608, the ratchet wheel 610, the through-holes 628, the air chambers 616, and the leaf valves 630 cooperate with one another to provide the air damper 602. The timing pulley 608 and the ratchet wheel 610 cooperate with the compression coil springs 634 to provide the energy storing device; and the sprocket 168, the ratchet wheel 610, and the stopper lever 186 cooperate with one another to provide the tape feeding device 604.

The entire interface between the timing pulley 608 and the ratchet wheel 610 may be sealed by sealing members, so that no air is leaked from the air chambers 616. In this case, a restrictor may be provided in the through-hole 628 of each of the partition walls 626, so that the restrictor resists the flowing of the air between the two portions of the corresponding air chamber 616 on both sides of the each partition wall 626.

Figure 19:
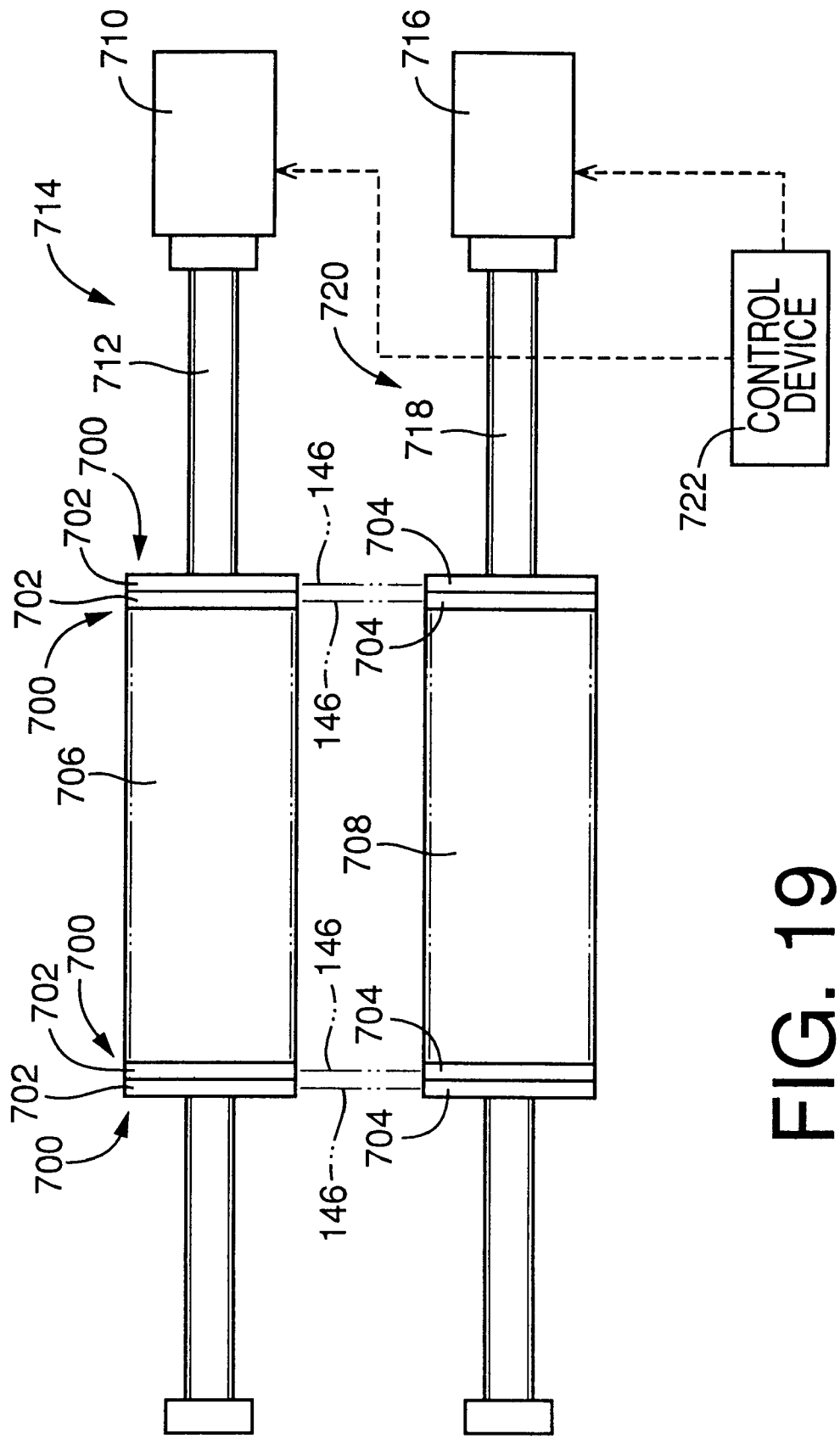
FIG. 19 is a schematic plan view of another EC supplying apparatus as a ninth embodiment of the present invention.

In each of the preceding embodiments, the tape storing device 152 as a sort of EC storing device is supported by the main frame 104 and is moved with the tape feeding device 164, 454, 502, 604. In contrast, FIG. 19 shows a plurality of EC supplying units 700 each of which includes a tape feeding device 702 and a tape storing device 704 which are separate from each other. The respective tape feeding devices 702 of the units 700 are supported on a first support table 706, and the respective tape storing devices 704 of the same units 700 are supported on a second support table 708. The first and second support tables 706, 708 can be moved independent of each other.

The respective tape storing devices 704 of the EC supplying units 700 are detachably attached to the second support table 708, at a predetermined regular interval of distance; and the respective tape feeding devices 702 of the same units 700 are detachably attached to the first support table 706, at the same regular interval as the above-indicated interval, such that respective EC-supply portions of the tape feeding devices 702 are arranged along a straight reference line parallel to an X-axis direction. Each of the tape feeding devices 702 cooperates with a corresponding one of the tape storing devices 704 to provide a corresponding one of the EC supplying units 700. In each of the units 700, an EC carrier tape 146 drawn from the tape storing device 704 thereof is supplied to the tape feeding device 702 thereof via a space present between the two devices 702, 704.

The first support table 706 is moved by a first table moving device 714 which includes a servomotor 710 as a drive source, and a motion converting device including a feed screw 712 and a nut (not shown) fixed to the table 706; and the second support table 708 is moved by a second table moving device 720 which includes a servomotor 716 as a drive source, and a motion converting device including a feed screw 718 and a nut (not shown) fixed to the table 708. The two servomotors 710, 716 are controlled by a control device 722 which is essentially provided by a computer, like the control device 300 shown in FIG. 5. The control device 722 is identical with the control device 300, except that the control device 722 controls the servomotors 710, 716 in place of the table moving servomotor 132 which is controlled by the control device 330 in the first embodiment shown in FIG. 3.

The group of tape feeding devices 702 need to be stopped while each EC 140 is picked up from one of the devices 702. Therefore, the group of tape feeding devices 702 need to be quickly accelerated and/or decelerated. On the other hand, the group of tape storing devices 704 need not be stopped while each EC 140 is picked up from any of the devices 704. Thus, the group of tape storing devices 704 may be moved at an acceleration and a deceleration that is smaller than those at which at which the group of tape feeding devices 702 is moved.

In the present embodiment, the first table 706 is moved and stopped, at high acceleration and deceleration, so as to position sequentially the respective EC-supply portions of the EC supplying units 700, at the EC-supply position. On the other hand, basically, the second table 708 is moved without being stopped. For example, in the case where a plurality of EC supplying units 700 which are adjacent to each other sequentially supply respective ECs 140, in such a manner that each unit 700 supplies one EC 140, the group of EC feeding devices 702 of the units 700 need to perform intermittent movements, that is, periodically repeat moving and stopping, whereas the group of EC storing devices 704 is moved at a constant speed, without being stopped. In this case, the acceleration and deceleration of the group of EC storing devices 704 is zero. Since the timings, speeds, and accelerations at which the first table 706 is moved are known in advance, the control device 722 or the computer thereof calculates, based on the above-indicated data, the speeds and accelerations at which the second table 708 needs to be moved to be able to cause each of the tape storing devices 704 to follow a corresponding one of the tape feeding devices 702 at the lowest possible acceleration and deceleration without causing the each tape storing device 704 to get behind, or ahead, of the corresponding one tape feeding device 702 by more than a predetermined time. Based on the thus calculated data, the control device 722 controls the second servomotor 716. In this way, the vibration and noise which are produced by the movements of the second table 708 and the group of tape storing devices 704 on the table 708, are minimized, and the change of the relative position of each of the tape feeding devices 702 on the first table 706 and a corresponding one of the tape storing devices 704 on the second table 708, is minimized.

However, the speeds and accelerations at which the second table 708 is moved may be determined in advance based on the speeds and accelerations at which the first table 706 is moved. For example, in the case where the first table 706 is moved according to each of a plurality of different first movement patterns or maps and the second table 708 is moved according to each of a plurality of different second movement patterns or maps which correspond to the plurality of first movement patterns or maps, respectively, the second table 708 may be moved at one of the second movement patterns that is so selected as to correspond to the current one of the first movement patterns. Each of the second movement patterns may be obtained by smoothing or moderating a corresponding one of the first movement patterns. Anyway, the present EC supplying apparatus is free from the large vibration that would be produced in the case where the group of tape storing devices 704 are accelerated and decelerated as a unit with the group of tape feeding devices 702. Therefore, the present EC supplying apparatus enjoys. improved efficiency of supplying of ECs and improved reliability.

In the case where the vibration produced by the movements of the second table 708 and the group of tape storing devices 704 on the table 708 need not be reduced, the total number of ECs 140 which are stored in each of the tape storing devices 704 may be increased. In this case, the frequency at which an operator supplies new ECs 140, i.e., a new EC carrier tape 146 to each tape storing device 704 is reduced, which leads to improving the efficiency of supplying of ECs 140.

It is not essentially required that the second table 708 be driven by the servomotor 716, that is, an electric motor which is accurately controllable with respect to its rotation angle or amount. The drive source of the second table 708 may be provided by a different sort of electric motor. Even an electric motor which is not controllable with respect to its rotation angle can move the second table 708, e.g., when the distance between the first and second tables 706, 708 exceeds a reference value, so that the distance between each of the tape feeding devices 702 and a corresponding one of the tape storing devices 704 falls within a reference range.

In the case where the group of tape storing devices 704 are movable relative to the group of tape feeding devices 702, the change of the distance between each of the tape feeding devices 702 and a corresponding one of the tape storing devices 704 can be so controlled as to fall within a narrow range, and accordingly the change of the length of a transferring portion of an EC carrier tape 146 between each of the tape feeding devices 702 and a corresponding one of the tape storing devices 704 can be so controlled as to fall within a narrow range. However, it is not essentially required that the group of tape storing devices 704 be movable relative to the group of tape feeding devices 702. That is, the group of tape storing devices 704 or the second table 708 may be fixed at a predetermined position.

The tape feeding devices 702 may be permanently mounted on the first table 706, and/or the tape storing devices 704 may be permanently mounted on the second table 708.

Figure 20:
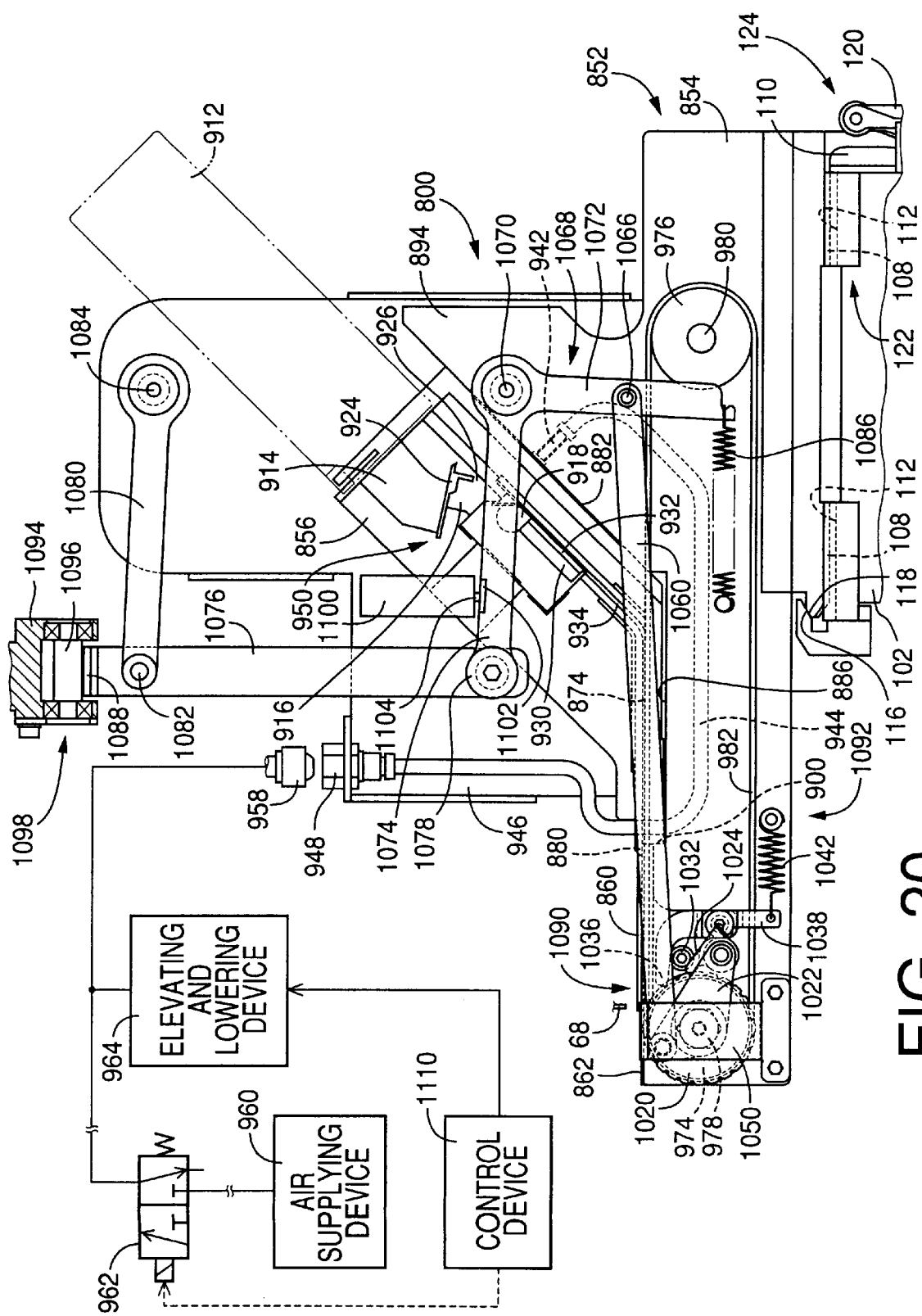
FIG. 20 is a front elevation view of another EC supplying unit as a tenth embodiment of the present invention.

In each of the preceding embodiments, the EC mounting system includes the plurality of EC supplying units 140, 350, 400, 420, 430, 450, 500, 600, or 700 each of which supplies the ECs 140 in the form of the EC carrier tape 146. In contrast thereto, FIG. 20 shows another or second EC mounting system which is basically similar to the EC mounting system shown in FIG. 1, but includes a plurality of EC supplying units 800 one of which is shown in FIG. 20 as a representative of all the units 800 and each of which stores a number of ECs 140 in bulk, arranges the bulk of ECs 140 into an array of ECs 140 by utilizing air flow, inclination, and a conveyor belt, and supplies the ECs 140 in the array, one by one, to a predetermined EC-pick-up position. Thus, each EC supplying unit 800 is a "bulk" unit in contrast to JO the "tape" units 140, 350, 400, 420, 430, 450, 500, 600, or 700. The same reference numerals as used in the first embodiment shown in FIG. 3 are used to designate the corresponding elements or parts of the present, tenth embodiment shown in FIGS. 20 to 32, and the description of those elements is omitted.

Figure 23:
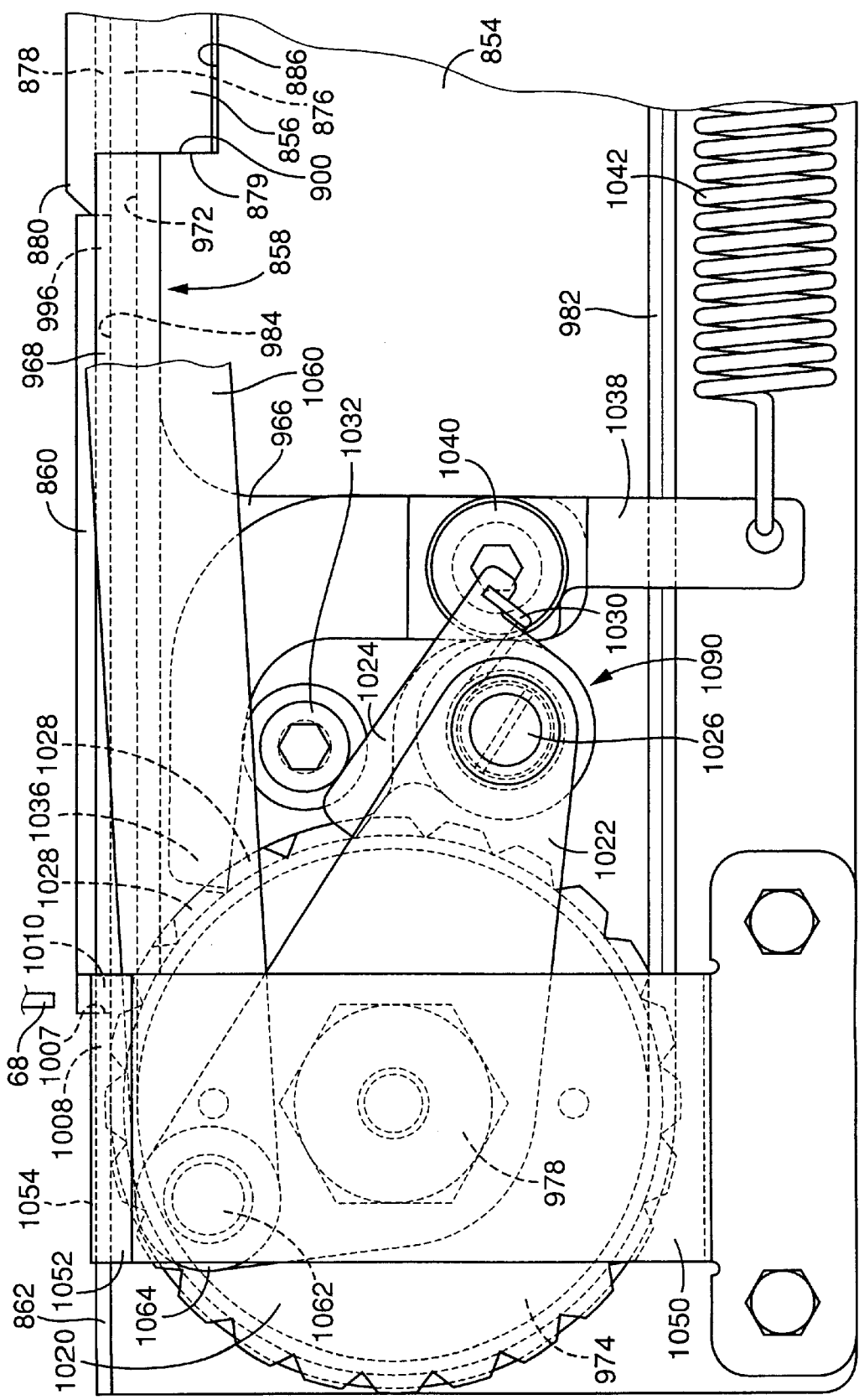
FIG. 23 is a front elevation view of an EC-supply portion of the EC supplying unit of FIG. 20.
Figure 25:
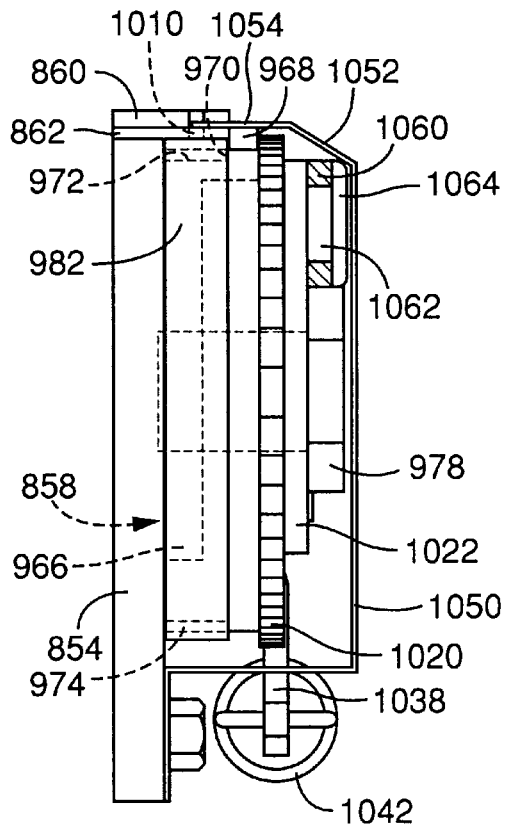
FIG. 25 is a partly cross-sectioned, side elevation view of the EC-supply portion of the EC supplying unit of FIG. 20.

Each EC supplying unit 800 includes a main frame 852 which is assembled, for easier manufacturing thereof, from a plurality of members. As shown in FIGS. 20, 23, and 25, the main frame 852 includes a first, a second, a third, a fourth, and a fifth member 854, 856, 858, 860, 862. The first member 854 has a generally elongate plate-like configuration, and its lengthwise direction is parallel, on a horizontal plane, to an EC-feed direction, i.e., a Y-axis direction and its widthwise direction is perpendicular to the EC-feed direction and is parallel to an X-axis direction. The respective first members 854 of the EC supplying units 800 stand upright on a support table 102 such that respective EC-supply portions of the EC supplying units 800 are arranged along a straight reference line parallel to the X-axis direction. The first member 854 of each EC supplying unit 800 is positioned relative to the support table 102 by a positioning device 122, and is fixed to the table 102 by a fixing device 124, like in the EC supplying apparatus 14 shown in FIG. 1.

Figure 21:
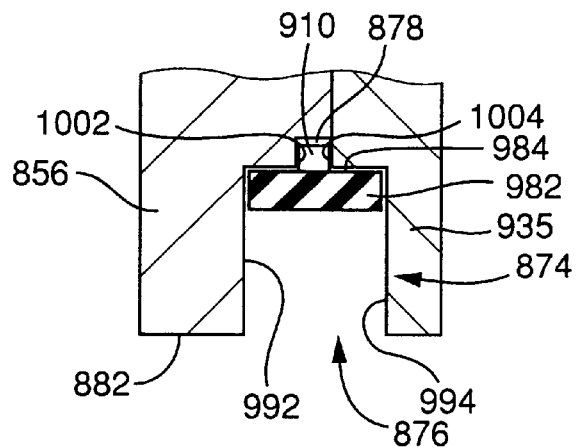
FIG. 21 is a cross-sectioned, side elevation view of a guide groove formed in a second member as an element of a main frame of the EC supplying unit of FIG. 20, together with an EC-convey belt.
Figure 24:
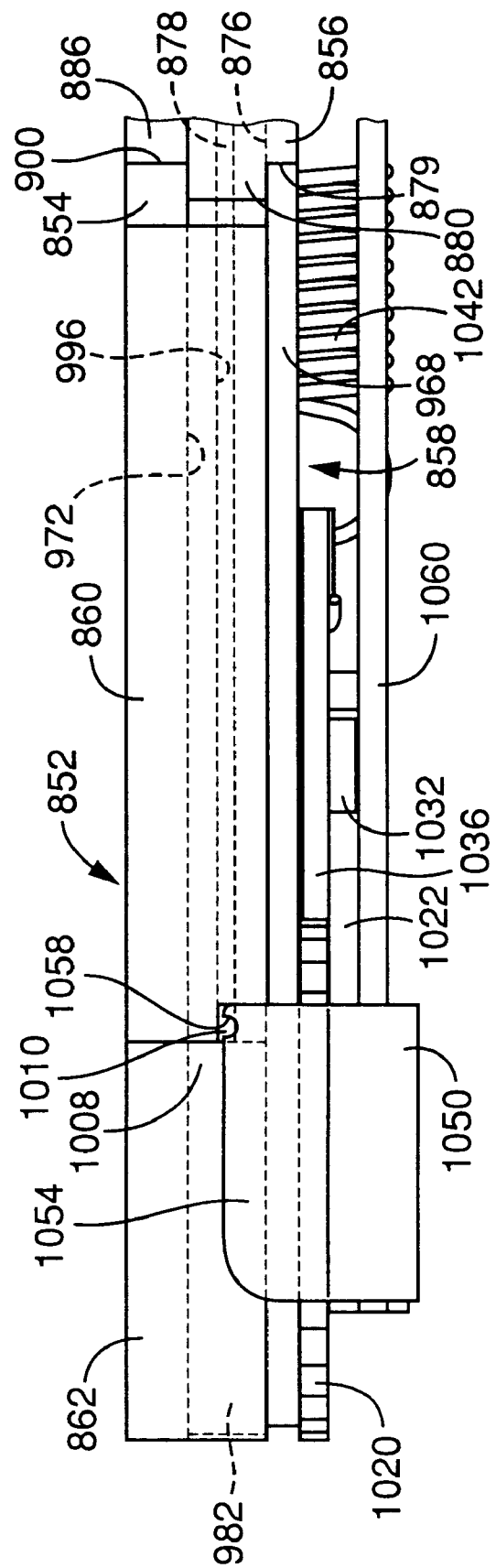
FIG. 24 is a plan view of the EC-supply portion of the EC supplying unit of FIG. 20.

The second member 856 is assembled, for easier manufacturing thereof, from a plurality of sub-members. The second member 856 has a lower surface 882 which is angled at an intermediate position thereof as seen in the lengthwise direction of the first member 854. A guide groove 874 is formed through a front portion of the second member 856 in front of the angled position, such that the guide groove 874 extends in the lengthwise direction and opens in a front portion of the lower surface 882. As shown in FIG. 21, the guide groove 874 has a stepped cross section including a wide portion 876 on the side of the lower surface 882 and a narrow portion 878 opening in the wide portion 876 and having a width smaller than that of the same 876. As shown in FIGS. 23 and 24, the second member 856 has a front end surface 879 from an upper portion of which an engaging tongue portion 880 having a small width projects frontward. The tongue portion 880 has a thickness suitable for forming the narrow portion 878 therethrough, and the narrow portion 878 is formed through the tongue portion 880 and opens in a front end surface of the same 880.

As shown in FIG. 20, the first member 854 has a recess 886 in an intermediate portion thereof as seen in the lengthwise direction thereof. The recess 886 is formed through the first member 854 in the widthwise direction thereof and opens in the upper surface thereof. In rear of the recess 886, the first member 854 has an attachment portion 894 which is inclined relative to the upper surface of the member 854 in front of the recess 886, by the same angle as that at which a rear portion of the lower surface 882 of the second member 856 is angled or inclined relative to a front portion of the same 882. An upper surface of the attachment portion 894 is inclined rearward and upward. The second member 856 is positioned relative to the first member 854, and is fixed to the same 854 by a fixing device (not shown). The positioning and fixing of the second member 856 will be described later.

Figure 28:
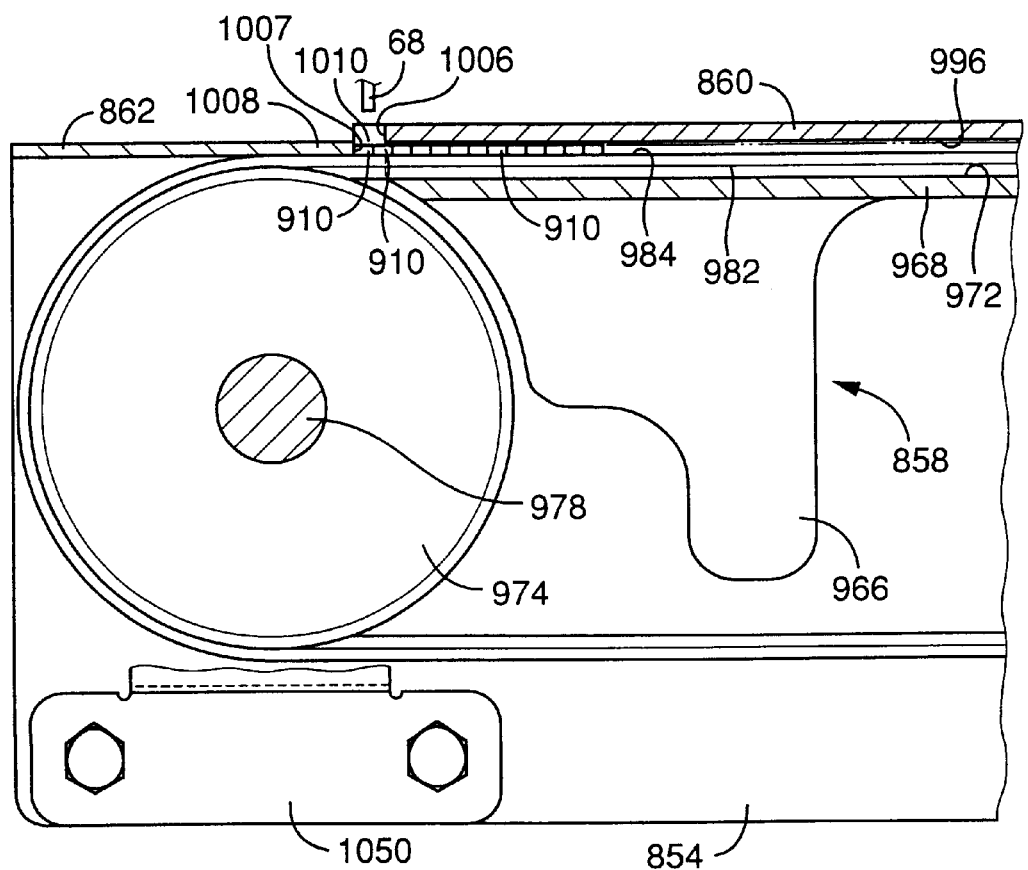
FIG. 28 is a partly cross-sectioned, front elevation view of the EC-supply portion of the EC supplying unit of FIG. 20, with a ratchet wheel being removed.

As shown in FIG. 20, an EC-store case 912 is detachably attached to a rear end portion of the second member 856. The EC-store case 912 stores a number of ECs 910 in bulk in the form of chips each having no lead wires (FIG. 28). The EC-store case 912 provides an EC storing device. The ECs 910 stored in the EC-store case 912 enter an EC-store room 914 via an opening formed through a rear wall of the second member 856, and then enter a first and a second EC-stir room 916, 918. Those three rooms 914, 916, 918 are parallel to a rear portion of the second member 856 in rear of the intermediate position where the lower surface 882 is angled. Therefore, respective bottom surfaces of the three rooms 914, 916, 918 are inclined rearward and upward. That is, an upstream portion of the bottom surface of each room 914, 916, 918 as seen in the EC-feed direction is higher than a downstream portion of the same.

The first EC-stir room 916 is smaller than the EC-store room 914, and the two rooms 914, 916 are partitioned by a first partition member 924. A lower end portion of the partition member 924 cooperates with the bottom surface of the EC-store room 914 to define an outlet 926 of the room 914 which permits several ECs 910 to simultaneously pass therethrough. Therefore, the ECs 910 stored in the EC-store room 914 naturally move, by their weights, little by little into the first EC-stir room 916.

Figure 22:
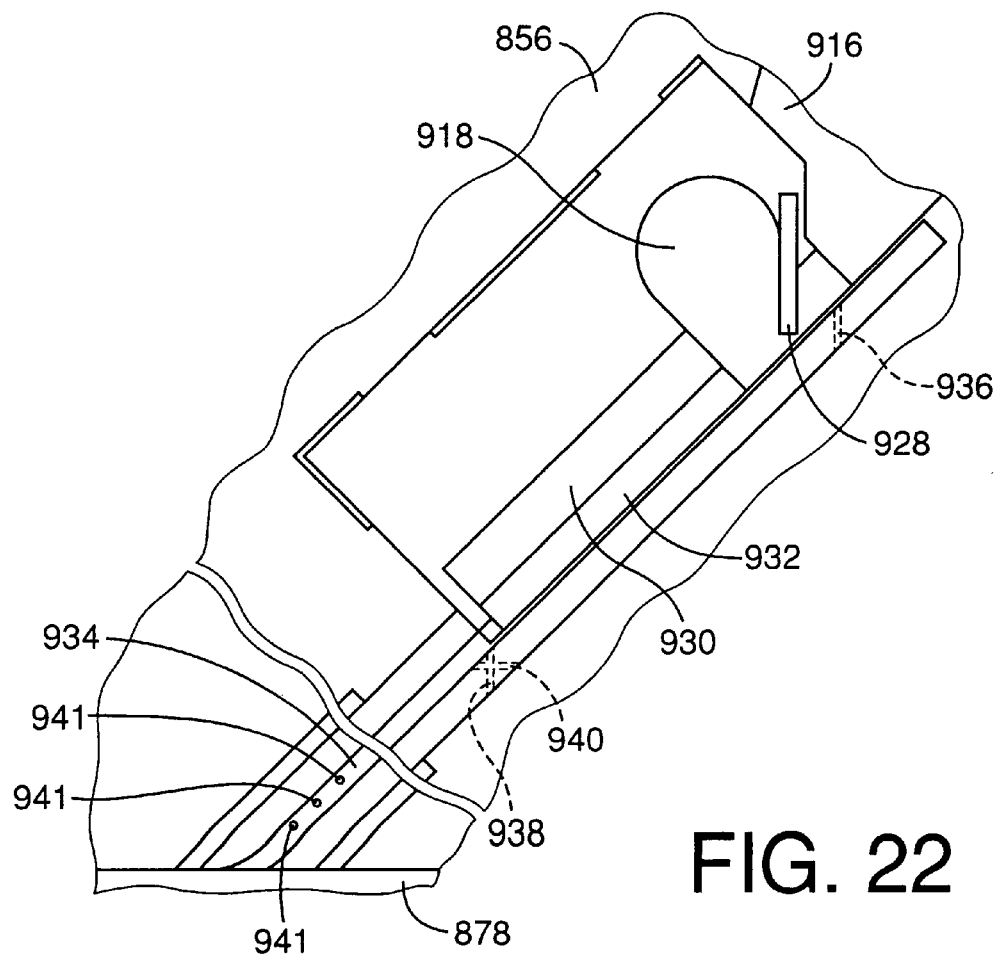
FIG. 22 is a front elevation view of an EC stirring device of an air-using EC lining-up device as an element of the EC supplying unit of FIG. 20, together with an EC-supply passage.

As shown in FIG. 22, the second EC-stir room 918 and the first EC-stir room 916 are partitioned by a second partition member 928. The ECs 910 present in the first EC-stir room 916 move into the second EC-stir room 918, via a recess (not shown) formed through the second partition member 928, while being disciplined by the recess. A bar-like movable member 930 is provided in a front portion of the second EC-stir room 918 which is remote from the first EC-stir room 916, such that the movable member 930 extends parallel to the bottom surface of the second EC-stir room 918 and is movable in a direction perpendicular to the bottom surface. Thus, the second EC-stir room 918 has, under the movable member 930, a line-up passage 932 whose dimension as measured in the direction perpendicular to the bottom surface is changeable between a lower limit at which the passage 932 permits the passing therethrough of a single EC 910 only and an upper limit at which the passage 932 permits the simultaneous passing therethrough of several ECs 910.

The second member 856 has a supply passage 934 which opens in the line-up passage 932 and the narrow portion 878 of the guide groove 874. The supply passage 934 is parallel to the EC-store room 914 and the first and second EC-stir rooms 916, 918, and is inclined relative to the guide groove 874. The opening of the supply passage 934 in the line-up passage 932 is an inlet of the passage 934, and the opening of the passage 934 in the guide groove 874 is an outlet of the same 934.

The guide groove 874, the supply passage 934, the EC-store room 914, and the first and second EC-stir rooms 916, 918 are defined by the cooperation of the second member 856 and a cover member 935 (FIG. 21). FIG. 20 shows the second member 856 with the cover member 935 being removed.

As shown in FIG. 22, the second member 856 has, at a position between the second partition member 928 and the first EC-stir room 916, a first EC-stir air-blow hole 936 having a directional component toward the first EC-stir room 916. In addition, the second member 856 has, at a position near the inlet of the supply passage 934, a second EC-stir air-blow hole 938 having a directional component toward the line-up passage 932 and accordingly the second EC-stir room 918. Moreover, the second member 856 has, at a position near the inlet of the supply passage 934, an EC-feed air-blow hole 940 having a directional component toward the outlet of the supply passage 934. Furthermore, the second member 856 has a plurality of air-relieve holes 941 (FIG. 22) which are close to each other and whose one ends open around the outlet of the supply passage 934 and whose other ends open in an outer surface of the second member 856. Thus, the first and second EC-stir rooms 916, 918 and the second EC-stir air-blow hole 938 cooperate with one another to provide an EC stirring device, which cooperates with the EC-store room 914, the supply passage 934, and the EC-feed air-blow hole 940 to provide an air-using EC lining-up device as a sort of EC lining-up device.

The second member 856 has a common air-supply passage (not shown) formed therein, which communicates with each of the above-indicated three air-blow holes 936, 938, 940. With the second member 856 being attached to the first member 854, the common air-supply passage communicates with an air-supply passage 942 (FIG. 20) formed in the first member 854. The air-supply passage 942 is connected to a joint member 948 attached to a bracket 946 fixed to the first member 854, via a communication passage including a hose 944. The hose 944 is accommodated in a hose accommodating groove (not shown) as a hose accommodating portion of the first member 854, so that the hose 944 does not protrude over the side surface of the EC supplying unit 800. As shown in FIG. 24, a width of a front end portion of the second member 856 is smaller than the sum of a width of the first member 854 and a width of the third member 858 fixed to the first member 854, by a width of a space provided on one side of the front end portion of the second member 856. The hose 944 runs upward through that space, so as to be connected to the joint member 948.

As shown in FIG. 20, the joint member 948 is connectable to another joint member 958 provided at the EC-supply position. The joint member 958 is connected to an air supplying device or source 960. A solenoid-operated direction-control valve 962 is provided between the joint member 958 and the air supplying device 960, and is switched to selectively connect the joint member 958 to the air supplying device 960 or the atmosphere.

The joint member 958 is moved up and down by an elevating and lowering device 964 as a joint driving device. The joint member 958 is moved downward to its operative position where the joint member 958 is connected to the joint member 948 of one EC supplying unit 800 whose EC-supply portion is currently positioned at the EC-supply position, and is moved upward to its inoperative position away from the joint member 948. If the joint member 958 being connected to the joint member 948 is communicated with the air supplying device 960, the first and second EC-stir air-blow holes 936, 938 and the EC-feed air-blow hole 940 simultaneously blow air.

Figure 26:
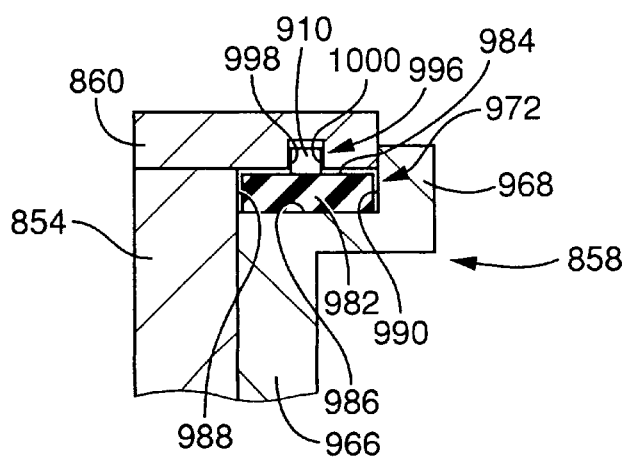
FIG. 26 is a cross-sectioned, side elevation view of another guide groove formed in a first and a third member as elements of the main frame of the EC supplying unit of FIG. 20, together with the EC-convey belt.

Next, the third member 858 will be described. As shown in FIG. 25, the third member 858 is fixed to the first member 854. As shown in FIGS. 23 and 25, the third member 858 includes a plate-like attachment portion 966 to which a positioning pawl 1036 (described later) is attached; and a guide portion 968 which is provided above the attachment portion 966 such that the guide portion 968 extends parallel to the lengthwise direction of the first member 854 (i.e., the EC-feed direction) and which has a width greater than that of the attachment portion 966. The guide portion 968 has a length starting at a position adjacent to an upstream-side end of the EC-supply portion as seen in the EC-feed direction where the ECs 910 are picked up, to an end surface 900 defining a front end of the recess 886 formed in the first member 854. The guide portion 968 has a recess 970 (FIG. 25) which is formed therethrough in the EC-feed direction and which opens upward and leftward as seen in FIG. 25. The recess 970 has a rectangular cross section. The leftward opening of the recess 970 is closed by the first member 854, to provide a guide groove 972 which has a rectangular cross section and which has the same width as that of the wide portion 876 of the guide groove 874 formed in the second member 856. As shown in FIG. 26, a portion of the guide portion 968 which provides a side wall defining the guide groove 972 projects upward over an upper surface of the first member 854.

As shown in FIG. 26, the upper opening of the guide groove 972 is closed by the fourth member 860 fixed to the first member 854. The fourth member 860 provides a fixed cover member. As shown in FIG. 24, the fourth member 860 has a length starting at a position corresponding to the EC-supply portion and ending at a position near the recess 886 formed in the first member 854, and covers a portion of an EC-convey belt 982 which corresponds to the EC-supply portion. The fourth member 860 has a guide groove 996 which has a rectangular cross section, which has the same width and depth as those of the narrow portion 878 of the guide groove 874, which opens in a lower surface of the fourth member 860, and which is formed through the fourth member 860 in the EC-feed direction. The fourth member 860 is fixed to the first member 854, such that the fourth member 860 is held in abutment with the projecting portion of the guide portion 968 of the third member 858 which projects upward over the upper surface of the first member 854 and is thereby positioned in the direction of width thereof. Thus, the projecting portion of the guide portion 968 provides a positioning member which positions the fourth member 860 in the direction of width thereof. As shown in FIG. 26, the guide groove 996 is aligned with a widthwise center of the guide groove 972.

When the second member 856 is attached to the first member 854, first, the rear portion of the second member 856 corresponding to the half portion of the lower surface 882 in rear of the intermediate, angled position, is supported on the attachment portion 894 of the first member 854, as shown in FIG. 20. Thus, the second member 856 is positioned relative to the first member 854 in a direction perpendicular to the inclined upper surface of the attachment portion 894. Second, the rear portion of the second member 856 is positioned relative to the first member 854 in the direction of width thereof with the help of a positioning member (not shown). Then, as shown in FIGS. 23 and 24, the front end portion of the second member 856 is positioned in the direction of width thereof by holding one side surface of the engaging tongue portion 880 in abutment with the projecting portion of the guide portion 968 which defines the guide groove 972 and which projects upward over the upper surface of the first member 854. Finally, the second member 856 is fixed to the first member 854 with a fixing device (not shown), such that the front end surface of the tongue portion 880 is held in abutment with the fourth member 860 fixed to the first member 854.

In the state in which the second member 856 is fixed to the first member 854, the guide groove 874 extends in a horizontal direction parallel to the lengthwise direction of the first member 854, and the rear portion of the second member 856 corresponding to the rear portion of the lower surface 882 in rear of the intermediate, angled position is inclined rearward and upward. In addition, there is left a small space between the front end surface 879 of the second member 856, from which the engaging tongue portion 880 projects frontward, and the guide portion 968 of the third member 858. The dimensional tolerances prescribed for the EC supplying unit 800 assures that the front end surface and one side surface of the tongue portion 880 are held in contact with the fourth member 860 and the guide portion 968, respectively, and that the front surface 879 of the second member 856 is slightly spaced from the guide portion 968. Since, however, the space left between the front surface 879 of the second member 856 and the guide portion 968 is too small to draw on the drawing sheets, FIGS. 23 and 24 show the front surface 879 of the second member 856 held in contact with the guide portion 968 as if there were no space therebetween. The guide groove 972 is accurately aligned with the wide portion 876 of the guide groove 874 and cooperates with the wide portion 876 to provide a straight continuous belt-guide groove which extends parallel to the EC-feed direction; and the guide groove 996 is accurately aligned with the narrow portion 878 of the guide groove 874 and cooperates with the narrow portion 878 to provide a straight EC-guide groove which extends parallel to the EC-feed direction and which is continuous without any gaps in that direction. Thus, the guide portion 968 of the third member 858, and the fourth member 860 cooperate with each other to also function as a positioning device which positions the second member 856. As described above, the front end portion of the second member 856 is partly cut away to provide a space in which the hose 944 runs. Accordingly, the wide portion 876 opens in one side surface of the front end portion of the second member 856. However, since the remaining portion of the second member 856 in rear of the hose 944 has, as shown in FIG. 21, the same width as the sum of the respective widths of the first member 854 and the guide portion 968 of the third member 858, the remaining portion of the wide portion 876 is defined by a pair of side walls. Thus, the EC-convey belt 982 can be guided through the wide portion 876 without any problems.

As shown in FIG. 20, a drive pulley 974 and a driven pulley 976 are attached to a front portion and a rear portion of the first member 854 via respective axis members 978, 980 such that the drive and driven pulleys 974, 976 are rotatable about respective axis lines parallel to the direction of width of the first member 854. The two pulleys 974, 976 are timing pulleys, and the timing belt 982 as a sort of belt is wound on the pulleys 974, 976. The belt 982 has an endless, annular shape, and a length of the belt 982 fits in the guide groove 972 and the wide portion 876 of the guide groove 874. An outer (i.e., upper) surface of an upper half portion of the belt 982 provides a EC-convey surface 984 which conveys the ECs 910. As shown in FIGS. 21 and 26, opposite side surfaces of the upper half portion of the belt 982 are guided by side walls 988, 990 defining the guide groove 972, and side walls 992, 994 defining the wide portion 876 of the guide groove 874. An inner (i.e., lower) surface of the upper half portion of the belt 982, opposite to the EC-convey surface 984, is supported on a bottom wall 986 defining the guide groove 972. Thus, the side walls 988, 990, 992, 994 cooperate with one another to provide guide surfaces which guide the belt 982; and the bottom wall 986 provides a bottom surface which supports the belt 982. In addition, opposite side surfaces of each of the ECs 910 lined up on the EC-convey surface 984 are guided by side walls 998, 1000 defining the guide groove 996, and side walls 1002, 1004 defining the narrow portion 878 of the guide groove 874. Thus, the side walls 998, 1000, 1002, 1004 cooperate with one another to provide guide surfaces which guide the ECs 910. Since the narrow portion 878 opens downward, a portion of the second member 856 (including the engaging tongue portion 880) which defines the narrow portion 878 also functions as a cover member which covers the ECs 910 and thereby prevents the jumping of each EC 910 out of the narrow portion 878.

As shown in FIG. 28, a portion of the fourth member 860 which defines a front end portion of the guide groove 996 and which corresponds to the EC-supply portion has a recess 1006 which opens in a front end surface of the fourth member 860 and which is formed through a thickness of the same 860. The recess 1006 has a width (i.e., a dimension in a direction perpendicular to the EC-feed direction and a vertical direction) which is slightly greater than that of each EC 910, and has a dimension in the EC-feed direction which is slightly smaller than 1.5 times the dimension of each EC 910 in that direction. Thus, just one EC 910 can be picked up through the recess 1006. In FIG. 28, a ratchet wheel 1020, a first pivotable member 1022, etc. (described later) are not shown for easier understanding purposes only.

The fifth member 862 is fixed to a portion of the upper surface of the first member 854 which is located on a downstream side of the EC-supply portion in the EC-feed direction. A lower surface of the fifth member 862 is flush with a lower surface of the fourth member 860 on a horizontal plane. The fifth member 862 is held in contact with a front end surface of the fourth member 860, such that the fifth member 862 closes a lower portion of an opening of the recess 1006 in the front surface of the fourth member 860 and such that the fifth member 862 is opposed to an outlet of the guide groove 996. Therefore, each EC 910 which is moved from the guide groove 996 into the recess 1006 by the movement of the EC-convey surface 984 butts against a stopper surface 1007 (FIGS. 23 and 28) of the fifth member 862 which is perpendicular to the EC-feed direction and the EC-convey surface 984. Thus, each EC 910 is stopped. A portion of the fifth member 862 which has the stopper surface 1007 provides a stopper 1008; and the belt 982 and the stopper 1008 cooperate with the portion of the fourth member 860 which defines the recess 1006 to define an EC-pick-up space 1010 in the EC-supply portion of the EC supplying unit 800.

As shown in FIG. 25, a ratchet wheel 1020 is integral, and concentric, with the drive pulley 974, and fits on the axis member 978 such that the ratchet wheel 1020 is rotatable with the drive pulley 974 about the axis member 978. A first pivotable member 1022 additionally fits on the axis member 978 such that the first pivotable member 1022 is pivotable about the axis member 978. The first pivotable member 1022 is pivotable relative to the ratchet wheel 1020 about an axis line about which the ratchet wheel 1020 is rotatable.

As shown in FIG. 23, a driving pawl 1024 is attached with a pin 1026 to the first pivotable member 1022, such that the driving pawl 1024 is pivotable about an axis line parallel to the axis line of rotation of the ratchet wheel 1020 and such that the driving pawl 1024 is engaged with teeth 1028 of the wheel 1020. When the first pivotable member 1022 is pivoted forward, i.e., counterclockwise in FIG. 23, the driving pawl 1024 does not move over any teeth 1028 of the ratchet wheel 1020, i.e., does not move relative to the wheel 1020; and when the first pivotable member 1022 is pivoted backward, i.e., clockwise in FIG. 23, the driving pawl 1024 moves over the teeth 1028 of the wheel 1020, i.e., moves relative to the wheel 1020. The driving pawl 1024 is biased in a direction to engage the teeth 1028 of the ratchet wheel 1020, by a first spring member 1030 as a sort of elastic member acting as a sort of biasing device. The forward rotation of the ratchet wheel 1020 is stopped by the butting of the driving pawl 1024 against a stopper 1032 fixed to the attachment portion 966 of the third member 858. The backward pivotal motion of the first pivotable member 1022 is stopped in a manner described later.

A positioning pawl 1036 is attached to the attachment portion 966 of the third member 858. More specifically described, a second pivotable member 1038 is attached to the attachment portion 966 via an axis member 1040 such that the second pivotable member 1038 is pivotable about an axis line parallel to the axis line of rotation of the ratchet wheel 1020. The positioning pawl 1036 is provided by a free end portion of the second pivotable member 1038. The second pivotable member 1038 is biased in a direction in which the positioning pawl 1036 engages the teeth 1028 of the ratchet wheel 1020, by a second spring member 1042 as a sort of elastic member acting as a sort of biasing device.

Figure 29:
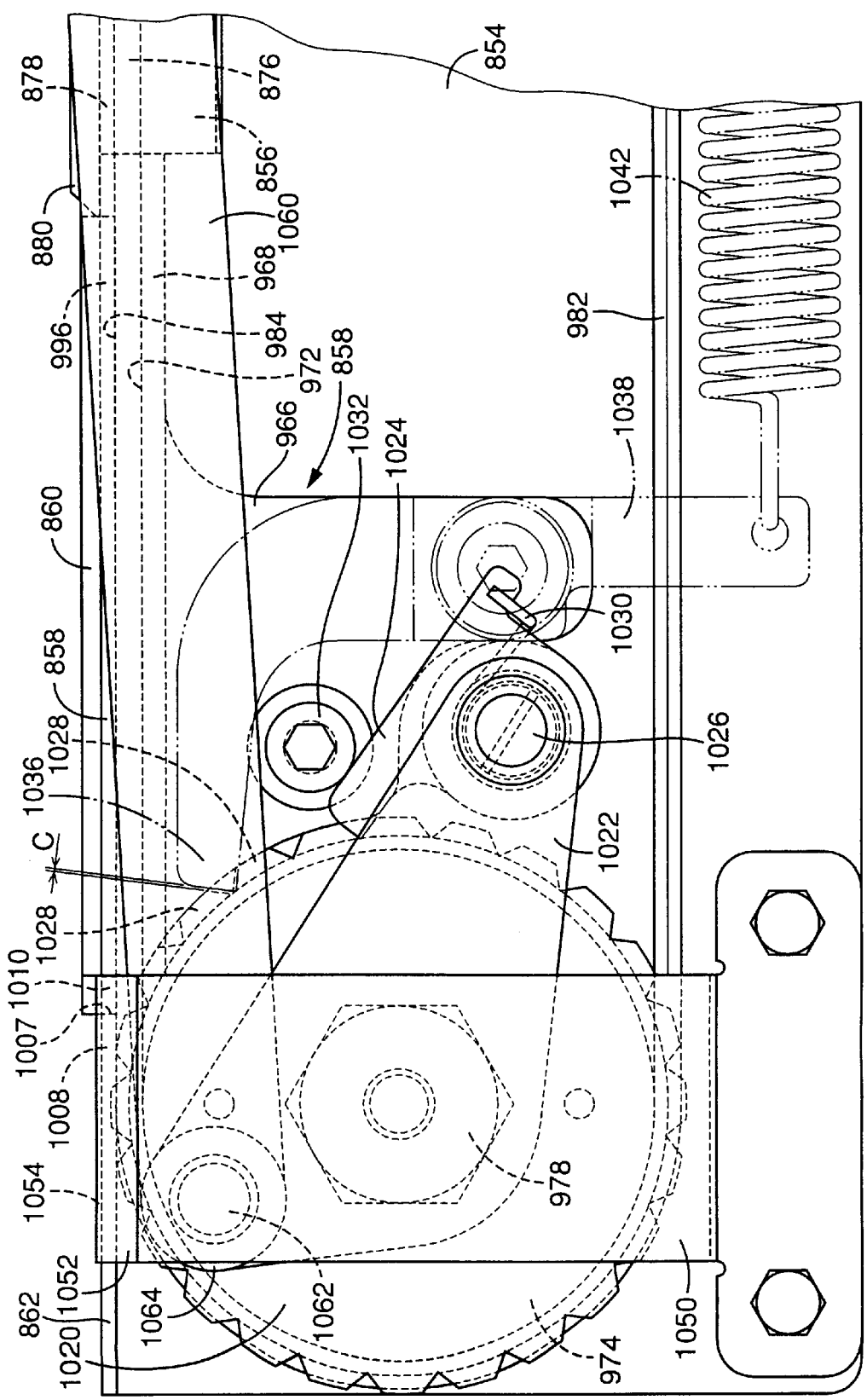
FIG. 29 is a view for illustrating the manner in which a positioning pawl of a belt driving device as an element of the EC supplying unit of FIG. 20 is attached to the third member.

The positioning pawl 1036 engages the teeth 1028 of the ratchet wheel 1020, such that the pawl 1036 permits the ratchet wheel 1020 to be rotated forward but does not permit the wheel 1020 to be rotated backward. With the driving pawl 1024 being pivoted away from the stopper 1032, the positioning pawl 1036 engages two successive or adjacent teeth of the teeth 1028 of the ratchet wheel 1020, thereby positioning the wheel 1020. The positioning pawl 1036 is attached to the attachment portion 966, at a position where the pawl 1036 engages two adjacent teeth of the teeth 1028 of the ratchet wheel 1020, thereby stopping the rotation of the wheel 1020, when the wheel 1020 has been rotated backward by a small angle after being rotated forward and stopped by the butting of the driving pawl 1024 against the stopper 1032. That is, as shown in FIG. 29, when the forward rotation of the ratchet wheel 1020 is stopped, a small space, C, remains between the positioning pawl 1036, indicated in two-dot chain lines, and an upstream one of two adjacent teeth 1028 as seen in the backward rotation direction of the wheel 1020, and the positioning pawl 1036 engages the other, downstream tooth 1028. Thus, the positioning pawl 1036 is pivoted clockwise by a small angle as seen in FIG. 29, in a direction away from the teeth 1028, against the biasing force of the second spring 1042. Therefore, if the driving pawl 1024 is pivoted in the direction away from the stopper 1032 as described above, the positioning pawl 1036 rotates, owing to the biasing force of the second spring 1042, the ratchet wheel 1020 backward by a small angle corresponding to the small space C.

Figure 27:
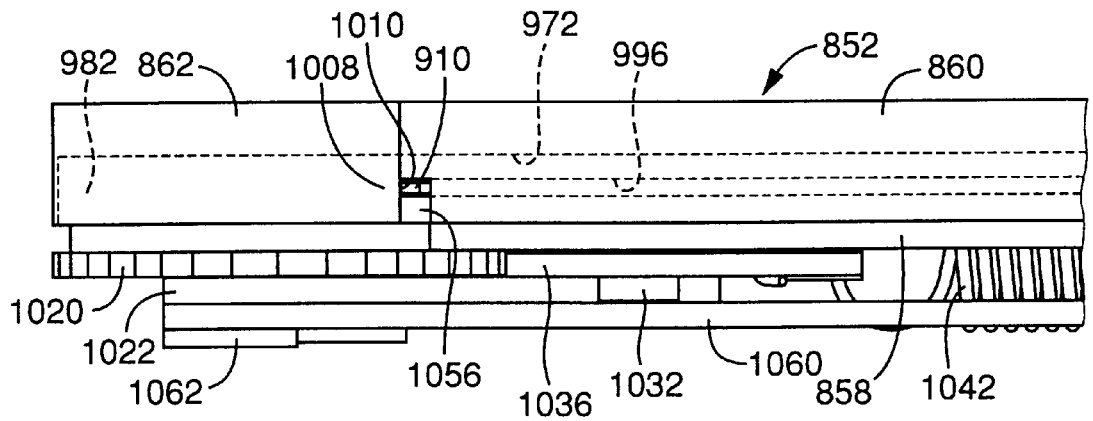
FIG. 27 is a plan view of the EC-supply portion of the EC supplying unit of FIG. 20, with a movable cover member being removed.

When the first pivotable member 1022 is pivoted forward, the driving pawl 1024 is pivoted forward about the axis line of pivotal motion of the first pivotable member 1022, while the driving pawl 1024 remains engaged with the teeth 1028 of the ratchet wheel 1020. Thus, the ratchet wheel 1020 is rotated forward and accordingly the drive pulley 974 is rotated. The EC-convey belt 982 is circulated forward and accordingly the EC-convey surface 984 is moved forward. The ECs 910 are moved toward the stopper 1008. The amount of one-time forward movement of the EC-convey surface 984 is greater than the dimension of each EC 910 in a direction parallel to the EC-feed direction. As shown in FIGS. 27 and 28, the leading one of the ECs 910 assuredly butts against the stopper 1008. In addition, even if a space may be left between the leading EC 910 and the second EC 910, between the second and third ECs 910, and so on, the space or spaces is or are decreased and even eliminated. An excess of the movement of the EC-convey surface 984 relative to the stopper 1008 is allowed by the sliding of the ECs 910 on the surface 984. While the ratchet wheel 1020 is rotated forward as described above, the teeth 1028 of the wheel 1020 push back the positioning pawl 1036 against the biasing force of the second spring member 1042, so that the pawl 1036 moves over the teeth 1028. This is achieved by the respective shapes of the teeth 1028, the driving pawl 1024, and the positioning pawl 1036, the respective relative positions of the teeth-engaging portions of the pawls 1024, 1036 relative to the respective centers of pivotal motion of the pawls 1024, 1036, and the respective biasing forces of the first and second spring members 1030, 1042.

Figure 30:
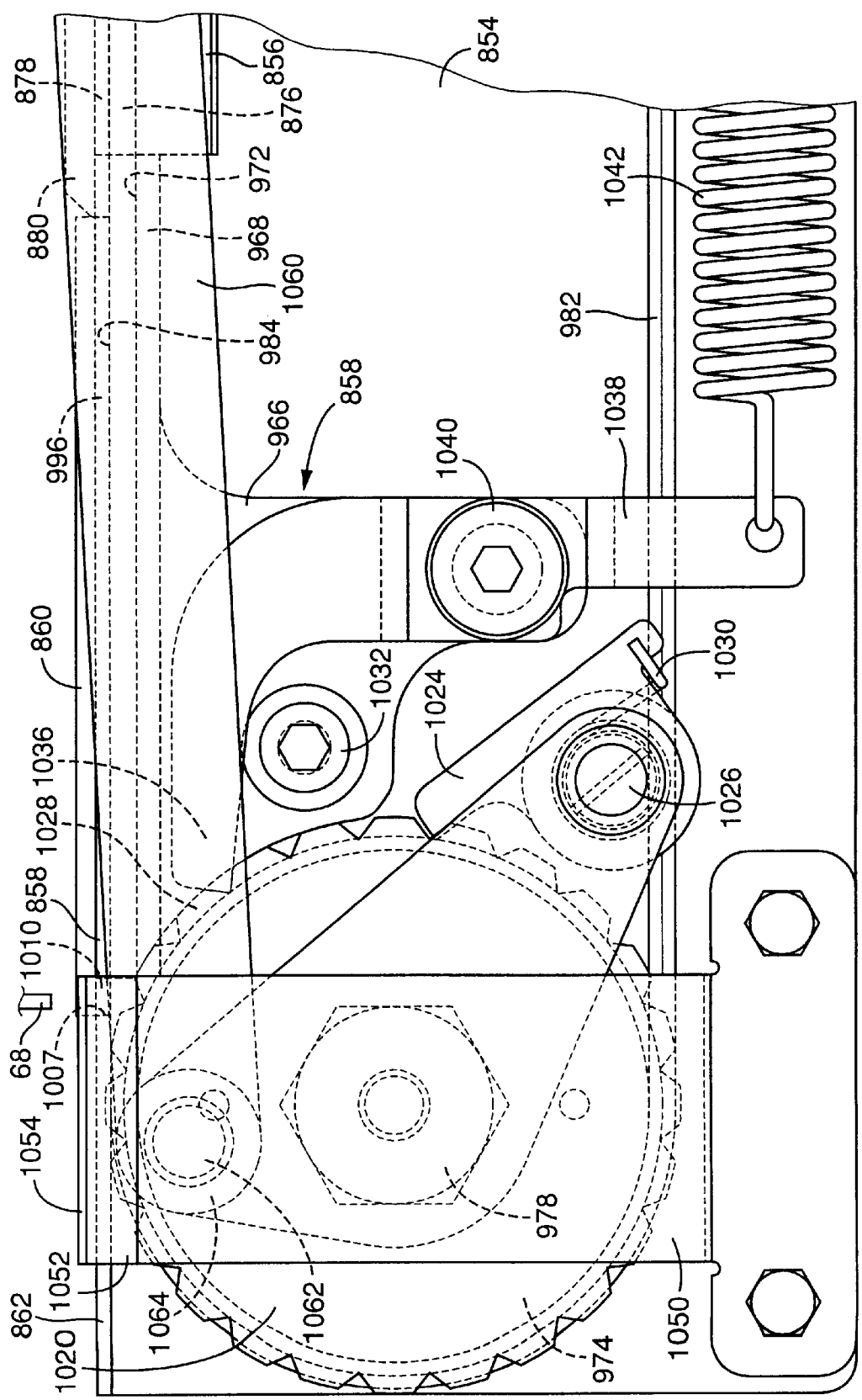
FIG. 30 is a front elevation view for showing the state in which a first pivotable member as an element of the belt driving device has been pivoted backward.
Figure 31:
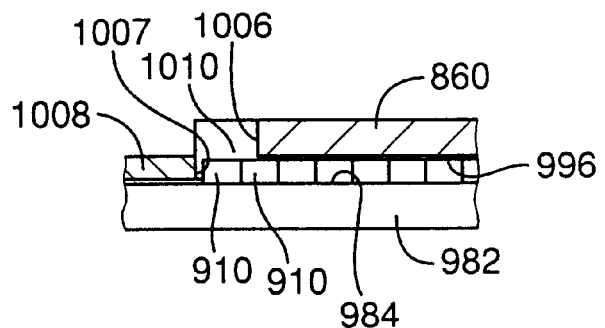
FIG. 31 is a partly cross-sectioned, front elevation view for showing the state in which a leading one of a plurality of ECs lined up on the EC-convey belt in the EC supplying unit of FIG. 20 has been moved off a stopper.

In the state in which the first pivotable member 1022 has been rotated forward till the driving pawl 1024 butts against the stopper 1032 and the forward rotation of the ratchet wheel 1020 has been stopped, the positioning pawl 1036 is held at a position where the pawl 1036 is pushed back a small angle by one tooth 1028, away from its wheel-positioning position, against the biasing force of the second spring 1042. Then, if the first pivotable member 1022 is rotated backward, the driving pawl 1024 is pivoted backward about the axis line of pivotal motion of the first pivotable member 1022, and accordingly the ratchet wheel 1020 is released from the engagement with the pawl 1024, the positioning pawl 1036 is pivoted toward its wheel-positioning position by the biasing force of the second spring 1042. Thus, the positioning pawl 1036 rotates the ratchet wheel 1020 by the small angle till the pawl 1036 engages two adjacent teeth 1028 of the wheel 1020. Consequently the EC-convey surface 984 is moved back a small distance, as shown in FIG. 31. That is, the leading EC 910 is moved slightly away from the stopper 1008. As the first pivotable member 1022 is pivoted backward, the driving pawl 1024 is pivoted backward while moving over the teeth 1028, as shown in FIG. 30. This is a preparing action for the next forward movement of the EC-convey surface 984. During the backward movement of the driving pawl 1024, the positioning pawl 1036 is held at its wheel-positioning position while preventing the ratchet wheel 1020 from being moved backward. This is achieved by the respective shapes of the teeth 1028, the driving pawl 1024, and the positioning pawl 1036, the respective relative positions of the teeth-engaging portions of the pawls 1024, 1036 relative to the respective centers of pivotal motion of the pawls 1024, 1036, and the respective biasing forces of the first and second spring members 1030, 1042.

As shown in FIGS. 23 and 25, a movable cover member 1050 is attached to the first member 854. The cover member 1050 is movable to cover and open the EC-pick-up space 1010. The cover member 1050 is formed of a leaf spring. One lengthwise end portion of the cover member 1050 is fixed to a lower end portion of one side surface of the first member 854, such that an intermediate portion of the cover member 1050 extends vertically outside the first pivotable member 1022. An upper end portion of the cover member 1050 includes an inclined portion 1052 which is inclined toward the first pivotable member 1022. A top portion of the cover member 1050 extends over the EC-pick-up space 1010 and the stopper 1008 to provide a closing portion 1054 which closes the EC-pick-up space 1010. As shown in FIG. 24, the closing portion 1054 covers a portion of the EC-convey surface 984 which is adjacent to the stopper 1008.

As shown in FIG. 27, the fourth member 860 has a recessed portion 1056 which is formed by removing an upper portion of a space-defining portion thereof which defines the EC-pick-up space 1010. An upper surface of the recessed portion 1056 is flush with that of the stopper 1008. As shown in FIG. 24, the closing portion 1054 of the movable cover member 1050, in its closed state in which the closing portion 1054 closes the EC-pick-up space 1010, covers the stopper 1008 and the fourth member 860 such that no clearance is left between a lower surface of the closing portion 1054 and the upper surfaces of the stopper 1008 and the recessed portion 1056. As shown in FIG. 28, the fifth member 862 or the stopper 1008 is thinner than the fourth member 860. Therefore, in the state in which the closing portion 1054 closes the EC-pick-up space 1010, the depth of the space 1010 is just slightly greater than the height (i.e., thickness) of each EC 910. Thus, the closing portion 1054 effectively prevents the leading EC 910 from jumping up, or lying on its side. As shown in FIG. 24, the closing portion 1054 has a semi-circular recess 1058 which is formed through the thickness of a portion thereof which is positioned right above the EC-take-out space 1010. Through the semi-circular recess 1058, an operator can see whether any ECs 910 are present in the space 1010, at an appropriate time such as when the EC supplying unit 800 is not operated.

As shown in FIGS. 20 and 23, one end portion of a drive bar 1060 is attached using a pin 1062 to the first movable member 1022 such that the drive bar 1060 is pivotable about an axis line parallel to the axis line of pivotal motion of the first movable member 1022. The pin 1062 has a stepped shape including a head portion 1064. As shown in FIG. 7, the head portion 1064 and the drive bar 1060 are located between the first movable member 1022 and the movable cover member 1050. The head portion 1064 is a rounded-off head.

As shown in FIG. 20, the other end portion of the drive bar 1060 extends rearward from the first pivotable member 1022, and is attached using a pin 1066 to a drive lever 1068. The drive lever 1068 is attached to the first member 854 via an axis member 1070 such that the drive lever 1068 is pivotable about the axis member 1070. The drive bar 1060 is attached to one arm portion 1072 of the drive lever 1068 such that the drive bar 1060 is pivotable about the pin 1066, and a lower end portion of a driven bar 1076 is connected to the other arm portion 1074 of the drive lever 1068 via a pin 1078 such that the lever 1076 is pivotable about the pin 1078. One end portion of a link 1080 is attached to an upper end portion of the driven bar 1076 via a pin 1082 such that the link 1080 is pivotable about the pin 1082.

The other end portion of the link 1080 is attached to the previously-described bracket 946 via an axis member 1084. The respective axis lines of pivotal motion of the drive bar 1060, the drive lever 1068, the link 1080, and the driven bar 1076 are parallel to that of the first pivotable member 1022.

A tension coil spring 1086 as a sort of elastic member acting as a sort of biasing device is provided between the first member 854 and the arm portion 1072 of the drive lever 1068. The tension spring 1086 biases the drive lever 1068 in a direction in which the driven bar 1076 is moved upward. The pivotal motion of the drive lever 1068 by the biasing force of the tension spring 1086 is stopped by the butting of the driving pawl 1024 against the stopper 1032. The driven bar 1076 has, in an upper end portion thereof, a driven tongue portion 1088 which is so bent as to extend horizontally in a direction parallel to the direction of movement of the support table 102.

A pushing member 1094 as a drive member is provided in the vicinity of the EC-supply position. The pushing member 1094 is similar to the pushing member 242 shown in FIG. 3, in that the member 1094 includes an engaging roller 1096 as its engaging portion, and is elevated and lowered by a drive device 1098 including a drive servomotor 78 as its drive source.

An air damper 1100 is supported by the bracket 946. The air damper 1100 has a construction similar to that of the air damper 270 shown in FIG. 3. The air damper 1100 is provided on a downstream side of the drive lever 1068 in the forward (i.e., clockwise in FIG. 20) rotation direction of the same 1068. The arm portion 1074 of the drive lever 1068 includes an engaging portion 1102 which is held in engagement with a piston 1104 of the air damper 1100.

The present EC mounting system includes a control device 1110, shown in FIG. 20, which is essentially provided by a computer, like the control device 300 shown in FIG. 5. The control device 1110 controls, in addition to the drive servomotor 78 and other elements, the solenoid valve 962, the elevating and lowering device 964, etc.

Next, the operation of the EC mounting system, including the operation of the EC supplying apparatus thereof, will be described below.

When ECs 910 are mounted on a PCB, the support table 102 is moved so that respective EC-supply portions of the EC supplying units 800 are sequentially positioned at the EC-supply position. After each unit 800 is positioned, one EC sucker 68 is lowered and elevated for picking up one EC 910 through the EC-pick-up space 1010 of each unit 800. When the EC-supply portion of each unit 800 is positioned at the EC-supply position, the joint member 958 is lowered and connected to the joint member 948.

In the state in which each EC supplying unit 800 waits for one EC sucker 68 to pick up one EC 910 therefrom, the leading EC 910 has been positioned in the EC-pick-up space 1010 of the EC-supply portion of the unit 800 and has been held in pressed contact with the stopper 1008. In addition, as shown in FIG. 25, the movable cover member 1050 is held in its closed state in which the closing portion 1054 thereof closes the EC-pick-up space 1010. When the EC sucker 68 is lowered for picking up one EC 910 through the EC-pick-up space 1010, the elevator member 1094 is concurrently lowered so that the member 1094 engages the driven tongue portion 1088 of the driven bar 1076 and thereby lowers the bar 1076.

Figure 32:
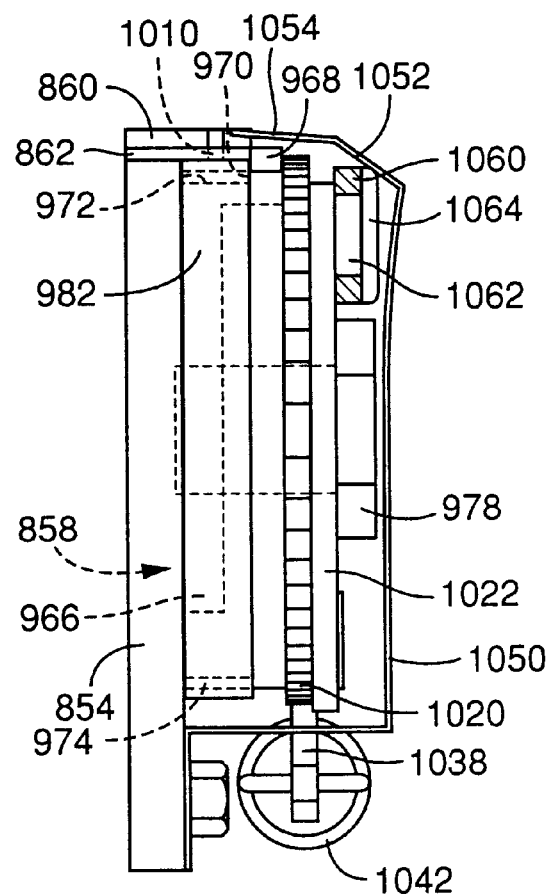
FIG. 32 is a partly cross-sectioned, side elevation view for showing the state in which the movable cover member of the EC supplying unit of FIG. 20 has been moved to its retracted position.

The downward movement of the driven bar 1076 causes the drive lever 1068 to be pivoted against the biasing force of the tension coil spring 1068, so that the drive bar 1060 is moved rearward, i.e., upstream in the EC-feed direction. Thus, the first pivotable member 1022 is pivoted backward so that, as shown in FIG. 30, the driving pawl 1024 is pivoted backward while moving over the teeth 1028 of the ratchet wheel 1020. This is a preparing action for one-time movement of the EC-convey surface 984. The limit of the backward pivotal motion of the first pivotable member 1022 is defined by a lower stroke-end position taken by the elevator member 1094. Once the first pivotable member 1022 is pivoted backward and the ratchet wheel 1020 is released from the engagement with the driving pawl 1024, the positioning pawl 1036 rotates, owing to the biasing force of the second spring 1042, the ratchet wheel 1020 backward by a small angle, so that the pawl 1036 engages two adjacent teeth 1028 of the wheel 1020. Thus, as shown in FIG. 31, the leading EC 910 conveyed on the timing belt 982 is positioned at a position away by a small distance from the stopper 1008, by the ratchet wheel 1020 and the drive pulley 974. When the drive bar 1060 is moved rearward, a portion of the first pivotable member 1022 to which the drive bar 1060 is connected is moved up, so that the head portion 1064 of the pin 1062 engages the inclined portion 1052 of the movable cover member 1050. Thus, as shown in FIG. 32, the cover member 1050 is elastically deformed so that the closing portion 1054 is moved to its retracted position away from the EC-pick-up space 1010. Since the head portion 1064 is rounded off as described, the head portion 1064 smoothly slides on the inclined portion 1052. Therefore, only a small friction is produced, and the inclined portion 1052 is prevented from being damaged.

Each EC sucker 68 is lowered while the leading EC 910 is moved away from the stopper 1008 and the movable cover member 1050 is moved to its retracted position. The EC sucker 68 contacts and sucks the leading EC 910 after the EC 910 is moved away from the stopper 1008 and the closing portion 1054 of the movable cover 1050 is moved away from the EC-pick-up space 1010. The present EC mounting system is designed such that at the time when the movable cover member 1050 completes its movement to its retracted position, a small distance is left between the EC sucker 68 being lowered and the closing portion 1054 of the cover member 1050. Thus, the EC sucker 68 is prevented from being interfered with by the cover member 1050.

When the drive lever 1068 is pivoted backward, the piston rod 1104 of the air damper 1100 is moved by the biasing force of the compression coil spring accommodated in the casing of the damper 1100, so that the piston rod 1104 follows the drive lever 1068.

After the EC sucker 68 holds, by suction, the leading EC 910, the sucker 68 is elevated for picking up the EC 910 through the EC-pick-up space 1010. As described above, since the leading EC 910 is assuredly moved off the stopper 1008, the sucker 68 does not fail to pick up the EC 910 through the EC-pick-up space 1010, and the EC 910 held by the sucker 68 does not have any position errors relative to the sucker 68.

The EC-pick-up space 1010 or the recess 1006 has, in the EC-feed direction, a dimension which is slightly smaller than 1.5 times the dimension of each EC 910. Therefore, with the leading EC 910 being present in the space 1010, slightly smaller than half the second EC 910 following the leading EC 910 is present in the space 1010. However, more than half the second EC 910 is covered by the fourth member 860. Accordingly, when the leading EC 910 is picked up through the space 1010, the EC 910 is prevented from jumping up or lying on its side.

In addition, while each EC 910 is picked up, the ratchet wheel 1020 is kept positioned by the positioning pawl 1036. Thus, the EC-convey surface 984 is prevented from being erroneously moved, and each EC sucker 68 is prevented from failing to catch or pick up the EC 910.

After the EC sucker 68 is moved up for picking up the EC 910 through the EC-pick-up space 1010, the elevator member 1094 is moved up, and the drive lever 1068 is pivoted forward by the biasing force of the tension coil spring 1086, so that the driven bar 1076 is moved up. Consequently the drive bar 1060 is moved frontward, i.e., in the EC-feed direction. Thus, the first pivotable member 1022 is pivoted forward, and the driving pawl 1024 is pivoted forward while being engaged with the teeth 1028 of the ratchet wheel 1020, so that the ratchet wheel 1020 is rotated forward. Consequently the EC-convey surface 984 of the belt 982 is moved forward, so that the following or second EC 910 enters the EC-pick-up space 1010 and is stopped by the stopper 1008. The forward pivotal motion of the first pivotable member 1022 leads to lowering the height of the end portion of the drive bar 1060 attached to the first pivotable member 1022. As a result, the movable cover member 1050 returns, owing to its elasticity, to its operative or closed position where the closing portion 1054 of the cover member 1050 closes the EC-pick-up space 1010.

When the drive lever 1068 is pivoted forward, the air damper 1100 resists the forward pivotal motion of the lever 1068. Therefore, the driven bar 1076 is delayed from the upward movement of the pushing member 1094, so that the pushing member 1094 is moved off the driven bar 1076. Then, the support table 102 is moved, and the ECs 910 are fed concurrently with the movement of the table 102.

During a time period after one EC 910 is picked up through the EC-pick-up space 1010 and before the movement of the support table 102 is started, the joint member 958 is kept communicated with the air supplying device 960 owing to the switching of the solenoid valve 962, so that the first and second EC-stir air-blow holes 936, 938 and the EC-feed air-blow hole 940 blow air. That is, air is blown to feed the ECs 910. When the first EC-stir air-blow hole 936 blows air, the ECs 910 stored in the first EC-stir room 916 are stirred and blown up in the room 916. When the ECs 910 fall down after the stopping of blowing of the air from the hole 936, one or more ECs 910 enter the second EC-stir room 918 via the recess formed in the second partition member 928. One or more ECs 910 present in the second EC-stir room 918 enter the EC-stir passage 932 below the movable member 930 owing to the inclination of the bottom surface of the room 918.

When the second EC-stir air-blow hole 938 blows air, the ECs 910 and the movable member 930 in the first EC-stir room 916 are stirred and moved up in the room 918. In the case where some ECs 910 are stacked on other ECs 910, all the ECs 910 are made flat and arranged into a single array of ECs 910. Thus, the single array of ECs 910 is fed from the second EC-stir room 918 to the EC-supply passage 934. The air blown from the second EC-stir air-blow hole 938 reaches a portion of the second EC-stir room 918 adjacent to the first EC-stir room 916, and stirs the ECs 910 present in that portion.

The air blown from the EC-feed air-blow hole 940 presses and feeds the ECs 910 present in the EC-supply passage 934, toward the outlet of the passage 934. Since the air-blow hole 940 has a directional component toward the outlet of the EC-supply passage 934 and the air-relieve holes 941 are provided near the outlet of the passage 934, an air flow toward the outlet of the passage 934 is produced, so that the ECs 910 are moved toward the outlet. Consequently one EC 910 present at the outlet is put onto the EC-convey surface 984 of the belt 982. Since the EC-supply passage 934 in which the single array of ECs 910 is fed forward is communicated with the narrow portion 878 of the guide groove 874 formed in the second member 856, the ECs 910 in the single array is put one by one from the passage 934 onto the EC-convey surface 984, so that the ECs 910 are arranged close to one another on the EC-convey surface 984.

After one-time blowing of the air from the holes 936, 938, 940, the solenoid valve 962 is switched to communicate the joint member 958 with the atmosphere, so that the air blowing from those holes 936, 938, 940 is stopped. Then, before the movement of the support table 102 is started, the joint member 958 is moved upward and accordingly moved off the joint member 948, which allows the table 102 to be moved. In the case where one EC supplying unit 800 successively supply two or more ECs 910 to the EC mounting device 12, the joint member 948 is kept connected to the joint member 958 and, after the following or second EC 910 is picked up, the ECs 910 are fed forward by the air blown from the holes 936, 938, 940 in synchronism with the feeding of the ECs 910 on the EC-convey surface 984. After the unit 800 supplies the last EC 910 of the two or more ECs 910, the joint member 958 is moved up away from the joint member 948 of the unit 800.

In the tenth embodiment shown in FIGS. 20 to 32, the driven bar 1076 provides the driven member; the drive lever 1068 provides the engaged member; the air damper 1100 provides the action retarding device; and the tension coil spring 1086 provides the energy storing device. The timing belt 982 as the conveyor belt provides the feed member; the driving pawl 1024, the first pivotable member 1022, the drive pulley 974, the ratchet wheel 1020, and the positioning pawl 1036 cooperate with one another to provide a belt driving device 1090; and the timing belt 982 and the belt driving device 1090 cooperate with each other to provide a "bulk" feeding device 1092.

In the tenth embodiment, an EC stirring device including the EC-stir rooms 916, 918 and the EC-stir air-blow holes 936, 938 may be replaced by an EC vibrating device which vibrates the ECs 910 stored in bulk in the EC-store case 912, arranges the ECs 910 into a single array of ECs 910, and feeds the array of ECs 910 into the inlet of the EC-supply passage 934. However, it is preferred that the EC vibrating operation of the EC vibrating device be stopped during a time period from the time when the EC-convey belt 982 is driven to move the EC-convey surface 984 backward to the time when the leading EC 910 is picked up.

Although in the tenth embodiment the air is blown when the ECs 910 are fed by the EC-convey surface 984 after the leading EC 910 is picked up, it is possible to blow the air before the picking-up of the leading EC 910. In the latter case, the air is blown, when the EC sucker 68 is lowered, concurrently the drive bar 1060 is moved backward, accordingly the EC-convey surface 984 is moved rearward, and the leading EC 910 is moved away from the stopper 1008. The blowing of the air is stopped before the EC sucker 68 contacts and sucks the leading EC 910.

While in the tenth embodiment the air is blown only one time while the ECs 910 are fed on the EC-convey surface 984 after the leading EC 910 is picked up, it is possible to blow the air two or more times. Otherwise, it is possible to blow the air while the leading EC 910 is picked up, as well.

In the tenth embodiment, the elevating and lowering device 964 as the joint-member driving device that connects and disconnects the joint member 958 to and from the joint member 948 may include the drive servomotor 78 as its drive source. In this case, it is preferred, but is not essentially required, that in the case where one EC supplying unit 800 successively supplies two or more ECs 910, the joint member 958 remain connected to the joint member 948 of the one unit 800 while the one unit 800 successively supplies the ECs 910.

In each of the illustrated embodiments, the driven bar 230 or 1076 is driven by the drive device 240 or 1098 which includes the pushing member 242 or 1094 and utilizes the drive servomotor 78 as its drive source. However, the driven bar 230, 1076 may be driven by a drive device which includes an exclusive drive source different from the servomotor 78.

In each of the EC supplying units 800, the air damper 1100 may be replaced with an air damper identical with the air damper 352, a fly wheel identical with the fly wheel 402, a dynamo identical with the dynamo 432, a fly wheel and a rotation resisting device (e.g., a leaf spring), or a cam mechanism identical with the cam mechanism 452.

In each of the EC supplying units 100, 350, 400, 420, 430, 500, 600, it is possible to employ, for smoothly decelerating the speed of feeding of the EC carrier tape 146, a cam mechanism identical with the cam mechanism 452 employed in the EC supplying unit 450.

The EC supplying units 800 as the "bulk" units each of which stores ECs 910 in bulk may include respective EC storing casings as EC storing devices that are supported by a first movable table, and respective "bulk" feeding devices (i.e, EC stirring devices) that are supported by a second movable table which is movable independent of the movement of the first table. In this case, each of the EC storing cases is connected to a corresponding one of the "bulk" feeding devices via a flexible connection member which allows each EC to be moved from the each casing to the one feeding device. Thus, the ECs are supplied from the each casing to the corresponding one feeding device, while the flexibility of the connection member allows small changes of the distance between the each casing and the one feeding device.

In each of the EC supplying units 450, 500, 600, the cover member 482, 562 is not movable in the tape-feed direction. However, the cover member 482, 562 may be replaced with a different cover member which is moved forward and backward when the drive lever 198 is pivoted forward and backward, and which is moved forward while covering a portion of the EC accommodating tape 142 from which portion the cover tape 144 has been peeled.

It is to be understood that the present invention may be embodied with other changes, improvements, and modifications that may occur to the person skilled in the art without departing from the scope and spirit of the invention defined in the appended claims.

What is claimed is:

1. A method of displacing a table supporting a plurality of component supplying units each of which carries a plurality of electric components, along a reference line along which respective component-supply portions of the component supplying units are arranged, so as to sequentially position the respective component-supply portions at a component-supply position, and causing an external drive device to operate a drive member thereof to drive a driven member of a feeding device of said each component supplying unit to perform a component feeding action and a component-feeding preparing action and thereby feed the electric components of said each unit, one by one, to the component-supply portion of said each unit, the component feeding action causing one of the electric components of said each unit to be fed to the component-supply portion of said each unit, the component-feeding preparing action causing the feeding device to be prepared for the component feeding action, the method comprising the steps of:

stopping displacing the table so that the component-supply portion of a first one of the component supplying units is positioned at the component-supply position;

causing, after the table is stopped, the drive member of the external drive device to engage the driven member of the feeding device of the first component supplying unit;

storing, in the first component supplying unit, an energy which is transmitted from the drive member to the driven member of the first unit;

causing the drive member to be moved off the driven member of the first component supplying unit;

operating the feeding device of the first component supplying unit to utilize, after the drive member is moved off the driven member of the first unit, the stored energy for performing at least a portion of at least one of the component feeding action and the component-feeding preparing action; and starting, before the feeding device of the first component supplying unit finishes utilizing the stored energy and thereby performing said portion of said at least one of the component feeding action and the component-feeding preparing action, displacing the table so that the component-supply portion of the first component supplying unit is replaced with the component-supply portion of a second one of the component supplying units, at the component-supply position.

2. A method according to claim 1, and wherein said at least one of the component feeding action and the component-feeding preparing action comprises the component feeding action.

3. A method according to claim 1, wherein the external drive device reciprocates the drive member forward and backward, and the forward motion of the drive member is transmitted to the driven member of said each component supplying unit so that the feeding device of said each unit performs the component-feeding preparing action.

4. A method according to claim 1, and wherein the feeding device of said each component supplying unit performs the component feeding action at a speed lower than a speed at which the drive member is operated by the external drive device.

5. A method according to claim 1, wherein the component feeding action of the feeding device of said each component supplying unit causes a carrier tape carrying the electric components at a component-carry pitch, to be fed at a component-feed pitch equal to a value obtained by dividing the component-carry pitch by a natural number, so that said one of the electric components is fed to the component-supply portion of said each unit.

6. An electric-component supplying apparatus, comprising:

a plurality of electric-component supplying units each of which includes:

a main frame including a guide portion which guides a plurality of electric components, a driven member which is supported by the main frame such that the driven member is movable relative to the main frame and which is driven by a drive member of an external drive device, an energy storing device which stores an energy which is transmitted from the drive member to the driven member, a feeding device which utilizes, after the drive member is moved off the driven member, the stored energy for performing at least a portion of at least one of a component feeding action and a component-feeding preparing action, the component feeding action causing a feeding of one of the electric components guided by the guide portion, the component-feeding preparing action causing the feeding device to be prepared for the component feeding action;

a table which supports the electric-component supplying units such that respective component-supply portions of the units are arranged along a reference line;

a table displacing device which displaces the table so that the component supplying units are displaced along the reference line and the respective component-supply portions of the units are sequentially positioned at a predetermined component-supply position; and a control device which is operatively connected to the table displacing device and which controls the table displacing device such that before the drive member engages the driven member of a first one of the component supplying units so that the energy storing device of the first unit stores the energy transmitted from the drive member to the driven member thereof, the table displacing device stops displacing the table so that the component-supply portion of the first unit is positioned at the component-supply position and, after the drive member is moved off the driven member of the first unit and before the feeding device of the first unit finishes utilizing the stored energy and thereby performing said portion of said at least one of the component feeding action and the component-feeding preparing action, the table displacing device starts displacing the table so that the component-supply portion of the first unit is replaced with the component-supply portion of a second one of the component supplying units, at the component-supply position.

7. An electric-component supplying apparatus according to claim 6, wherein said each component supplying unit further comprises an action retarding device which performs at least one of (a) a delaying of a timing at which said at least one of the component feeding action and the component-feeding preparing action is started by the feeding device, and (b) a decreasing of a speed at which said at least one of the component feeding action and the component-feeding preparing action is performed by the feeding device.

8. An electric-component supplying apparatus according to claim 7, wherein the feeding device comprises a displaceable feed member as an output member, and at least one displaceable member which is displaceable with the feed member, and wherein the action retarding device comprises a damper which engages a displaceable engaged member as said one displaceable member, thereby decreasing a speed at which the feed member is displaced in a component-feed direction to perform the component feeding action.

9. An electric-component supplying apparatus according to claim 8, wherein the damper comprises a fluid-containing damper which comprises a displaceable engaging member which engages the displaceable engaged member, a fluid chamber, a fluid contained in the fluid chamber, and a restrictor which restricts, when the engaging member is displaced with the engaged member, flowing of the fluid out of the fluid chamber, thereby decreasing a speed at which the engaging member is displaced with the engaged member.

10. An electric-component supplying apparatus according to claim 7, wherein the feeding device comprises a displaceable feed member as an output member, and at least one displaceable member which is displaceable with the feed member, and wherein the action retarding device comprises a fly wheel which is rotatable about an axis line, and a motion converting device which converts the displacement of said one displaceable member into the rotation of the fly wheel.

11. An electric-component supplying apparatus according to claim 6, wherein the feeding device performs both the component feeding action and the component-feeding preparing action, and wherein the feeding device performs the component-feeding preparing action when the driven member is driven by the drive member.

12. An electric-component supplying apparatus according to claim 6, wherein the energy storing device comprises an elastic member which is elastically deformable for storing the energy.

13. An electric-component supplying apparatus according to claim 6, further comprising a feeding-action-speed control device which controls a speed at which the feeding device performs the component feeding action.

14. An electric-component supplying apparatus according to claim 13, wherein the feeding device comprises a displaceable feed member as an output member, and wherein the feeding-action-speed control device comprises a speed decreasing device which smoothly decreases a speed at which the feed member is displaced in a component-feed direction to perform the component-feed action.

15. An electric-component supplying apparatus according to claim 14, wherein the speed decreasing device comprises a cam mechanism which includes a cam and a cam follower, the cam being so shaped as to smoothly decrease the speed at which the feed member is displaced in the component-feed direction.

16. A method of displacing a table supporting a plurality of component supplying units each of which carries a plurality of electric components, along a reference line along which respective component-supply portions of the component supplying units are arranged, so as to sequentially position the respective component-supply portions at a component-supply position, and causing an external drive device to operate a drive member thereof to drive a driven member of a feeding device of said each component supplying unit to perform a component feeding action and thereby feed the electric components of said each unit, one by one, to the component-supply portion of said each unit, the component feeding action causing one of the electric components of said each unit to be fed to the component-supply portion of said each unit, the method comprising the steps of:

stopping displacing the table so that the component-supply portion of a first one of the component supplying units is positioned at the component-supply position;

causing, after the table is stopped, the drive member of the external drive device to engage the driven member of the feeding device of the first component supplying unit;

storing, in the first component supplying unit, an energy which is transmitted from the drive member to the driven member of the first unit;

causing the drive member to be moved off the driven member of the first component supplying unit;

operating the feeding device of the first component supplying unit to utilize, after the drive member is moved off the driven member of the first unit, the stored energy for performing at least a portion of the component feeding action; and starting, before the feeding device of the first component supplying unit finishes utilizing the stored energy and thereby performing said portion of the component feeding action, displacing the table so that the component-supply portion of the first component supplying unit is replaced with the component-supply portion of a second one of the component supplying units, at the component-supply position.

17. An electric-component supplying unit, comprising:

a main frame including a guide portion which guides a plurality of electric components;

a driven member which is supported by the main frame such that the driven member is movable relative to the main frame and which is driven by a drive member of an external drive device;

an energy storing device which stores an energy which is transmitted from the drive member to the driven member;

a feeding device which utilizes, after the drive member is moved off the driven member, the stored energy for performing at least a portion of a component feeding action, the component feeding action causing a feeding of one of the electric components guided by the guide portion, the feeding device comprising a displaceable feed member as an output member, and at least one displaceable member which is displaceable with the feed member; and a fluid-containing damper which engages a displaceable engaged member as said one displaceable member, thereby decreasing a speed at which the feed member is displaced in a component-feed direction to perform the component feeding action, the fluid-containing damper comprising a displaceable engaging member which engages the displaceable engaged member, a fluid chamber, a fluid contained in the fluid chamber, and a restrictor which restricts, when the engaging member is displaced with the engaged member, flowing of the fluid out of the fluid chamber, thereby decreasing a speed at which the engaging member is displaced with the engaged member, the fluid-containing damper further comprising a flow-area decreasing device which decreases an area of the restrictor through which the fluid flows, as the feed member is displaced in the component-feed direction.

18. An electric-component supplying unit, comprising:

a main frame including a guide portion which guides a plurality of electric components;

a driven member which is supported by the main frame such that the driven member is movable relative to the main frame and which is driven by a drive member of an external drive device;

an energy storing device which stores an energy which is transmitted from the drive member to the driven member;

a feeding device which utilizes, after the drive member is moved off the driven member, the stored energy for performing at least a portion of a component feeding action, the component feeding action causing a feeding of one of the electric components guided by the guide portion, the feeding device comprising a displaceable feed member as an output member, and a pivotable member which is pivotable about an axis line and which includes a first arm which is operatively connected, at a first position, to the driven member, and a second arm which is operatively connected, at a second position, to the feed member; and a damper which engages, at a third position, the first arm of the pivotable member, thereby decreasing a speed at which the feed member is displaced in a component-feed direction to perform the component feeding action, wherein a distance between the axis line and the third position is greater than a distance between the axis line and the second position.

19. An electric-component supplying unit, comprising:

a main frame including a guide portion which guides a plurality of electric components;

a driven member which is supported by the main frame such that the driven member is movable relative to the main frame and which is driven by a drive member of an external drive device;

an energy storing device which stores an energy which is transmitted from the drive member to the driven member;

a feeding device which utilizes, after the drive member is moved off the driven member, the stored energy for performing at least a portion of a component feeding action, the component feeding action causing a feeding of one of the electric components guided by the guide portion, the feeding device comprising a displaceable feed member as an output member, and a pivotable member which is pivotable about an axis line and which includes a first arm which is operatively connected, at a first position, to the driven member, and a second arm which is operatively connected, at a second position, to the feed member; and a damper which engages, at a third position, the first arm of the pivotable member, thereby decreasing a speed at which the feed member is displaced in a component-feed direction to perform the component feeding action, wherein a distance between the axis line and the third position is greater than a distance between the axis line and the first position.

20. An electric-component supplying unit according to claim 19, wherein the distance between the axis line and the third position is greater than a distance between the axis line and the second position.

* * * * *